(12) United States Patent
Li

(10) Patent No.: US 11,335,865 B2
(45) Date of Patent: May 17, 2022

(54) OLED WITH MULTI-EMISSIVE MATERIAL LAYER

(71) Applicant: Arizona Board of Regents on behalf of Arizona State University, Scottsdale, AZ (US)

(72) Inventor: Jian Li, Tempe, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 573 days.

(21) Appl. No.: 15/487,476

(22) Filed: Apr. 14, 2017

(65) Prior Publication Data
US 2017/0301871 A1     Oct. 19, 2017

Related U.S. Application Data

(60) Provisional application No. 62/323,383, filed on Apr. 15, 2016, provisional application No. 62/377,747, filed on Aug. 22, 2016.

(51) Int. Cl.
*H01L 51/00*     (2006.01)
*C09K 11/06*     (2006.01)
(Continued)

(52) U.S. Cl.
CPC ........ *H01L 51/0087* (2013.01); *C09K 11/025* (2013.01); *C09K 11/06* (2013.01); *H01L 51/0052* (2013.01); *H01L 51/0054* (2013.01); *H01L 51/0055* (2013.01); *H01L 51/0056* (2013.01); *H01L 51/0057* (2013.01); *H01L 51/0058* (2013.01); *H01L 51/0072* (2013.01);
(Continued)

(58) Field of Classification Search
None
See application file for complete search history.

(56) References Cited

U.S. PATENT DOCUMENTS

| 4,769,292 A | 9/1988 | Tang et al. |
| 5,451,674 A | 9/1995 | Silver |
| (Continued) | | |

FOREIGN PATENT DOCUMENTS

| CN | 1680366 A | 10/2005 |
| CN | 1777663   | 5/2006 |
| (Continued) | | |

OTHER PUBLICATIONS

Maestri et al., "Absorption Spectra and Luminescence Properties of Isomeric Platinum (II) and Palladium (II) Complexes Containing 1,1'-Biphenyldiyl, 2-Phenylpyridine, and 2,2'-Bipyridine as Ligands," Helvetica Chimica Acta, vol. 71, Issue 5, Aug. 10, 1988, pp. 1053-1059.

(Continued)

*Primary Examiner* — Jay Yang
(74) *Attorney, Agent, or Firm* — Riverside Law LLP

(57) ABSTRACT

The present invention relates to organic light emitting devices with a multi-emissive material layer (EML), where a multi-EML generally refers to an emissive layer having at least two layers of emissive material, each layer having a different emitter concentration (e.g. a first EML in direct contact with a second EML, and the emitter concentration of the first EML (hole favorable) exceeds that of the second EML (electron favorable)).

17 Claims, 21 Drawing Sheets

(51) Int. Cl.
*C09K 11/02* (2006.01)
*H01L 51/50* (2006.01)

(52) U.S. Cl.
CPC ........ *H01L 51/0084* (2013.01); *H01L 51/504* (2013.01); *H01L 51/5008* (2013.01); *H01L 51/5096* (2013.01); *C09K 2211/1007* (2013.01); *C09K 2211/1011* (2013.01); *C09K 2211/1014* (2013.01); *C09K 2211/1029* (2013.01); *C09K 2211/185* (2013.01)

(56) References Cited

U.S. PATENT DOCUMENTS

| | | | |
|---|---|---|---|
| 5,641,878 | A | 6/1997 | Dandliker |
| 5,707,745 | A | 1/1998 | Forrest et al. |
| 5,844,363 | A | 12/1998 | Gu et al. |
| 6,200,695 | B1 | 3/2001 | Arai |
| 6,303,238 | B1 | 10/2001 | Thompson et al. |
| 6,780,528 | B2 | 8/2004 | Tsuboyama et al. |
| 7,002,013 | B1 | 2/2006 | Chi et al. |
| 7,037,599 | B2 | 5/2006 | Culligan et al. |
| 7,064,228 | B1 | 6/2006 | Yu et al. |
| 7,268,485 | B2 | 9/2007 | Tyan et al. |
| 7,279,704 | B2 | 10/2007 | Walters et al. |
| 7,332,232 | B2 | 2/2008 | Ma et al. |
| 7,442,797 | B2 | 10/2008 | Itoh et al. |
| 7,501,190 | B2 | 3/2009 | Ise |
| 7,635,792 | B1 | 12/2009 | Cella |
| 7,655,322 | B2 | 2/2010 | Forrest et al. |
| 7,854,513 | B2 | 12/2010 | Quach |
| 7,947,383 | B2 | 5/2011 | Ise et al. |
| 8,106,199 | B2 | 1/2012 | Jabbour |
| 8,133,597 | B2 | 3/2012 | Yasukawa et al. |
| 8,389,725 | B2 | 3/2013 | Li et al. |
| 8,617,723 | B2 | 12/2013 | Stoessel |
| 8,669,364 | B2 | 3/2014 | Li |
| 8,778,509 | B2 | 7/2014 | Yasukawa |
| 8,816,080 | B2 | 8/2014 | Li et al. |
| 8,846,940 | B2 | 9/2014 | Li |
| 8,871,361 | B2 | 10/2014 | Xia et al. |
| 8,927,713 | B2 | 1/2015 | Li et al. |
| 8,946,417 | B2 | 2/2015 | Li et al. |
| 8,987,451 | B2 | 3/2015 | Tsai |
| 9,059,412 | B2 | 6/2015 | Zeng et al. |
| 9,076,974 | B2 | 7/2015 | Li |
| 9,082,989 | B2 | 7/2015 | Li |
| 9,203,039 | B2 | 12/2015 | Li |
| 9,221,857 | B2 | 12/2015 | Li et al. |
| 9,224,963 | B2 | 12/2015 | Li et al. |
| 9,238,668 | B2 | 1/2016 | Li et al. |
| 9,312,502 | B2 | 4/2016 | Li et al. |
| 9,312,505 | B2 | 4/2016 | Brooks et al. |
| 9,318,725 | B2 | 4/2016 | Li |
| 9,324,957 | B2 | 4/2016 | Li et al. |
| 9,382,273 | B2 | 7/2016 | Li |
| 9,385,329 | B2 | 7/2016 | Li et al. |
| 9,425,415 | B2 | 8/2016 | Li et al. |
| 9,461,254 | B2 | 10/2016 | Tsai |
| 9,493,698 | B2 | 11/2016 | Beers |
| 9,502,671 | B2 | 11/2016 | Li |
| 9,550,801 | B2 | 1/2017 | Li et al. |
| 9,598,449 | B2 | 3/2017 | Li |
| 9,617,291 | B2 | 4/2017 | Li et al. |
| 9,666,822 | B2 | 5/2017 | Forrest |
| 9,673,409 | B2 | 6/2017 | Li |
| 9,698,359 | B2 | 7/2017 | Li et al. |
| 9,711,739 | B2 | 7/2017 | Li |
| 9,711,741 | B2 | 7/2017 | Li |
| 9,711,742 | B2 | 7/2017 | Li et al. |
| 9,735,397 | B2 | 8/2017 | Riegel |
| 9,755,163 | B2 | 9/2017 | Li et al. |
| 9,818,959 | B2 | 11/2017 | Li |
| 9,865,825 | B2 | 1/2018 | Li |
| 9,879,039 | B2 | 1/2018 | Li |
| 9,882,150 | B2 | 1/2018 | Li |
| 9,899,614 | B2 | 2/2018 | Li |
| 9,920,242 | B2 | 3/2018 | Li |
| 9,923,155 | B2 | 3/2018 | Li et al. |
| 9,941,479 | B2 | 4/2018 | Li |
| 9,947,881 | B2 | 4/2018 | Li |
| 9,985,224 | B2 | 5/2018 | Li |
| 10,020,455 | B2 | 7/2018 | Li |
| 10,033,003 | B2 | 7/2018 | Li |
| 10,056,564 | B2 | 8/2018 | Li |
| 10,056,567 | B2 | 8/2018 | Li |
| 10,158,091 | B2 | 12/2018 | Li |
| 10,177,323 | B2 | 1/2019 | Li |
| 10,211,411 | B2 | 2/2019 | Li |
| 10,211,414 | B2 | 2/2019 | Li |
| 10,263,197 | B2 | 4/2019 | Li |
| 10,294,417 | B2 | 5/2019 | Li |
| 10,392,387 | B2 | 8/2019 | Li |
| 10,411,202 | B2 | 9/2019 | Li |
| 10,414,785 | B2 | 9/2019 | Li |
| 10,516,117 | B2 | 12/2019 | Li |
| 10,566,553 | B2 | 2/2020 | Li |
| 10,566,554 | B2 | 2/2020 | Li |
| 2001/0019782 | A1 | 9/2001 | Iqarashi et al. |
| 2002/0068190 | A1 | 6/2002 | Tsuboyama et al. |
| 2003/0062519 | A1 | 4/2003 | Yamazaki et al. |
| 2003/0186077 | A1 | 10/2003 | Chen |
| 2004/0230061 | A1 | 11/2004 | Seo et al. |
| 2005/0037232 | A1 | 2/2005 | Tyan |
| 2005/0139810 | A1 | 6/2005 | Kuehl |
| 2005/0170207 | A1 | 8/2005 | Ma et al. |
| 2005/0260446 | A1 | 11/2005 | Mackenzie et al. |
| 2006/0024522 | A1 | 2/2006 | Thompson |
| 2006/0032528 | A1 | 2/2006 | Wang |
| 2006/0066228 | A1 | 3/2006 | Antoniadis |
| 2006/0073359 | A1 | 4/2006 | Ise et al. |
| 2006/0094875 | A1 | 5/2006 | Itoh et al. |
| 2006/0127696 | A1 | 6/2006 | Stossel et al. |
| 2006/0182992 | A1 | 8/2006 | Nii et al. |
| 2006/0202197 | A1 | 9/2006 | Nakayama et al. |
| 2006/0210831 | A1 | 9/2006 | Sano et al. |
| 2006/0255721 | A1 | 11/2006 | Igarashi et al. |
| 2006/0263635 | A1 | 11/2006 | Ise |
| 2006/0286406 | A1 | 12/2006 | Igarashi et al. |
| 2007/0057630 | A1 | 3/2007 | Nishita et al. |
| 2007/0059551 | A1 | 3/2007 | Yamazaki |
| 2007/0082284 | A1 | 4/2007 | Stoessel et al. |
| 2007/0103060 | A1 | 5/2007 | Itoh et al. |
| 2007/0160905 | A1 | 7/2007 | Morishita |
| 2007/0252140 | A1 | 11/2007 | Limmert |
| 2008/0001530 | A1 | 1/2008 | Ise et al. |
| 2008/0036373 | A1 | 2/2008 | Itoh et al. |
| 2008/0054799 | A1 | 3/2008 | Satou |
| 2008/0079358 | A1 | 4/2008 | Satou |
| 2008/0102310 | A1 | 5/2008 | Thompson |
| 2008/0111476 | A1 | 5/2008 | Choi et al. |
| 2008/0241518 | A1 | 10/2008 | Satou et al. |
| 2008/0241589 | A1 | 10/2008 | Fukunaga et al. |
| 2008/0269491 | A1 | 10/2008 | Jabbour |
| 2008/0315187 | A1 | 12/2008 | Bazan |
| 2009/0026936 | A1 | 1/2009 | Satou et al. |
| 2009/0026939 | A1 | 1/2009 | Kinoshita et al. |
| 2009/0032989 | A1 | 2/2009 | Karim et al. |
| 2009/0039768 | A1 | 2/2009 | Igarashi et al. |
| 2009/0079340 | A1 | 3/2009 | Kinoshita et al. |
| 2009/0126796 | A1 | 5/2009 | Yang |
| 2009/0128008 | A1 | 5/2009 | Ise et al. |
| 2009/0136779 | A1 | 5/2009 | Cheng et al. |
| 2009/0153045 | A1 | 6/2009 | Kinoshita et al. |
| 2009/0167167 | A1 | 7/2009 | Aoyama |
| 2009/0205713 | A1 | 8/2009 | Mitra |
| 2009/0218561 | A1 | 9/2009 | Kitamura et al. |
| 2009/0261721 | A1 | 10/2009 | Murakami et al. |
| 2009/0267500 | A1 | 10/2009 | Kinoshita et al. |
| 2010/0000606 | A1 | 1/2010 | Thompson et al. |
| 2010/0013386 | A1 | 1/2010 | Thompson et al. |
| 2010/0043876 | A1 | 2/2010 | Tuttle |
| 2010/0093119 | A1 | 4/2010 | Shimizu |
| 2010/0127246 | A1* | 5/2010 | Nakayama ............. H05B 33/14 257/40 |

(56) References Cited

U.S. PATENT DOCUMENTS

| | | |
|---|---|---|
| 2010/0141127 A1 | 6/2010 | Xia et al. |
| 2010/0147386 A1 | 6/2010 | Benson-Smith |
| 2010/0171111 A1 | 7/2010 | Takada et al. |
| 2010/0171418 A1 | 7/2010 | Kinoshita et al. |
| 2010/0200051 A1 | 8/2010 | Triani |
| 2010/0204467 A1 | 8/2010 | Lamarque et al. |
| 2010/0270540 A1 | 10/2010 | Chung et al. |
| 2010/0288362 A1 | 11/2010 | Hatwar |
| 2010/0297522 A1 | 11/2010 | Creeth |
| 2010/0307594 A1 | 12/2010 | Zhu |
| 2011/0028723 A1 | 2/2011 | Li |
| 2011/0049496 A1 | 3/2011 | Fukuzaki |
| 2011/0062858 A1 | 3/2011 | Yersin et al. |
| 2011/0132440 A1 | 6/2011 | Sivarajan |
| 2011/0217544 A1 | 9/2011 | Young |
| 2011/0227058 A1 | 9/2011 | Masui et al. |
| 2011/0301351 A1 | 12/2011 | Li |
| 2012/0024383 A1 | 2/2012 | Kaiho |
| 2012/0025588 A1 | 2/2012 | Humbert |
| 2012/0039323 A1 | 2/2012 | Hirano |
| 2012/0095232 A1 | 4/2012 | Li et al. |
| 2012/0108806 A1 | 5/2012 | Li |
| 2012/0146012 A1 | 6/2012 | Limmert |
| 2012/0181528 A1 | 7/2012 | Takada et al. |
| 2012/0199823 A1 | 8/2012 | Molt et al. |
| 2012/0202997 A1 | 8/2012 | Parham et al. |
| 2012/0204960 A1 | 8/2012 | Kato |
| 2012/0215001 A1 | 8/2012 | Li et al. |
| 2012/0223634 A1 | 9/2012 | Xia et al. |
| 2012/0264938 A1 | 10/2012 | Li et al. |
| 2012/0273736 A1 | 11/2012 | James et al. |
| 2012/0302753 A1* | 11/2012 | Li .................. C07F 15/0086 546/4 |
| 2013/0048963 A1 | 2/2013 | Beers et al. |
| 2013/0082245 A1 | 4/2013 | Kottas et al. |
| 2013/0137870 A1 | 5/2013 | Li |
| 2013/0168656 A1 | 7/2013 | Tsai et al. |
| 2013/0172561 A1 | 7/2013 | Tsai et al. |
| 2013/0200340 A1 | 8/2013 | Otsu |
| 2013/0203996 A1 | 8/2013 | Li et al. |
| 2013/0237706 A1 | 9/2013 | Li |
| 2013/0341600 A1 | 12/2013 | Lin et al. |
| 2014/0014922 A1 | 1/2014 | Lin et al. |
| 2014/0014931 A1 | 1/2014 | Riegel |
| 2014/0027733 A1 | 1/2014 | Zeng et al. |
| 2014/0042475 A1 | 2/2014 | Park |
| 2014/0066628 A1 | 3/2014 | Li |
| 2014/0073798 A1 | 3/2014 | Li |
| 2014/0084261 A1 | 3/2014 | Brooks et al. |
| 2014/0114072 A1 | 4/2014 | Li et al. |
| 2014/0147996 A1 | 5/2014 | Vogt |
| 2014/0148594 A1 | 5/2014 | Li |
| 2014/0191206 A1 | 7/2014 | Cho |
| 2014/0203248 A1 | 7/2014 | Zhou et al. |
| 2014/0249310 A1 | 9/2014 | Li |
| 2014/0326960 A1 | 11/2014 | Kim et al. |
| 2014/0330019 A1 | 11/2014 | Li et al. |
| 2014/0364605 A1 | 12/2014 | Li et al. |
| 2015/0008419 A1 | 1/2015 | Li |
| 2015/0018558 A1 | 1/2015 | Li |
| 2015/0028323 A1 | 1/2015 | Xia et al. |
| 2015/0060804 A1 | 3/2015 | Kanitz |
| 2015/0069334 A1 | 3/2015 | Xia et al. |
| 2015/0105556 A1 | 4/2015 | Li et al. |
| 2015/0123047 A1 | 5/2015 | Maltenberger |
| 2015/0162552 A1 | 6/2015 | Li et al. |
| 2015/0194616 A1 | 7/2015 | Li et al. |
| 2015/0207086 A1 | 7/2015 | Li et al. |
| 2015/0228914 A1 | 8/2015 | Li et al. |
| 2015/0274762 A1 | 10/2015 | Li et al. |
| 2015/0287938 A1 | 10/2015 | Li et al. |
| 2015/0311456 A1 | 10/2015 | Li |
| 2015/0318500 A1 | 11/2015 | Li |
| 2015/0349279 A1 | 12/2015 | Li et al. |
| 2015/0380666 A1 | 12/2015 | Szigethy |
| 2016/0028028 A1 | 1/2016 | Li et al. |
| 2016/0028029 A1 | 1/2016 | Li |
| 2016/0043331 A1 | 2/2016 | Li et al. |
| 2016/0072082 A1 | 3/2016 | Brooks et al. |
| 2016/0133861 A1 | 5/2016 | Li |
| 2016/0133862 A1 | 5/2016 | Li et al. |
| 2016/0181529 A1 | 6/2016 | Tsai |
| 2016/0194344 A1 | 7/2016 | Li |
| 2016/0197285 A1 | 7/2016 | Zeng et al. |
| 2016/0197291 A1 | 7/2016 | Li et al. |
| 2016/0285015 A1 | 9/2016 | Li et al. |
| 2016/0359120 A1 | 12/2016 | Li |
| 2016/0359125 A1 | 12/2016 | Li |
| 2017/0005278 A1 | 1/2017 | Li et al. |
| 2017/0012224 A1 | 1/2017 | Li et al. |
| 2017/0040555 A1 | 2/2017 | Li et al. |
| 2017/0047533 A1 | 2/2017 | Li et al. |
| 2017/0066792 A1 | 3/2017 | Li et al. |
| 2017/0069855 A1 | 3/2017 | Li et al. |
| 2017/0077420 A1 | 3/2017 | Li |
| 2017/0125708 A1 | 5/2017 | Li |
| 2017/0267923 A1 | 9/2017 | Li |
| 2017/0271611 A1 | 9/2017 | Li et al. |
| 2017/0301871 A1 | 10/2017 | Li |
| 2017/0305881 A1 | 10/2017 | Li et al. |
| 2017/0309943 A1 | 10/2017 | Angell |
| 2017/0331056 A1 | 11/2017 | Li et al. |
| 2017/0342098 A1 | 11/2017 | Li |
| 2017/0373260 A1 | 12/2017 | Li |
| 2018/0006246 A1 | 1/2018 | Li |
| 2018/0013096 A1 | 1/2018 | Hamada |
| 2018/0052366 A1 | 2/2018 | Hao |
| 2018/0053904 A1 | 2/2018 | Li |
| 2018/0130960 A1 | 5/2018 | Li |
| 2018/0138428 A1 | 5/2018 | Li |
| 2018/0148464 A1 | 5/2018 | Li |
| 2018/0159051 A1 | 6/2018 | Li |
| 2018/0166655 A1 | 6/2018 | Li et al. |
| 2018/0175329 A1 | 6/2018 | Li |
| 2018/0194790 A1 | 7/2018 | Li |
| 2018/0198081 A1 | 7/2018 | Zeng |
| 2018/0219161 A1 | 8/2018 | Li |
| 2018/0226592 A1 | 8/2018 | Li |
| 2018/0226593 A1 | 8/2018 | Li |
| 2018/0277777 A1 | 9/2018 | Li |
| 2018/0301641 A1 | 10/2018 | Li |
| 2018/0312750 A1 | 11/2018 | Li |
| 2018/0331307 A1 | 11/2018 | Li |
| 2018/0334459 A1 | 11/2018 | Li |
| 2018/0337345 A1 | 11/2018 | Li |
| 2018/0337349 A1 | 11/2018 | Li |
| 2018/0337350 A1 | 11/2018 | Li |
| 2019/0013485 A1 | 1/2019 | Li |
| 2019/0067602 A1 | 2/2019 | Li |
| 2019/0109288 A1 | 4/2019 | Li |
| 2019/0119312 A1 | 4/2019 | Chen |
| 2019/0157352 A1 | 5/2019 | Li |
| 2019/0194536 A1 | 6/2019 | Li |
| 2019/0259963 A1 | 8/2019 | Li |
| 2019/0276485 A1 | 9/2019 | Li |
| 2019/0312217 A1 | 10/2019 | Li |
| 2019/0367546 A1 | 12/2019 | Li |
| 2019/0389893 A1 | 12/2019 | Li |
| 2020/0006678 A1 | 1/2020 | Li |
| 2020/0071330 A1 | 3/2020 | Li |
| 2020/0075868 A1 | 3/2020 | Li |
| 2020/0119288 A1 | 4/2020 | Li |
| 2020/0119289 A1 | 4/2020 | Lin |
| 2020/0140471 A1 | 5/2020 | Chen |
| 2020/0152891 A1 | 5/2020 | Li |
| 2020/0239505 A1 | 7/2020 | Li |
| 2020/0243776 A1 | 7/2020 | Li |

FOREIGN PATENT DOCUMENTS

| | | |
|---|---|---|
| CN | 1894267 | 1/2007 |
| CN | 1894269 | 1/2007 |
| CN | 101142223 | 3/2008 |
| CN | 101667626 | 3/2010 |

(56) References Cited

FOREIGN PATENT DOCUMENTS

| | | |
|---|---|---|
| CN | 102449108 A | 5/2012 |
| CN | 102892860 | 1/2013 |
| CN | 102971396 | 3/2013 |
| CN | 103102372 | 5/2013 |
| CN | 104232076 | 12/2014 |
| CN | 104377231 | 2/2015 |
| CN | 104576934 | 4/2015 |
| CN | 104693243 | 6/2015 |
| CN | 105367605 | 3/2016 |
| CN | 105418591 | 3/2016 |
| CN | 106783922 | 5/2017 |
| EP | 1617493 | 1/2006 |
| EP | 1808052 | 7/2007 |
| EP | 1874893 | 1/2008 |
| EP | 1874894 | 1/2008 |
| EP | 1919928 | 5/2008 |
| EP | 1968131 | 9/2008 |
| EP | 2020694 | 2/2009 |
| EP | 2036907 | 3/2009 |
| EP | 2096690 A2 | 9/2009 |
| EP | 2417217 | 2/2012 |
| EP | 2112213 | 7/2012 |
| EP | 2684932 | 1/2014 |
| EP | 2711999 | 3/2014 |
| EP | 3032293 | 6/2016 |
| JP | 2002010505 | 1/2002 |
| JP | 2002105055 A | 4/2002 |
| JP | 2003342284 | 12/2003 |
| JP | 2005031073 | 2/2005 |
| JP | 2005267557 | 9/2005 |
| JP | 2005310733 | 11/2005 |
| JP | 2006047240 | 2/2006 |
| JP | 2006232784 | 9/2006 |
| JP | 2006242080 | 9/2006 |
| JP | 2006242081 | 9/2006 |
| JP | 2006256999 | 9/2006 |
| JP | 2006257238 | 9/2006 |
| JP | 2006261623 | 9/2006 |
| JP | 2006290988 | 10/2006 |
| JP | 2006313796 | 11/2006 |
| JP | 2006332622 | 12/2006 |
| JP | 2006351638 | 12/2006 |
| JP | 2007019462 | 1/2007 |
| JP | 2007031678 A | 2/2007 |
| JP | 2007042875 | 2/2007 |
| JP | 2007051243 | 3/2007 |
| JP | 2007053132 | 3/2007 |
| JP | 2007066581 | 3/2007 |
| JP | 2007073620 | 3/2007 |
| JP | 2007073845 | 3/2007 |
| JP | 2007073900 | 3/2007 |
| JP | 2007080593 | 3/2007 |
| JP | 2007080677 | 3/2007 |
| JP | 2007088105 | 4/2007 |
| JP | 2007088164 | 4/2007 |
| JP | 2007096259 | 4/2007 |
| JP | 2007099765 A | 4/2007 |
| JP | 2007110067 | 4/2007 |
| JP | 2007110102 | 4/2007 |
| JP | 2007519614 | 7/2007 |
| JP | 2007258550 | 10/2007 |
| JP | 2007324309 | 12/2007 |
| JP | 2008010353 | 1/2008 |
| JP | 2008091860 | 4/2008 |
| JP | 2008103535 | 5/2008 |
| JP | 2008108617 | 5/2008 |
| JP | 2008109085 | 5/2008 |
| JP | 2008109103 | 5/2008 |
| JP | 2008116343 A | 5/2008 |
| JP | 2008117545 A | 5/2008 |
| JP | 2008160087 | 7/2008 |
| JP | 2008198801 | 8/2008 |
| JP | 2008270729 | 11/2008 |
| JP | 2008270736 | 11/2008 |
| JP | 2008310220 A | 12/2008 |
| JP | 2009016184 | 1/2009 |
| JP | 2009016579 | 1/2009 |
| JP | 2009032977 | 2/2009 |
| JP | 2009032988 | 2/2009 |
| JP | 2009059997 | 3/2009 |
| JP | 2009076509 A | 4/2009 |
| JP | 2009161524 | 7/2009 |
| JP | 2009247171 | 10/2009 |
| JP | 2009266943 | 11/2009 |
| JP | 2009267171 | 11/2009 |
| JP | 2009267244 | 11/2009 |
| JP | 2009272339 | 11/2009 |
| JP | 2009283891 | 12/2009 |
| JP | 2010135689 | 6/2010 |
| JP | 2010171205 | 8/2010 |
| JP | 2011071452 | 4/2011 |
| JP | 2012079895 | 4/2012 |
| JP | 2012079898 | 4/2012 |
| JP | 2012522843 | 9/2012 |
| JP | 2012207231 | 10/2012 |
| JP | 2012222255 | 11/2012 |
| JP | 2012231135 | 11/2012 |
| JP | 2013023500 | 2/2013 |
| JP | 2013048256 | 3/2013 |
| JP | 2013053149 | 3/2013 |
| JP | 2013525436 | 6/2013 |
| JP | 2014019701 | 2/2014 |
| JP | 2014058504 | 4/2014 |
| JP | 2014520096 | 8/2014 |
| JP | 5604505 | 10/2014 |
| JP | 2012709899 | 11/2014 |
| JP | 2014221807 | 11/2014 |
| JP | 2014239225 | 12/2014 |
| JP | 2015081257 | 4/2015 |
| JP | WO2018140765 | 8/2018 |
| KR | 20060011537 | 2/2006 |
| KR | 20060015371 | 2/2006 |
| KR | 1020060115371 | 11/2006 |
| KR | 2007061830 | 6/2007 |
| KR | 2007112465 | 11/2007 |
| KR | 1020130043460 | 4/2013 |
| KR | 101338250 | 12/2013 |
| KR | 20140052501 | 5/2014 |
| TW | 200701835 | 1/2007 |
| TW | 201249851 | 12/2012 |
| TW | 201307365 | 2/2013 |
| TW | 201710277 | 3/2017 |
| WO | WO2008054578 | 5/2000 |
| WO | 2000070655 | 11/2000 |
| WO | WO2000070655 | 11/2000 |
| WO | WO2004003108 | 1/2004 |
| WO | 2004070655 | 8/2004 |
| WO | WO2004085450 | 10/2004 |
| WO | WO2004108857 | 12/2004 |
| WO | WO2005042444 | 5/2005 |
| WO | WO2005042550 | 5/2005 |
| WO | WO2005113704 | 12/2005 |
| WO | WO2006033440 | 3/2006 |
| WO | WO2006067074 | 6/2006 |
| WO | 2006081780 | 8/2006 |
| WO | WO2006098505 | 9/2006 |
| WO | WO2006113106 | 10/2006 |
| WO | WO2006115299 | 11/2006 |
| WO | WO2006115301 | 11/2006 |
| WO | WO2007034985 | 3/2007 |
| WO | WO2007069498 | 6/2007 |
| WO | WO2008066192 | 6/2008 |
| WO | WO2008066195 | 6/2008 |
| WO | WO2008066196 | 6/2008 |
| WO | WO2008101842 | 8/2008 |
| WO | WO2008117889 | 10/2008 |
| WO | WO2008123540 | 10/2008 |
| WO | 2008131932 A1 | 11/2008 |
| WO | 2009003455 | 1/2009 |
| WO | 2009008277 | 1/2009 |
| WO | 2009011327 | 1/2009 |
| WO | WO2009017211 | 2/2009 |
| WO | WO2009023667 | 2/2009 |
| WO | 2009086209 | 7/2009 |

(56) References Cited

FOREIGN PATENT DOCUMENTS

| | | |
|---|---|---|
| WO | 2009111299 | 9/2009 |
| WO | WO2010007098 | 1/2010 |
| WO | WO2010056669 | 5/2010 |
| WO | WO2010093176 | 8/2010 |
| WO | 2010105141 | 9/2010 |
| WO | WO2010118026 | 10/2010 |
| WO | WO2011064335 | 6/2011 |
| WO | WO2011070989 | 6/2011 |
| WO | WO2011089163 | 7/2011 |
| WO | WO2011137429 | 11/2011 |
| WO | WO2011137431 | 11/2011 |
| WO | 2012074909 | 6/2012 |
| WO | WO2012112853 | 8/2012 |
| WO | WO2012116231 | 8/2012 |
| WO | WO2012142387 | 10/2012 |
| WO | WO2012162488 | 11/2012 |
| WO | WO2012163471 | 12/2012 |
| WO | WO-2013/130483 A1 * | 9/2013 |
| WO | WO2013130483 | 9/2013 |
| WO | 2014009310 | 1/2014 |
| WO | WO2014016611 | 1/2014 |
| WO | WO2014031977 | 2/2014 |
| WO | WO2014047616 | 3/2014 |
| WO | WO2014109814 | 7/2014 |
| WO | WO2014208271 | 12/2014 |
| WO | WO2015027060 | 2/2015 |
| WO | WO2015131158 | 9/2015 |
| WO | WO-2016/025921 A1 * | 2/2016 |
| WO | WO2016025921 | 2/2016 |
| WO | WO2016029137 | 2/2016 |
| WO | WO2016029186 | 2/2016 |
| WO | WO2016197019 | 12/2016 |
| WO | 2017117935 | 7/2017 |
| WO | WO2018071697 | 4/2018 |
| WO | 2019079505 | 4/2019 |
| WO | 2019079508 | 4/2019 |
| WO | 2019079509 | 4/2019 |
| WO | 2019236541 | 12/2019 |
| WO | 2020018476 | 1/2020 |

OTHER PUBLICATIONS

Guijie Li et al., "Modifying Emission Spectral Bandwidth of Phosphorescent Platinum(II) Complexes Through Synthetic Control," Inorg. Chem. 2017, 56, 8244-8256.
Tyler Fleetham et al., "Efficient Red-Emitting Platinum Complex with Long Operational Stability," ACS Appl. Mater. Interfaces 2015, 7, 16240-16246.
Supporting Information: Xiao-Chun Hang et al., "Highly Efficient Blue-Emitting Cyclometalated Platinum(II) Complexes by Judicious Molecular Design," Wiley-VCH 2013, 7 pages.
Russell J. Holmes et al., "Blue and Near-UV Phosphorescence from Iridium Complexes with Cyclometalated Pyrazolyl or N-Heterocyclic Carbene Ligands," Inorganic Chemistry, 2005, vol. 44, No. 22, pp. 7995-8003.
Pui Keong Chow et al., "Strongly Phosphorescent Palladium(II) Complexes of Tetradentate Ligands with Mixed Oxygen, Carbon, and Nitrogen Donor Atoms: Photophysics, Photochemistry, and Applications," Angew. Chem. Int. Ed. 2013, 52, 11775-11779.
Pui-Keong Chow et al., "Highly luminescent palladium(II) complexes with sub-millisecond blue to green phosphorescent excited states. Photocatalysis and highly efficient PSF-OLEDs," Chem. Sci., 2016, 7, 6083-6098.
Wong; Challenges in organometallic research—Great opportunity for solar cells and OLEDs, Journal of Organometallic Chemistry, 2009, 694, 2644-2647.
JP2009267244, English Translation from EPO, Nov. 2009, 80 pages.
JP2010135689, English translation from EPO, Jun. 2010, 95 pages.
Chi et al.; Transition-metal phosphors with cyclometalating ligands: fundamentals and applications, Chemical Society Reviews, vol. 39, No. 2, Feb. 2010, pp. 638-655.
Satake et al., "Interconvertible Cationic and Neutral Pyridinylimidazole η3-Allylpalladium Complexes. Structural Assignment by 1H, 13C, and 15N NMR and X-ray Diffraction", Organometallics, vol. 18, No. 24, 1999, pp. 5108-5111.
Baldo et al., "Highly Efficient Phosphorescent Emission from Organic Electroluminescent Devices," Nature, vol. 395, Sep. 10, 1998, pp. 151-154.
Baldo et al., "Very high-efficiency green organic light-emitting devices based on electrophosphorescence," Applied Physics Letters, vol. 75, No. 1, Jul. 5, 1999, pp. 4-6.
Ying Yang et al., "Induction of Circularly Polarized Electroluminescence from an Achiral Light-Emitting Polymer via a Chiral Small-Molecule Dopant," Advanced Materials, vol. 25, Issue 18, May 14, 2013, pp. 2624-2628.
Ayan Maity et al., "Room-temperature synthesis of cyclometalated iridium(III) complexes; kinetic isomers and reactive functionalities" Chem. Sci., vol. 4, pp. 1175-1181 (2013).
Shiro Koseki et al., "Spin-orbit coupling analyses of the geometrical effects on phosphorescence in Ir(ppy)3 and its derivatives", J. Phys. Chem. C, vol. 117, pp. 5314-5327 (2013).
Ji Hyun Seo et al., "Efficient blue-green organic light-emitting diodes based on heteroleptic tris-cyclometalated iridium (III) complexes". Thin Solid Films, vol. 517, pp. 1807-1810 (2009).
Barry O'Brien et al.: White organic light emitting diodes using Pt-based red, green and blue phosphorescent dopants. Proc. SPIE, vol. 8829, pp. 1-6, Aug. 25, 2013.
Xiao-Chu Hang et al., "Highly Efficient Blue-Emitting Cyclometalated Platinum(II) Complexes by Judicious Molecular Design," Angewandte Chemie, International Edition, vol. 52, Issue 26, Jun. 24, 2013, pp. 6753-6756.
Vanessa Wood et al., "Colloidal quantum dot light-emitting devices," Nano Reviews, vol. 1, 2010, 8 pages.
Glauco Ponterini et al., "Comparison of Radiationless Decay Processes in Osmium and Platinum Porphyrins," J. Am. Chem. Soc., vol. 105, No. 14, 1983, pp. 4639-4645.
Shizuo Tokito et al., "Confinement of triplet energy on phosphorescent molecules for highly-efficient organic blue-light-emitting devices," Applied Physics Letters, vol. 83, No. 3, Jul. 21, 2003, pp. 569-571.
Brian W. D'Andrade et al., "Controlling Exciton Diffusion in Multilayer White Phosphorescent Organic Light Emitting Devices," Adv. Mater., vol. 14, No. 2, Jan. 16, 2002, pp. 147-151.
Dileep A. K. Vezzu et al., "Highly Luminescent Tetradentate Bis-Cyclometalated Platinum Complexes: Design, Synthesis, Structure, Photophysics, and Electroluminescence Application," Inorg. Chem., vol. 49, 2010, pp. 5107-5119.
Evan L. Williams et al., "Excimer-Based White Phosphorescent Organic Light Emitting Diodes with Nearly 100% Internal Quantum Efficiency," Adv. Mater., vol. 19, 2007, pp. 197-202.
Shih-Chun Lo et al., "High-Triplet-Energy Dendrons: Enhancing the Luminescence of Deep Blue Phosphorescent Iridium(III) Complexes," J. Am. Chem. Soc., vol. 131, 2009, pp. 16681-16688.
Jan Kalinowski et al., "Light-emitting devices based on organometallic platinum complexes as emitters," Coordination Chemistry Reviews, vol. 255, 2011, pp. 2401-2425.
Ke Feng et al., "Norbornene-Based Copolymers Containing Platinum Complexes and Bis(carbazolyl)benzene Groups in Their Side-Chains," Macromolecules, vol. 42, 2009, pp. 6855-6864.
Chi-Ming Che et al., "Photophysical Properties and OLED Applications of Phosphorescent Platinum(II) Schiff Base Complexes," Chem. Eur. J., vol. 16, 2010, pp. 233-247.
Stephen R. Forrest, "The path to ubiquitous and low-cost organic electronic appliances on plastic," Nature, vol. 428, Apr. 29, 2004, pp. 911-918.
Nicholas R. Evans et al., "Triplet Energy Back Transfer in Conjugated Polymers with Pendant Phosphorescent Iridium Complexes," J. Am. Chem. Soc., vol. 128, 2006, pp. 6647-6656.
Xiaofan Ren et al., "Ultrahigh Energy Gap Hosts in Deep Blue Organic Electrophosphorescent Devices," Chem. Mater., vol. 16, 2004, pp. 4743-4747.
Jeonghun Kwak et al., "Bright and Efficient Full-Color Colloidal Quantum Dot Light-Emitting Diodes Using an Inverted Device Structure," Nano Lett., 2012, Vo. 12, pp. 2362-2366.

(56) References Cited

OTHER PUBLICATIONS

Hirohiko Fukagawa et al., "Highly Efficient and Stable Red Phosphorescent Organic Light-Emitting Diodes Using Platinum Complexes," Adv. Mater., 2012, vol. 24, pp. 5099-5103.
Eric Turner et al., "Cyclometalated Platinum Complexes with Luminescent Quantum Yields Approaching 100%," Inorg. Chem., 2013, vol. 52, pp. 7344-7351.
Steven C. F. Kui et al., "Robust Phosphorescent Platinum(II) Complexes Containing Tetradentate O^N^C^N Ligands: Excimeric Excited State and Application in Organic White-Light-Emitting Diodes," Chem. Eur. J., 2013, vol. 19, pp. 69-73.
Steven C. F. Kui et al., "Robust phosphorescent platinum(II) complexes with tetradentate O^N^C^N ligands: high efficiency OLEDs with excellent efficiency stability," Chem. Commun., 2013, vol. 49, pp. 1497-1499.
Guijie Li et al., "Efficient and stable red organic light emitting devices from a tetradentate cyclometalated platinum complex," Organic Electronics, 2014, vol. 15 pp. 1862-1867.
Guijie Li et al., Efficient and Stable White Organic Light-Emitting Diodes Employing a Single Emitter, Adv. Mater., 2014, vol. 26, pp. 2931-2936.
Barry O'Brien et al., "High efficiency white organic light emitting diodes employing blue and red platinum emitters," Journal of Photonics for Energy, vol. 4, 2014, pp. 043597-1-8.
Kai Li et al., "Light-emitting platinum(II) complexes supported by tetradentate dianionic bis(N-heterocyclic carbene) ligands: towards robust blue electrophosphors," Chem. Sci., 2013, vol. 4, pp. 2630-2644.
Tyler Fleetham et al., "Efficient "pure" blue OLEDs employing tetradentate Pt complexes with a narrow spectral bandwidth," Advanced Materials (Weinheim, Germany), Vo. 26, No. 41, 2014, pp. 7116-7121.
Dorwald; "Side Reactions in Organic Synthesis: A Guide to Successful Synthesis Design," Chapter 1, 2005 Wiley-VCH Verlag GmbH & Co. KGaA, Wienheim, 32 pages.
Murakami; JP 2007258550, English machine translation from EPO, Oct. 4, 2007. 80 pages.
Murakami; JP 2007324309, English machine translation from EPO, Dec. 13, 2007, 89 pages.
Marc Lepeltier et al., "Efficient blue green organic light-emitting devices based on a monofluorinated heteroleptic iridium(III) complex," Synthetic Metals, vol. 199, 2015, pp. 139-146.
Stefan Bernhard, "The First Six Years: A Report," Department of Chemistry, Princeton University, May 2008, 11 pages.
Ivaylo Ivanov et al., "Comparison of the INDO band structures of polyacetylene, polythiophene, polyfuran, and polypyrrole," Synthetic Metals, vol. 116, Issues 1-3, Jan. 1, 2001, pp. 111-114.
Zhi-Qiang Zhu et.al., "Harvesting All Electrogenerated Excitons through Metal Assisted Delayed Fluorescent Materials," Adv. Mater. 27 (2015) 2533-2537.
Zhi-Qiang Zhu et al . . . "Efficient Cyclometalated Platinum(II) Complex with Superior Operational Stability," Adv. Mater. 29 (2017) 1605002.
Chew, S. et al.: Photoluminescence and electroluminescence of a new blue-emitting homoleptic iridium complex. Applied Phys. Letters; 2006, vol. 88, pp. 093510-1-093510-3.
Xin Li et al., "Density functional theory study of photophysical properties of iridium (III) complexes with phenylisoquinoline and phenylpyridine ligands", The Journal of Physical Chemistry C, 2011, vol. 115, No. 42, pp. 20722-20731.
Sylvia Bettington et al. "Tris-Cyclometalated Iridium(III) Complexes of Carbazole(fluorenyl)pyridine Ligands: Synthesis, Redox and Photophysical Properties, and Electrophosphorescent Light-Emitting Diodes" Chemistry: A European Journal, 2007, vol. 13, pp. 1423-1431.
Christoph Ulbricht et al., "Synthesis and Characterization of Oxetane-Functionalized Phosphorescent Ir(III)-Complexes", Macromol. Chem. Phys. 2009, 210, pp. 531-541.

Dan Wang et al., "Carbazole and arylamine functionalized iridium complexes for efficient electro-phosphorescent light-emitting diodes", Inorganica Chimica Acta 370 (2011) pp. 340-345.
Huaijun Tang et al., "Novel yellow phosphorescent iridium complexes containing a carbazoleeoxadiazole unit used in polymeric light-emitting diodes", Dyes and Pigments 91 (2011) pp. 413-421.
Hoe-Joo Seo et al., "Blue phosphorescent iridium(III) complexes containing carbazole-functionalized phenyl pyridine for organic light-emitting diodes: energy transfer from carbazolyl moieties to iridium(III) cores", RSC Advances, 2011, 1, pp. 755-757.
Jack W. Levell et al., "Carbazole/iridium dendrimer side-chain phosphorescent copolymers for efficient light emitting devices", New J. Chem., 2012, 36, pp. 407-413.
Z Liu et al., "Green and blue-green phosphorescent heteroleptic iridium complexes containing carbazole-functionalized beta-diketonate for non-doped organic light-emitting diodes", Organic Electronics 9 (2008) pp. 171-182.
Zhaowu Xu et al., "Synthesis and properties of iridium complexes based 1,3,4-oxadiazoles derivatives", Tetrahedron 64 (2008) pp. 1860-1867.
D.F. O'Brien et al., "Improved energy transfer in electrophosphorescent devices," Appl. Phys. Lett., vol. 74, No. 3, Jan. 18, 1999, pp. 442-444.
Vadim Adamovich et al., "High efficiency single dopant white electrophosphorescent light emitting diodes," New J. Chem., 2002, 26, pp. 1171-1178.
Kwon-Hyeon Kim et al., "Controlling Emitting Dipole Orientation with Methyl Substituents on Main Ligand of Iridium Complexes for Highly Efficient Phosphorescent Organic Light-Emitting Diodes", Adv. Optical Mater. 2015, 3, pp. 1191-1196.
Matthew J. Jurow et al., "Understanding and predicting the orientation of heteroleptic phosphors in organic light-emitting materials", Nature Materials, vol. 15, Jan. 2016, pp. 85-93.
Kwon-Hyeon Kim et al., "Crystal Organic Light-Emitting Diodes with Perfectly Oriented Non-Doped Pt-Based Emitting Layer", Adv. Mater. 2016, 28, pp. 2526-2532.
Adachi, C. et al., "High-efficiency organic electrophosphorescent devices with tris(2-phenylpyridine)iridium doped into electron-transporting materials", Applied Physics Letters, Aug. 2000, vol. 77, No. 6, pp. 904-906 <DOI:10.1063/1.1306639>.
Baldo et al., "Very high-efficiency green organic light-emitting devices based on electrophosphorescence," Appl. Phys. Lett., vol. 75, No. 3, 4-6 (1999).
Baldo et al., Very High-Efficiency Green Organic Light-Emitting Devices Based on Electrophosphorescence, Appl Phys Lett, 75(3):4-6 (1999).
Baldo, M. et al., "Excitonic singlet-triplet ratio in a semiconducting organic thin film", Physical Review B, Nov. 1999, vol. 60, No. 20, pp. 14422-14428 <DOI:10.1103/PhysRevB.60.14422>.
Baldo, M. et al., "High-efficiency fluorescent organic light-emitting devices using a phosphorescent sensitizer", Nature, Feb. 2000, vol. 403, pp. 750-753.
Berson et al. (2007). "Poly(3-hexylthiophene) fibers for photovoltaic applications," Adv. Funct. Mat., 17, 1377-84.
Bouman et al. (1994). "Chiroptical properties of regioregular chiral polythiophenes," Mol. Cryst. Liq. Cryst., 256, 439-48.
Bronner; Dalton Trans., 2010, 39, 180-184. DOI: 10.1039/b908424j (Year: 2010) (5 pages).
Brooks, J. et al., "Synthesis and Characterization of Phosphorescent Cyclometalated Platinum Complexes", Inorganic Chemistry, May 2002, vol. 41, No. 12, pp. 3055-3066 <DOI:10.1021/ic0255508>.
Brown, A. et al., "Optical spectroscopy of triplet excitons and charged excitations in poly(p-phenylenevinylene) light-emitting diodes", Chemical Physics Letters, Jul. 1993, vol. 210, No. 1-3, pp. 61-66 <DOI:10.1016/0009-2614(93)89100-V>.
Burroughes, J. et al., "Light-emitting diodes based on conjugated polymers", Nature, Oct. 1990, vol. 347, pp. 539-541.
Campbell et al. (2008). "Low-temperature control of nanoscale morphology for high performance polymer photovoltaics," Nano Lett., 8, 3942-47.

(56) References Cited

OTHER PUBLICATIONS

Chen, F. et al., "High-performance polymer light-emitting diodes doped with a red phosphorescent iridium complex", Applied Physics Letters, Apr. 2002 [available online Mar. 2002], vol. 80, No. 13, pp. 2308-2310 <10.1063/1.1462862>.
Chen, X., et al., "Fluorescent Chemosensors Based on Spiroring-Opening of Xanthenes and Related Derivatives", Chemical Reviews, 2012 [available online Oct. 2011], vol. 112, No. 3, pp. 1910-1956 <DOI:10.1021/cr200201z>.
Chow; Angew. Chem. Int. Ed. 2013, 52, 11775-11779. DOI: 10.1002/anie.201305590 (Year: 2013) (5 pages).
Coakley et al. (2004). "Conjugated polymer photovoltaic cells," Chem. Mater., 16, 4533-4542.
Colombo, M. et al., "Synthesis and high-resolution optical spectroscopy of bis[2-(2-thienyl)pyridinato-C3,N'](2,2'-bipyridine)iridium(III)", Inorganic Chemistry, Jul. 1993, vol. 32, No. 14, pp. 3081-3087 <DOI:10.1021/ic00066a019>.
D'Andrade, B. et al., "Operational stability of electrophosphorescent devices containing p and n doped transport layers ", Applied Physics Letters, Nov. 2003, vol. 83, No. 19, pp. 3858-3860 <DOI:10.1063/1.1624473>.
Dorwald, Side Reactions in Organic Synthesis 2005, Wiley:VCH Weinheim Preface, pp. 1-15 & Chapter 1, pp. 279-308.
Dsouza, R., et al., "Fluorescent Dyes and Their Supramolecular Host/Guest Complexes with Macrocycles in Aqueous Solution", Oct. 2011, vol. 111, No. 12, pp. 7941-7980 <DOI:10.1021/cr200213s>.
Finikova,M.A. et al., New Selective Synthesis of Substituted Tetrabenzoporphyris, Doklady Chemistry, 2003, vol. 391, No. 4-6, pp. 222-224.
Fuchs, C. et al., "Enhanced light emission from top-emitting organic light-emitting diodes by optimizing surface plasmon polariton losses", arXiv, submitted Mar. 2015, 11 pages, arXiv:1503.01309.
Fuchs, C. et al., "Enhanced light emission from top-emitting organic light-emitting diodes by optimizing surface plasmon polariton losses", Physical Review B, Dec. 2015, vol. 92, No. 24, pp. 245306-1-245306-10 <DOI:10.1103/PhysRevB.92.245306>.
Galanin et al. Synthesis and Properties of meso-Phenyl-Substituted Tetrabenzoazaporphines Magnesium Complexes. Russian Journal of Organic Chemistry (Translation of Zhurnal Organicheskoi Khimii) (2002), 38(8), 1200-1203.
Galanin et al., meso-Phenyltetrabenzoazaporphyrins and their zinc complexes. Synthesis and spectral properties, Russian Journal of General Chemistry (2005), 75(4), 651-655.
Gather, M. et al., "Recent advances in light outcoupling from white organic light-emitting diodes," Journal of Photonics for Energy, May 2015, vol. 5, No. 1, 057607-1-057607-20 <DOI:10.1117/1.JPE.5.057607>.
Gong et al., Highly Selective Complexation of Metal Ions by the Self-Tuning Tetraazacalixpyridine macrocycles, Tetrahedron, 65(1): 87-92 (2009).
Gottumukkala,V. et al., Synthesis, cellular uptake and animal toxicity of a tetra carboranylphenyl N-tetrabenzoporphyr in, Bioorganic &Medicinal Chemistry, 2006, vol. 14, pp. 1871-1879.
Graf, A. et al., "Correlating the transition dipole moment orientation of phosphorescent emitter molecules in OLEDs with basic material properties", Journal of Materials Chemistry C, Oct. 2014, vol. 2, No. 48, pp. 10298-10304 <DOI:10.1039/c4tc00997e>.
Hansen (1969). "The universality of the solubility parameter," I & EC Product Research and Development, 8, 2-11.
Hatakeyama, T. et al., "Ultrapure Blue Thermally Activated Delayed Fluorescence Molecules: Efficient HOMO-LUMO Separation by the Multiple Resonance Effect", Advanced Materials, Apr. 2016, vol. 28, No. 14, pp. 2777-2781, <DOI:10.1002/adma.201505491>.
Holmes, R. et al., "Efficient, deep-blue organic electrophosphorescence by guest charge trapping", Applied Physics Letters, Nov. 2003 [available online Oct. 2003], vol. 83, No. 18, pp. 3818-3820 <DOI:10.1063/1.1624639>.
Imre et al (1996). "Liquid-liquid demixing ffrom solutions of polystyrene. 1. A review. 2. Improved correlation with solvent properties," J. Phys. Chem. Ref. Data, 25, 637-61.
Jeong et al. (2010). "Improved efficiency of bulk heterojunction poly (3-hexylthiophene):[6,6]-phenyl-C61-butyric acid methyl ester photovoltaic devices using discotic liquid crystal additives," Appl. Phys. Lett . . . 96, 183305. (3 pages).
Kim et al (2009). "Altering the thermodynamics of phase separation in inverted bulk-heterojunction organic solar cells," Adv. Mater., 21, 3110-15.
Kim et al. (2005). "Device annealing effect in organic solar cells with blends of regioregular poly (3-hexylthiophene) and soluble fullerene," Appl. Phys. Lett. 86, 063502. (3 pages).
Kim, HY. et al., "Crystal Organic Light-Emitting Diodes with Perfectly Oriented Non-Doped Pt-Based Emitting Layer", Advanced Functional Materials, Feb. 2016, vol. 28, No. 13, pp. 2526-2532 <DOI:10.1002/adma.201504451>.
Kim, JJ., "Setting up the new efficiency limit of OLEDs; Abstract" [online], Electrical Engineering-Princeton University, Aug. 2014 [retrieved on Aug. 24, 2016], retrieved from the internet: <URL:http://ee.princeton.edu/events/setting-new-efficiency-limit-oled> 2 pages.
Kim, SY. et al., "Organic Light-Emitting Diodes with 30% External Quantum Efficiency Based on a Horizontally Oriented Emitter", Advanced Functional Materials, Mar. 2013, vol. 23, No. 31, pp. 3896-3900 <DOI:10.1002/adfm.201300104 >.
Kroon et al. (2008). "Small bandgap olymers for organic solar cells," Polymer Reviews, 48, 531-82.
Kwong, R. et al., "High operational stability of electrophosphorescent devices", Applied Physics Letters, Jul. 2002 [available online Jun. 2002], vol. 81, No. 1, pp. 162-164 <DOI:10.1063/1.1489503>.
Lamansky, S. et al., "Cyclometalated Ir complexes in polymer organic light-emitting devices", Journal of Applied Physics, Aug. 2002 [available online Jul. 2002], vol. 92, No. 3, pp. 1570-1575 <10.1063/1.1491587>.
Lamansky, S. et al., "Synthesis and Characterization of Phosphorescent Cyclometalated Iridium Complexes", Inorganic Chemistry, Mar. 2001, vol. 40, No. 7, pp. 1704-1711 <DOI:10.1021/ic0008969>.
Lampe, T. et al., "Dependence of Phosphorescent Emitter Orientation on Deposition Technique in Doped Organic Films", Chemistry of Materials, Jan. 2016, vol. 28, pp. 712-715 <DOI:10.1021/acs.chemmater.5b04607>.
Lee et al. (2008). "Processing additives for inproved efficiency from bulk heterojunction solar cells," J. Am. Chem. Soc, 130, 3619-23.
Li et al. (2005). "Investigation of annealing effects and film thickness dependence of polymer solar cells based on poly (3-hexylthiophene)," J. Appl. Phys., 98, 043704. (5 pages).
Li et al. (2007). "Solvent annealing effect in polymer solar cells based on poly(3-hexylthiophene) and methanofullerenes," Adv. Funct. Mater, 17, 1636-44.
Li, J. et al., "Synthesis and characterization of cyclometalated Ir(III) complexes with pyrazolyl ancillary ligands", Polyhedron, Jan. 2004, vol. 23, No. 2-3, pp. 419-428 <DOI:10.1016/j.poly.2003.11.028>.
Li, J., "Efficient and Stable OLEDs Employing Square Planar Metal Complexes and Inorganic Nanoparticles", in DOE SSL R&D Workshop (Raleigh, North Carolina, 2016), Feb. 2016, 15 pages.
Li, J., et al., "Synthetic Control of Excited-State Properties in Cyclometalated Ir(III) Complexes Using Ancillary Ligands", Inorganic Chemistry, Feb. 2005, vol. 44, No. 6, pp. 1713-1727 <DOI:10.1021/ic048599h>.
Liang, et al. (2010). "For the bright future-bulk heterojunction polymer solar cells with power conversion efficiency of 7.4%," Adv. Mater. 22, E135-38.
Lin, TA et al., "Sky-Blue Organic Light Emitting Diode with 37% External Quantum Efficiency Using Thermally Activated Delayed Fluorescence from Spiroacridine-Triazine Hybrid", Advanced Materials, Aug. 2016, vol. 28, No. 32, pp. 6876-6983 <DOI:10.1002/adma.201601675>.
Markham, J. et al., "High-efficiency green phosphorescence from spin-coated single-layer dendrimer light-emitting diodes", Applied Physics Lettersm Apr. 2002, vol. 80, vol. 15, pp. 2645-2647 <DOI:10.1063/1.1469218>.

(56) References Cited

OTHER PUBLICATIONS

Michl, J., "Relationship of bonding to electronic spectra", Accounts of Chemical Research, May 1990, vol. 23, No. 5, pp. 127-128 <DOI:10.1021/ar00173a001>.
Miller, R. et al., "Polysilane high polymers", Chemical Reviews, Sep. 1989, vol. 89, No. 6, pp. 1359-1410 <DOI:10.1021/cr00096a006>.
Morana et al. (2007). "Organic field-effect devices as tool to characterize the bipolar transport in polymer-fullerene blends: the case of P3HT-PCBM," Adv. Funct. Mat., 17, 3274-83.
Moule et al. (2008). "Controlling morphology in Polymer-Fullerene mixtures," Adv. Mater., 20, 240-45.
Nazeeruddin, M. et al., "Highly Phosphorescence Iridium Complexes and Their Application in Organic Light-Emitting Devices", Journal of the American Chemical Society, Jun. 2003, vol. 125, No. 29, pp. 8790-8797 <DOI:10.1021/ja021413y>.
Nillson et al. (2007). "Morphology and phase segregation of spin-casted films of polyfluorene/PCBM Blends," Macromolecules, 40, 8291-8301.
Olynick et al. (2009). "The link between nanoscale feature development in a negative resist and the Hansen solubility sphere," Journal of Polymer Science: Part B: Polymer Physics, 47, 2091-2105.
Peet et al. (2007). "Efficiency enhancement in low-bandgap polymer solar cells by processing with alkane dithiols," Nature Materials, 6, 497-500.
Pivrikas et al. (2008). "Substituting the postproduction treatment for bulk-heterojunction solar cells using chemical additives," Organic Electronics, 9, 775-82.
Results from SciFinder Compound Search on Dec. 8, 2016. (17 pages).
Rui Zhu et al., "Color tuning based on a six-membered chelated iridium (III) complex with aza-aromatic ligand,", Chemistry Letters, vol. 34, No. 12, 2005, pp. 1668-1669.
Sajoto, T. et al., "Temperature Dependence of Blue Phosphorescent Cyclometalated Ir(III) Complexes", Journal of the American Chemical Society, Jun. 2009, vol. 131, No. 28, pp. 9813-9822 <DOI:10.1021/ja903317w>.
Sakai, Y. et al., "Simple model-free estimation of orientation order parameters of vacuum-deposited and spin-coated amorphous films used in organic light-emitting diodes", Applied Physics Express, Aug. 2015, vol. 8, No. 9, pp. 096601-1-096601-4 <DOI:10.7567/APEX.8.096601>.
Saricifci et al. (1993). "Semiconducting polymerbuckminsterfullerene heterojunctions: diodes photodiodes, and photovoltaic cells," Appl. Phys. Lett., 62, 585-87.
Saunders et al. (2008). "Nanoparticle-polymer photovoltaic cells," Advances in Colloid and Interface Science, 138, 1-23.
Senes, A. et al., "Transition dipole moment orientation in films of solution processed fluorescent oligomers: investigating the influence of molecular anisotropy", Journal of Materials Chemistry C, Jun. 2016, vol. 4, No. 26, pp. 6302-6308 <DOI:10.1039/c5tc03481g>.
Shin et al. (2010). "Abrupt morphology change upon thermal annealing in Poly(3-hexathiophene)/soluble fullerene blend films for polymer solar cells," Adv. Funct. Mater., 20, 748-54.
Strouse, G. et al., "Optical Spectroscopy of Single Crystal [Re(bpy)(CO)4](PF6): Mixing between Charge Transfer and Ligand Centered Excited States", Inorganic Chemistry, Oct. 1995, vol. 34, No. 22, pp. 5578-5587 <DOI:10.1021/ic00126a031>.
Tang, C. et al., "Organic electroluminescent diodes", Applied Physics Letters, Jul. 1987, vol. 51, No. 12, pp. 913-915 <DOI:10.1063/1,98799>.
Tsuoboyama, A. et al., "Homoleptic Cyclometalated Iridium Complexes with Highly Efficient Red Phosphorescence and Application to Organic Light-Emitting Diode", Journal of the American Chemical Society, Sep. 2003, vol. 125, No. 42, p. 12971-12979 <DOI:10.1021/ja034732d>.
Turro, N., "Modern Molecular Photochemistry" (Sausalito, California, University Science Books, 1991), p. 48.
U.S. Appl. No. 16/751,561, filed Jan. 24, 2020, has not yet published. Inventor: Li.
U.S. Appl. No. 16/751,586, filed Jan. 24, 2020, has not yet published. Inventor: Li et al.
U.S. Appl. No. 16/668,010, filed Oct. 30, 2019.
U.S. Appl. No. 16/739,480, filed Jan. 10, 2020.
U.S. Appl. No. 61/692,937.
U.S. Appl. No. 61/719,077.
V. Thamilarasan et al., "Green-emitting phosphorescent iridium(III) complex: Structural, photophysical and electrochemical properties," Inorganica Chimica Acta, vol. 408, 2013, pp. 240-245.
Wang et al. (2010). "The development of nanoscale morphology in polymer: fullerene photovoltaic blends during solvent casting," Soft Matter, 6, 4128-4134.
Wang et al., C(aryl)—C(alkyl) bond formation from Cu(Cl04)2-mediated oxidative cross coupling reaction between arenes and alkyllithium reagents through structurally well-defined Ar—Cu(III) intermediates, Chem Commun, 48: 9418-9420 (2012).
Williams, E. et al., "Excimer-Based White Phosphorescent Organic Light-Emitting Diodes with Nearly 100% Internal Quantum Efficiency", Advanced Materials, Jan. 2007, vol. 19, No. 2, pp. 197-202 <DOI:10.1002/adma.200602174>.
Williams, E. et al., "Organic light-emitting diodes having exclusive near-infrared electrophosphorescence", Applied Physics Letters, Aug. 2006, vol. 89, No. 8, pp. 083506-1-083506-3 <DOI:10.1063/1.2335275>.
Yakubov, L.A. et al., Synthesis and Properties of Zinc Complexes of mesoHexadecyloxy-Substituted Tetrabenzoporphyrin and Tetrabenzoazaporphyrins, Russian Journal of Organic Chemistry, 2008, vol. 44, No. 5, pp. 755-760.
Yang et al. (2005). "Nanoscale morphology of high-performance polymer solar cells," Nano Lett., 5, 579-83.
Yang, X. et al., "Efficient Blue- and White-Emitting Electrophosphorescent Devices Based on Platinum(II) [1,3-Difluoro-4,6-di(2-pyridinyl)benzene] Chloride", Advanced Materials, Jun. 2008, vol. 20, No. 12, pp. 2405-2409 <DOI:10.1002/adma.200702940>.
Yao et al. (2008). "Effect of solvent mixture on nanoscale phase separation in polymer solar cells," Adv. Funct. Mater.,18, 1783-89.
Yao et al., Cu(Cl04)2-Mediated Arene C—H Bond Halogenations of Azacalixaromatics Using Alkali Metal Halides as Halogen Sources, The Journal of Organic Chemistry, 77(7): 3336-3340 (2012).
Yu et al. (1995). "Polymer Photovoltaic Cells: Enhanced efficiencies via a network of internal donor-acceptor heterojunctions," Science, 270, 1789-91.
Zhu, W. et al., "Highly efficient electrophosphorescent devices based on conjugated polymers doped with iridium complexes", Applied Physics Letters, Mar. 2002, vol. 80, No. 12, pp. 2045-2047 <DOI:10.1063/1.1461418>.
The claim set of the U.S. Appl. No. 62/444,973, filed Jan. 11, 2017, Lichang Zeng, 36 pages. (Year: 2017).
Korean Office Action (with English translation) for App. No. KR10-2015-0104260, dated Jan. 12, 2022, 12 pages.

\* cited by examiner

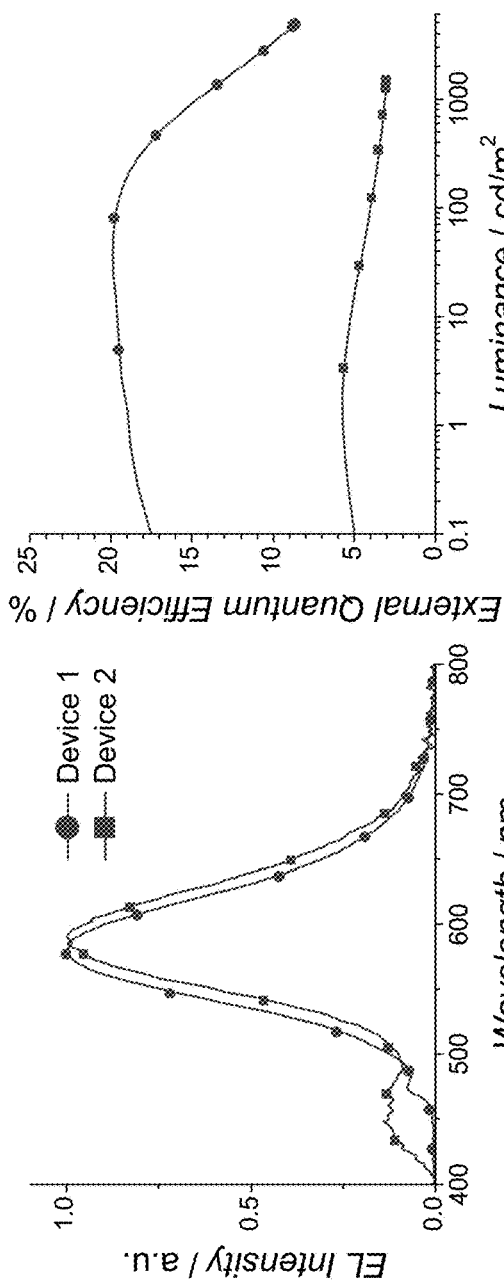
FIG. 3A
FIG. 3B
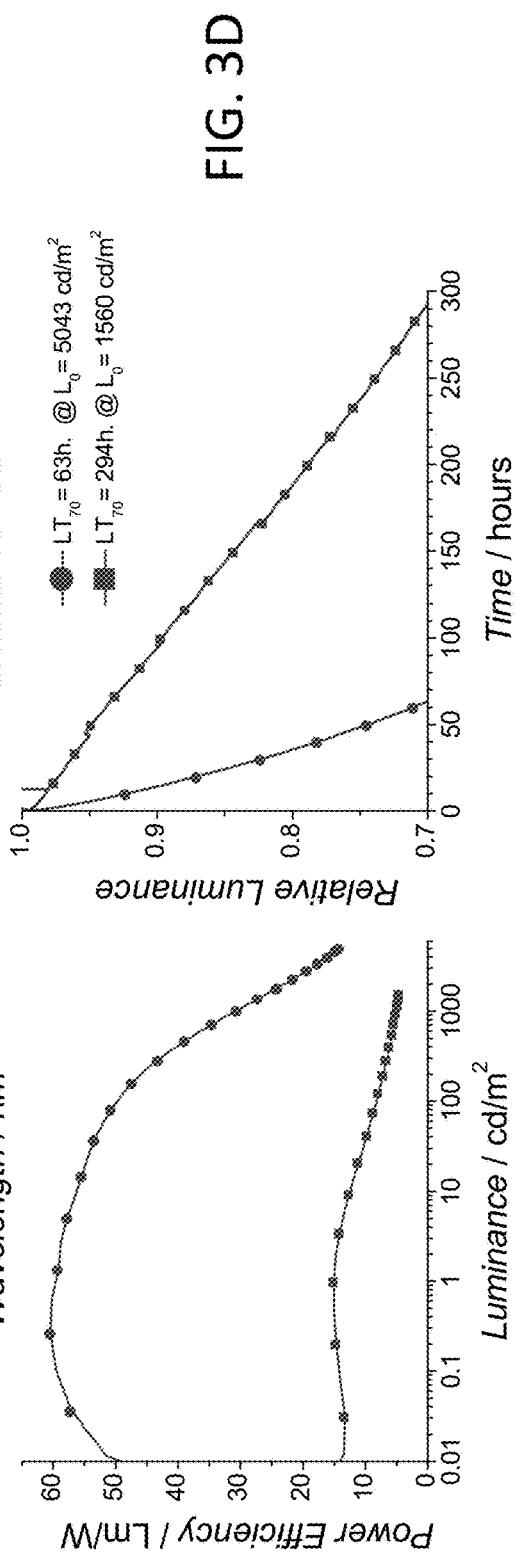
FIG. 3C
FIG. 3D

OLED WITH MULTI-EMISSIVE MATERIAL LAYER

CROSS-REFERENCE TO RELATED APPLICATION

This application claims priority to U.S. Provisional Patent Application Nos. 62/323,383 filed on Apr. 15, 2016 and 62/377,747 filed on Aug. 22, 2016, which are hereby incorporated by reference in their entireties.

STATEMENT OF GOVERNMENT INTEREST

This invention was made with government support under DE-EE0007090 awarded by the Department of Energy. The government has certain rights in the invention.

TECHNICAL FIELD

The present invention relates to organic light emitting devices with a multi-emissive material layer (EML), where a multi-EML generally refers to an emissive layer having at least two layers of emissive material, each layer having a different emitter concentration (e.g. a first EML in direct contact with a second EML, and the emitter concentration of the first EML (hole favorable) exceeds that of the second EML (electron favorable)).

BACKGROUND

Compounds capable of absorbing and/or emitting light can be ideally suited for use in a wide variety of optical and electroluminescent devices, including, for example, photo-absorbing devices such as solar- and photo-sensitive devices, organic light emitting diodes (OLEDs), photo-emitting devices, and devices capable of both photo-absorption and emission and as markers for bio-applications. Much research has been devoted to the discovery and optimization of organic and organometallic materials for use in optical and electroluminescent devices. Generally, research in this area aims to accomplish a number of goals, including improvements in absorption and emission efficiency and improvements in the stability of devices, as well as improvements in processing ability. Despite significant advances in research devoted to optical and electro-optical materials, however, many currently available materials exhibit a number of disadvantages, including poor processing ability, inefficient emission or absorption, and less than ideal stability.

SUMMARY

The present disclosure relates to OLEDs with a multi-emissive material layer (EML), where a multi-EML generally refers to an emissive layer including at least a first EML including a first emitter in direct contact with a second EML including a second emitter, where the concentration of the first emitter in the first EML (hole favorable) exceeds the concentration of the second emitter in the second EML (electron favorable). In some cases, a multi-EML includes a third EML including a third emitter, where the concentration of the second emitter in the second EML exceeds the concentration of the third emitter in the third EML. In certain cases, a multi-EML includes a fourth EML including a fourth emitter, where the concentration of the third emitter in the third EML exceeds the concentration of the fourth emitter in the fourth EML. An OLED with a multi-EML typically has a doped electron blocking layer (EBL). OLEDs described herein have improved device efficiency and operational lifetime.

Variations, modifications, and enhancements of the described embodiments and other embodiments can be made based on what is described and illustrated. In addition, one or more features of one or more embodiments may be combined. The details of one or more implementations and various features and aspects are set forth in the accompanying drawings, the description, and the claims below.

BRIEF DESCRIPTION OF THE DRAWINGS

FIGS. 3A-3D show electroluminescent spectra, external quantum efficiency (EQE) versus luminance, power efficiency versus luminance, and operational lifetime, respectively, for OLEDs with undoped and doped electron blocking layers.

DETAILED DESCRIPTION

Figure 1A:
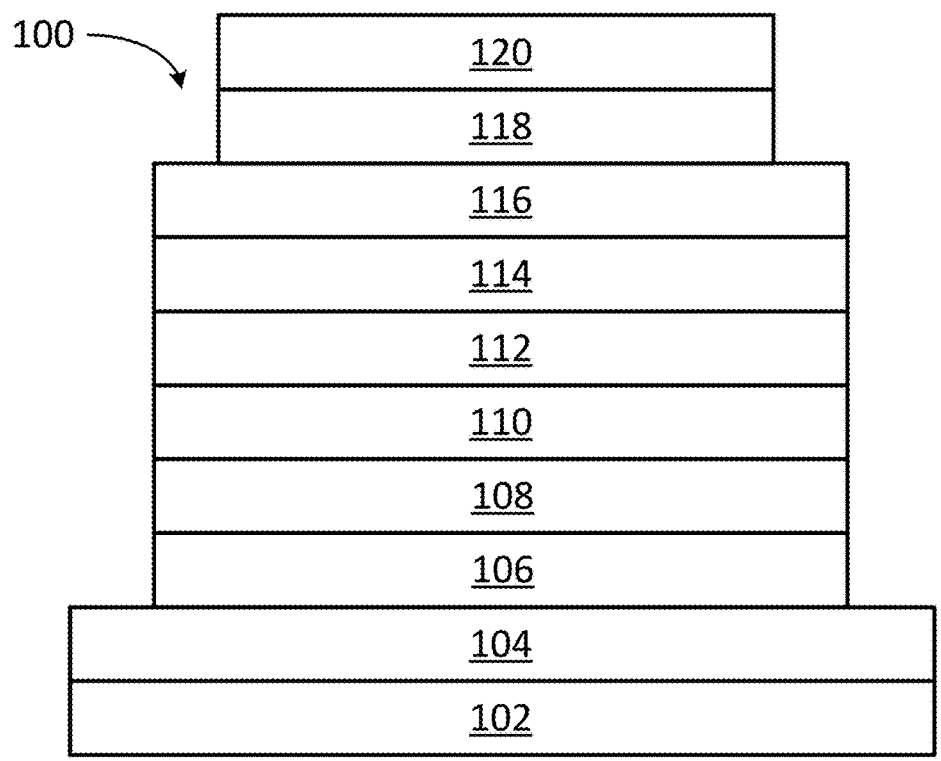
FIGS. 1A and 1B depict cross-sectional views of exemplary OLEDs.
Figure 1B:
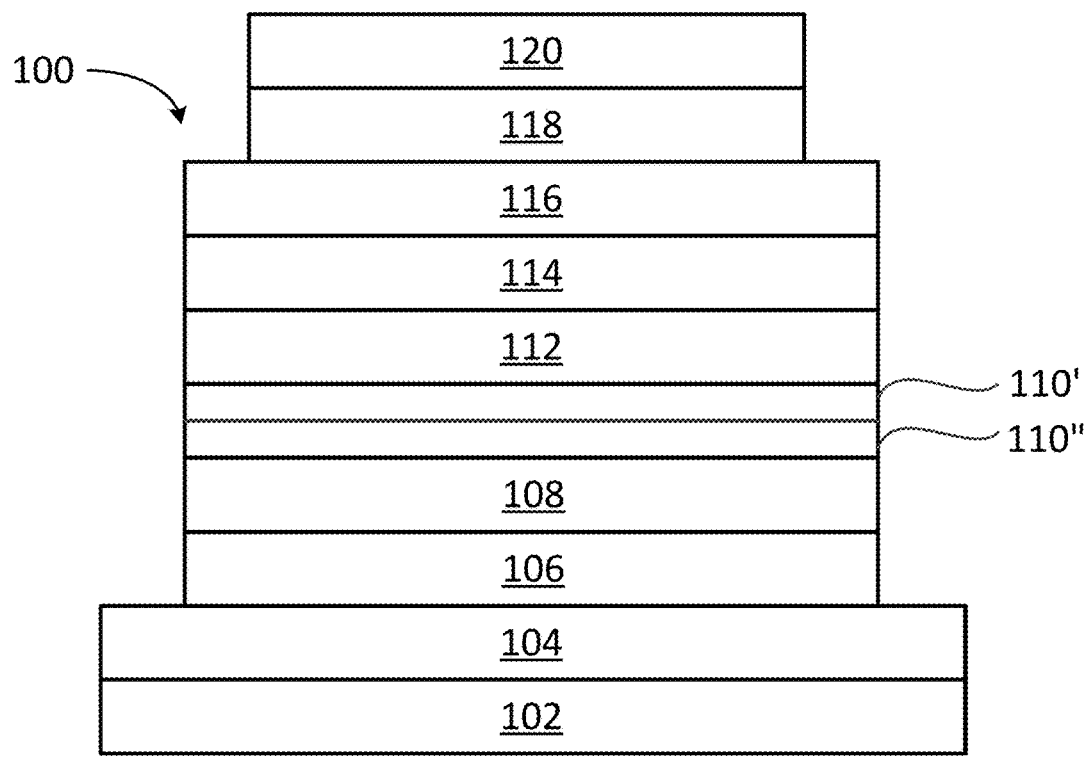

FIG. 1A depicts a cross-sectional view of an OLED 100 with an EBL. OLED 100 includes substrate 102, anode 104, hole injection layer (HIL) 106, hole transporting layer (HTL) 108, electron blocking layer (EBL) 110, emissive material layer (EML) 112, hole blocking layer (HBL) 114, electron transporting layer (ETL) 116, hole injection layer (HIL) 118, cathode 120. Anode 104 is typically a transparent material, such as indium tin oxide (ITO). HIL 106 may include any suitable hole injecting material known in the art. The hole transporting material in HTL 108 may include any suitable hole-transporter known in the art. EBL 110 includes an electron blocking material as described herein, and may be doped or undoped. EML 112 typically includes an emitter and a host. The host may be any suitable host material known in the art. The emission color of an OLED is determined by the emission energy (optical energy gap) of the emissive material in EML 112, which can be tuned by tuning the electronic structure of the emitting compounds, the host material, or both. EML 112 may be a single EML or a multi-EML. As used herein, "a single EML" generally refers to an EML having a uniform concentration of emitter throughout, and "a multi-EML" generally refers to an emissive layer having at least two layers of emissive material, each layer having a different emitter concentration (e.g. a first EML in direct contact with a second EML, and the emitter concentration of the first EML (hole favorable) exceeds that of the second EML (electron favorable)). As depicted in FIG. 1A, first EML 112' in direct contact with second EML 112'', and the emitter concentration of the first EML (hole favorable) exceeds that of the second EML (electron favorable). HBL 114 is typically undoped, and may include any hole blocking material known in the art. ETL 116 may include any suitable electron-transporter known in the art. HIL 118 typically includes a buffer material, such as lithium fluoride (LiF). Cathode 120 is typically a metal, such as aluminum (Al). As depicted in FIG. 1B, EBL 110 may include undoped layer 110' and doped layer 110''.

The electron blocking material, the dopant, or both in EBL 110 may be selected to extend the operational lifetime of an OLED with a doped EBL. In one example, the electron blocking material in EBL 110 is selected to confine excitons inside EML 112, thereby reducing or eliminating exciton quenching by HTL 108 and extending the operational lifetime of the OLED. In another example, the electron blocking material in EBL 110 is selected to alleviate charge imbalance in EML 112, thereby extending the operational lifetime of the OLED.

Organometallic complexes having Formula I may be used as emitters in the devices described herein:

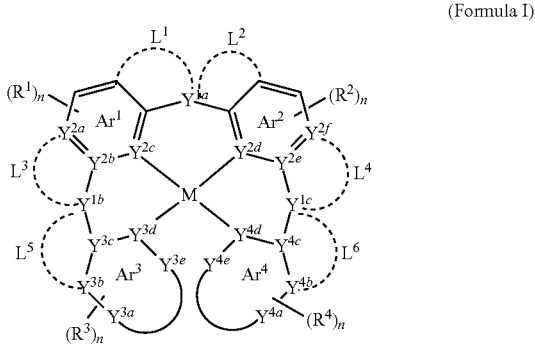

(Formula I)

wherein:
M is Pt, Pd, or Ir;
$R^1$, $R^2$, $R^3$, $R^4$, $R^8$, $R^9$, and $R^{10}$ each independently represents hydrogen, halogen, hydroxy, amino, nitro, thiol, substituted or unsubstituted $C_1$-$C_4$ alkyl, substituted or unsubstituted alkoxy, or substituted or unsubstituted aryl;

$Y^{1a}$ represents O, S, S=O, O=S=O, Se, Se=O, O=Se=O, N, $NR^{5a}$, P, $PR^{5a}$, As, $AsR^{5a}$, O=$NR^{5a}$, O=$PR^{5a}$, O=$AsR^{5a}$, B, $BR^{5a}$, $SiR^{5a}$, $SiR^{5a}R^{5b}$, $CR^{5a}$, or $CR^{5a}R^{5b}$;

$Y^{1b}$ and $Y^{1c}$ each independently represents O, S, S=O, O=S=O, Se, Se=O, O=Se=O, N, $NR^{5a}$, P, $PR^{5a}$, As, $AsR^{5a}$, O=$NR^{5a}$, O=$PR^{5a}$, O=$AsR^{5a}$, B, $BR^{5a}$, $SiR^{5a}$, $SiR^{5a}R^{5b}$, $CR^{5a}$, $CR^{5a}R^{5b}$, or a single bond, wherein if $Y^{1b}$ represents a single bond, $Y^{2e}$ and $Y^{4c}$ are directly linked by a single bond, and if $Y^{1c}$ represents a single bond, $Y^{2b}$ and $Y^{3c}$ are directly linked by a single bond;

$Y^{2a}$, $Y^{2b}$, $Y^{2c}$, $Y^{2d}$, $Y^{2e}$, and $Y^{2f}$ each independently represents C or N;

$R^{5a}$, $R^{5b}$, and $R^{5c}$ each independently represents substituted or unsubstituted $C_1$-$C_4$ alkyl or substituted or unsubstituted aryl;

$R^{6a}$, $R^{6b}$, and $R^{6c}$ each independently represents substituted or unsubstituted $C_1$-$C_4$ alkyl or substituted or unsubstituted aryl;

$R^{7a}$, $R^{7b}$, and $R^{7c}$ each independently represents substituted or unsubstituted $C_1$-$C_4$ alkyl or substituted or unsubstituted aryl;

$Y^{3a}$, $Y^{3b}$, $Y^{3c}$, $Y^{3d}$, and $Y^{3e}$ each independently represents C, N, Si, O, or S;

$Y^{4a}$, $Y^{4b}$, $Y^{4c}$, $Y^{4d}$, and $Y^{4e}$ each independently represents C, N, Si, O, or S;

each of $L^1$, $L^2$, $L^3$, $L^4$, $L^5$, and $L^6$ is independently absent or represents a linking group;

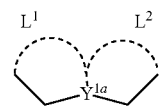

represents one of the following:

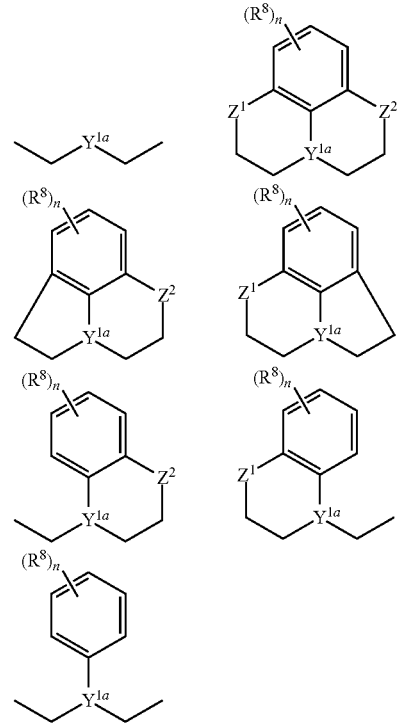

wherein $Z^1$, $Z^2$ independently represents O, S, S=O, O=S=O, Se, Se=O, O=Se=O, $NR^{5a}$, $PR^{5a}$, $AsR^{5a}$, O=$NR^{5a}$, O=$PR^{5a}$, O=$AsR^{5a}$, $BR^{5a}$, $SiR^{5a}R^{5b}$, or $CR^{5a}R^{5b}$;

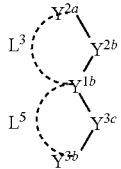

represents one of the following:

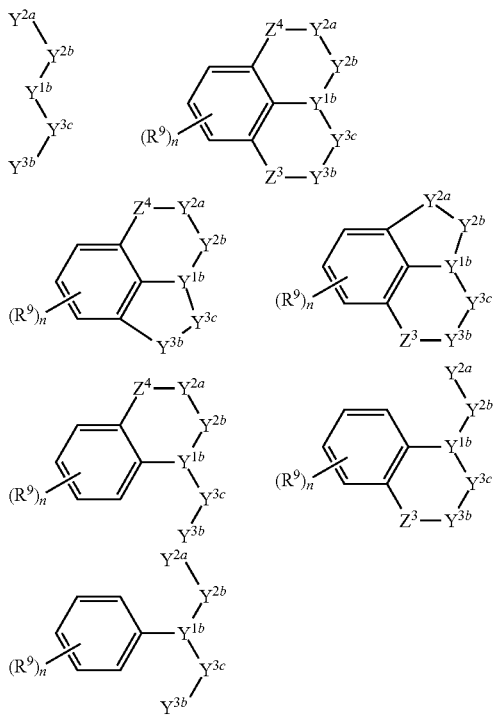

wherein $Z^3$ and $Z^4$ each independently represents O, S, S=O, O=S=O, Se, Se=O, O=Se=O, $NR^{6a}$, $PR^{6a}$, $AsR^{6a}$, O=$NR^{6a}$, O=$PR^{6a}$, O=$AsR^{6a}$, $BR^{6a}$, $SiR^{6a}R^{6b}$, or $CR^{6a}R^{6b}$;

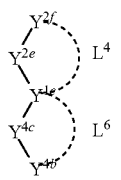

represents one of the following:

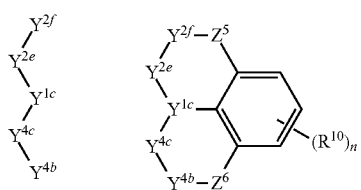

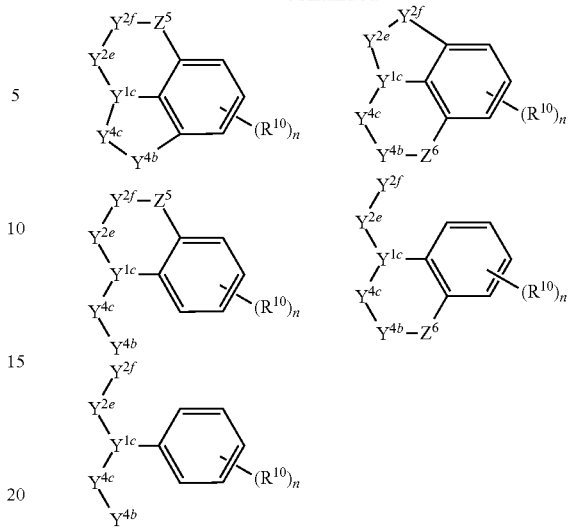

wherein $Z^5$ and $Z^6$ each independently represents O, S, S=O, O=S=O, Se, Se=O, O=Se=O, $NR^{7a}$, $PR^{7a}$, $AsR^{7a}$, O=$NR^{7a}$, O=$PR^{7a}$, O=$AsR^{7a}$, $BR^{7a}$, $SiR^{7a}R^{7b}$, or $CR^{7a}R^{7b}$;

$Ar^3$ and $Ar^4$ each independently represents a substituted or unsubstituted 5-membered ring or a 6-membered aromatic ring; and n is 0, 1, 2, 3, 4, or 5.

In some implementations, wherein M is Pt(II) or Pd(II).

In some implementations, $R^2$, $R^3$, $R^4$, $R^8$, $R^9$, and $R^{10}$ each independently represents hydrogen, halogen, hydroxy, amino, substituted or unsubstituted $C_1$-$C_4$ alkyl, or substituted or unsubstituted alkoxy. In some implementations, $R^2$, $R^3$, $R^4$, $R^8$, $R^9$, and $R^{10}$ each independently represents hydrogen, halogen, hydroxy, or substituted or unsubstituted $C_1$-$C_4$ alkyl. In some implementations, $R^2$, $R^3$, $R^4$, $R^8$, $R^9$, and $R^{10}$ each independently represents hydrogen or substituted or unsubstituted $C_1$-$C_4$ alkyl.

In some implementations, $Y^{1a}$ represents O, S, S=O, O=S=O, Se, N, $NR^{5a}$, P, $PR^{5a}$, As, $AsR^{5a}$, B, $BR^{5a}$, $SiR^{5a}$, $SiR^{5a}R^{5b}$, $CR^{5a}$, or $CR^{5a}R^{5b}$. In some implementations, $Y^{1a}$ represents O, S, N, $NR^{5a}$, P, $PR^{5a}$, $SiR^{5a}$, $SiR^{5a}R^{5b}$, $CR^{5a}$, or $CR^{5a}R^{5b}$. In some implementations, $Y^{1a}$ represents O, S, $NR^{5a}$, $PR^{5a}$, $SiR^{5a}R^{5b}$, or $CR^{5a}R^{5b}$.

In some implementations, $Y^{1b}$ and $Y^{1c}$ each independently represents O, S, S=O, O=S=O, Se, N, $NR^{5a}$, P, $PR^{5a}$, As, $AsR^{5a}$, B, $BR^{5a}$, $SiR^{5a}$, $SiR^{5a}R^{5b}$, $CR^{5a}$, $CR^{5a}R^{5b}$, or a single bond, wherein if $Y^{1b}$ represents a single bond, $Y^{2e}$ and $Y^{4c}$ are directly linked by a single bond, and if $Y^{1c}$ represents a single bond, $Y^{2b}$ and $Y^{3c}$ are directly linked by a single bond.

In some implementations, $Y^{1b}$ and $Y^{1c}$ each independently represents O, S, N, $NR^{5a}$, P, $PR^{5a}$, $SiR^{5a}$, $SiR^{5a}R^{5b}$, $CR^{5a}$, $CR^{5a}R^{5b}$, or a single bond, wherein if $Y^{1b}$ represents a single bond, $Y^{2e}$ and $Y^{4c}$ are directly linked by a single bond, and if $Y^{1c}$ represents a single bond, $Y^{2b}$ and $Y^{3c}$ are directly linked by a single bond.

In some implementations, $Y^{1b}$ and $Y^{1c}$ each independently represents N, P, $SiR^{5a}$, or $CR^{5a}$, or a single bond, wherein if $Y^{1b}$ represents a single bond, $Y^{2e}$ and $Y^{4c}$ are directly linked by a single bond, and if $Y^{1c}$ represents a single bond, $Y^{2b}$ and $Y^{3c}$ are directly linked by a single bond.

In some implementations, $Y^{2a}$, $Y^{2b}$, $Y^{2c}$, $Y^{2d}$, $Y^{2e}$, and $Y^{2f}$ each independently represents C. In some implementations, $Y^{2a}$, $Y^{2b}$, $Y^{2c}$, $Y^{2d}$, $Y^{2e}$, and $Y^{2f}$ each independently represents N.

In some implementations, $R^{5a}$, $R^{5b}$, and $R^{5c}$ each independently represents substituted or unsubstituted $C_1$-$C_4$ alkyl or substituted or unsubstituted aryl. In some implementations, $R^{5a}$, $R^{5b}$, and $R^{5c}$ each independently represents substituted or unsubstituted aryl.

In some implementations, $R^{6a}$, $R^{6b}$, and $R^{6c}$ each independently represents substituted or unsubstituted $C_1$-$C_4$ alkyl. In some implementations, $R^{6a}$, $R^{6b}$, and $R^{6c}$ each independently represents or substituted or unsubstituted aryl.

In some implementations, $R^{7a}$, $R^{7b}$, and $R^{7c}$ each independently represents substituted or unsubstituted $C_1$-$C_4$ alkyl. In some implementations, $R^{7a}$, $R^{7b}$, and $R^{7c}$ each independently represents or substituted or unsubstituted aryl.

In some implementations, $Y^{3a}$, $Y^{3b}$, $Y^{3c}$, $Y^{3d}$, and $Y^{3e}$ each independently represents C or Si. In some implementations, $Y^{3a}$, $Y^{3b}$, $Y^{3c}$, $Y^{3d}$, and $Y^{3e}$ each independently represents O or S. In some implementations, $Y^{3a}$, $Y^{3b}$, $Y^{3c}$, $Y^{3d}$, and $Y^{3e}$ each independently represents C or N.

In some implementations, $Y^{4a}$, $Y^{4b}$, $Y^{4c}$, $Y^{4d}$, and $Y^{4e}$ each independently represents C or Si. In some implementations, $Y^{4a}$, $Y^{4b}$, $Y^{4c}$, $Y^{4d}$, and $Y^{4e}$ each independently represents O or S. In some implementations, $Y^{4a}$, $Y^{4b}$, $Y^{4c}$, $Y^{4d}$, and $Y^{4e}$ each independently represents C or N.

In some implementations, the organometallic complex is represented by Formula II:

(Formula II)

wherein:

M is Pt, Pd, or Ir;

$R^1$, $R^2$, $R^3$, and $R^4$ each independently represents hydrogen, halogen, hydroxy, amino, nitro, thiol, substituted or unsubstituted $C_1$-$C_4$ alkyl, substituted or unsubstituted alkoxy, or substituted or unsubstituted aryl;

$Y^{1a}$ represents O, S, S=O, O=S=O, Se, Se=O, O=Se=O, $NR^{5a}$, $PR^{5a}$, $AsR^{5a}$, O=$NR^{5a}$, O=$PR^{5a}$, O=$AsR^{5a}$, $BR^{5a}$, $SiR^{5a}R^{5b}$, or $CR^{5a}R^{5b}$;

$Y^{2a}$, $Y^{2c}$, $Y^{2d}$, and $Y^{2f}$ each independently represents C or N;

$R^{5a}$, $R^{5b}$, and $R^{5c}$ each independently represents substituted or unsubstituted $C_1$-$C_4$ alkyl or substituted or unsubstituted aryl;

$Y^{3a}$, $Y^{3b}$, $Y^{3d}$, and $Y^{3e}$ each independently represents C, N, or Si;

$Y^{4a}$, $Y^{4b}$, $Y^{4d}$, and $Y^{4e}$ each independently represents C, N, or Si;

n is 0, 1, 2, 3, or 4.

In some implementations, the organometallic complex is represented by Formula II wherein:

M is Pt or Pd;

$R^1$, $R^2$, $R^3$, and $R^4$ each independently represents hydrogen, halogen, hydroxy, amino, nitro, thiol, substituted or unsubstituted $C_1$-$C_4$ alkyl, substituted or unsubstituted alkoxy, or substituted or unsubstituted aryl;

$Y^{1a}$ represents O, S, $NR^{5a}$, $PR^{5a}$, $SiR^{5a}R^{5b}$, or $CR^{5a}R^{5b}$;

$Y^{2a}$, $Y^{2c}$, $Y^{2d}$, and $Y^{2f}$ each independently represents C or N;

$R^{5a}$, $R^{5b}$, and $R^{5c}$ each independently represents substituted or unsubstituted $C_1$-$C_4$ alkyl or substituted or unsubstituted aryl;

$Y^{3a}$, $Y^{3b}$, $Y^{3d}$, and $Y^{3e}$ each independently represents C or N;

$Y^{4a}$, $Y^{4b}$, $Y^{4d}$, and $Y^{4e}$ each independently represents C or N;

n is 0, 1, or 2.

In some implementations, the organometallic complex is represented by Formula II wherein M is Pt or Pd.

In some implementations, the organometallic complex is represented by Formula II wherein $R^1$, $R^2$, $R^3$, and $R^4$ each independently represents hydrogen, halogen, hydroxy, amino, substituted or unsubstituted $C_1$-$C_4$ alkyl, substituted or unsubstituted alkoxy, or substituted or unsubstituted aryl. In some implementations, the organometallic complex is represented by Formula II wherein $R^1$, $R^2$, $R^3$, and $R^4$ each independently represents hydrogen, halogen, hydroxy, amino, substituted or unsubstituted $C_1$-$C_4$ alkyl. In some implementations, the organometallic complex is represented by Formula II wherein $R^1$, $R^2$, $R^3$, and $R^4$ each independently represents hydrogen or substituted or unsubstituted $C_1$-$C_4$ alkyl.

In some implementations, the organometallic complex is represented by Formula II wherein $Y^{1a}$ represents O, S, S=O, O=S=O, Se, $NR^{5a}$, $PR^{5a}$, $AsR^{5a}$, $BR^{5a}$, $SiR^{5a}R^{5b}$, or $CR^{5a}R^{5b}$. In some implementations, the organometallic complex is represented by Formula II wherein $Y^{1a}$ represents O, S, $NR^{5a}$, $PR^{5a}$, $SiR^{5a}R^{5}$b, or $CR^{5a}R^{5b}$. In some implementations, the organometallic complex is represented by Formula II wherein $Y^{1a}$ represents O, S, $NR^{5a}$, $SiR^{5a}R^{5b}$, or $CR^{5a}R^{5b}$. In some implementations, the organometallic complex is represented by Formula II wherein $Y^{1a}$ represents O, $NR^{5a}$, or $CR^{5a}R^{5b}$.

In some implementations, the organometallic complex is represented by Formula II wherein $Y^{2a}$, $Y^{2c}$, $Y^{2d}$, and $Y^{2f}$ each independently represents C. In some implementations, the organometallic complex is represented by Formula II wherein $Y^{2a}$, $Y^{2c}$, $Y^{2d}$, and $Y^{2f}$ each independently represents N.

In some implementations, the organometallic complex is represented by Formula II wherein $R^{5a}$, $R^{5b}$, and $R^{5c}$ each independently represents substituted or unsubstituted $C_1$-$C_4$ alkyl. In some implementations, the organometallic complex is represented by Formula II wherein $R^{5a}$, $R^{5b}$, and $R^{5c}$ each independently represents substituted or unsubstituted aryl.

In some implementations, the organometallic complex is represented by Formula II wherein $Y^{3a}$, $Y^{3b}$, $Y^{3d}$, and $Y^{3e}$ each independently represents C or N. In some implementations, the organometallic complex is represented by Formula II wherein $Y^{3a}$, $Y^{3b}$, $Y^{3d}$, and $Y^{3e}$ each independently represents C or Si.

In some implementations, the organometallic complex is represented by Formula II wherein $Y^{4a}$, $Y^{4b}$, $Y^{4d}$, and $Y^{4e}$ each independently represents C or N. In some implementations, the organometallic complex is represented by Formula II wherein $Y^{4a}$, $Y^{4b}$, $Y^{4d}$, and $Y^{4e}$ each independently represents C or Si.

In some implementations, the organometallic complex is represented by Formula II wherein n is 0, 1, 2, or 3. In some implementations, the organometallic complex is represented by Formula II wherein n is 1. In some implementations, the organometallic complex is represented by Formula II wherein n is 0.

In some implementations, the organometallic complex is represented by Formula III:

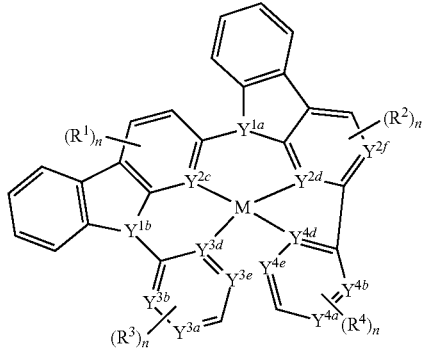

(Formula III)

wherein:

M is Pt, Pd, or Ir;

$R^1$, $R^2$, $R^3$, and $R^4$ each independently represents hydrogen, halogen, hydroxy, amino, nitro, thiol, substituted or unsubstituted $C_1$-$C_4$ alkyl, substituted or unsubstituted alkoxy, or substituted or unsubstituted aryl;

$Y^{1a}$ represents N, P, As, B, $SiR^{5a}$, or $CR^{5a}$;

$Y^{1b}$ represents N, P, As, B, $SiR^{5a}$, or $CR^{5a}$;

$Y^{2c}$, $Y^{2d}$, and $Y^{2f}$ each independently represents C or N;

$R^{5a}$ each independently represents substituted or unsubstituted $C_1$-$C_4$ alkyl or substituted or unsubstituted aryl;

$Y^{3a}$, $Y^{3b}$, $Y^{3d}$, and $Y^{3e}$ each independently represents C, N, or Si;

$Y^{4a}$, $Y^{4b}$, $Y^{4d}$, and $Y^{4e}$ each independently represents C, N, or Si; and n is 0, 1, 2, 3, 4, or 5.

In some implementations, the organometallic complex is represented by Formula III wherein:

M is Pt or Pd;

$R^1$, $R^2$, $R^3$, and $R^4$ each independently represents hydrogen, halogen, hydroxy, amino, nitro, thiol, substituted or unsubstituted $C_1$-$C_4$ alkyl, substituted or unsubstituted alkoxy, or substituted or unsubstituted aryl;

$Y^{1a}$ represents N, P, $SiR^{5a}$, or $CR^{5a}$;

$Y^{1b}$ represents N, P, $SiR^{5a}$, or $CR^{5a}$;

$Y^{2c}$, $Y^{2d}$, $Y^{3d}$, and $Y^{2f}$ each independently represents C or N;

$R^{5a}$ each independently represents substituted or unsubstituted $C_1$-$C_4$ alkyl or substituted or unsubstituted aryl;

$Y^{3a}$, $Y^{3b}$, $Y^{3d}$, and $Y^{3e}$ each independently represents C or N;

$Y^{4a}$, $Y^{4b}$, $Y^{4d}$, and $Y^{4e}$ each independently represents C or N; and n is 0, 1, or 2.

In some implementations, the organometallic complex is represented by Formula III wherein M is Pt or Pd. In some implementations, the organometallic complex is represented by Formula III wherein $R^1$, $R^2$, $R^3$, and $R^4$ each independently represents hydrogen, halogen, hydroxy, amino, substituted or unsubstituted $C_1$-$C_4$ alkyl, substituted or unsubstituted alkoxy, or substituted or unsubstituted aryl. In some implementations, the organometallic complex is represented by Formula III wherein $R^1$, $R^2$, $R^3$, and $R^4$ each independently represents hydrogen, halogen, hydroxy, amino, or substituted or unsubstituted $C_1$-$C_4$ alkyl. In some implementations, the organometallic complex is represented by Formula III wherein $R^1$, $R^2$, $R^3$, and $R^4$ each independently represents hydrogen or substituted or unsubstituted $C_1$-$C_4$ alkyl.

In some implementations, the organometallic complex is represented by Formula III wherein $Y^{1a}$ represents N, P, $SiR^{5a}$, or $CR^{5a}$. In some implementations, the organometallic complex is represented by Formula III wherein $Y^{1a}$ represents N or P. In some implementations, the organometallic complex is represented by Formula III wherein $Y^{1a}$ represents $SiR^{5a}$ or $CR^{5a}$. In some implementations, the organometallic complex is represented by Formula III wherein $Y^{1a}$ represents N or $CR^{5a}$.

In some implementations, the organometallic complex is represented by Formula III wherein $Y^{1b}$ represents N, P, $SiR^{5a}$, or $CR^{5a}$. In some implementations, the organometallic complex is represented by Formula III wherein $Y^{1b}$ represents N or P. In some implementations, the organometallic complex is represented by Formula III wherein $Y^{1b}$ represents $SiR^{5a}$ or $CR^{5a}$. In some implementations, the organometallic complex is represented by Formula III wherein $Y^{1b}$ represents N or $CR^{5a}$.

In some implementations, the organometallic complex is represented by Formula III wherein $Y^{2c}$, $Y^{2d}$, and $Y^{2f}$ each independently represents C. In some implementations, the organometallic complex is represented by Formula III wherein $Y^{2c}$, $Y^{2d}$, and $Y^{2f}$ each independently represents N.

In some implementations, the organometallic complex is represented by Formula III wherein $R^{5a}$ each independently represents substituted or unsubstituted $C_1$-$C_4$ alkyl. In some implementations, the organometallic complex is represented by Formula III wherein $R^{5a}$ each independently represents substituted or unsubstituted aryl.

In some implementations, the organometallic complex is represented by Formula III wherein $Y^{3a}$, $Y^{3b}$, $Y^{3d}$, and $Y^{3e}$ each independently represents C or N. In some implementations, the organometallic complex is represented by Formula III wherein $Y^{3a}$, $Y^{3b}$, $Y^{3d}$, and $Y^{3e}$ each independently represents C or Si. In some implementations, the organometallic complex is represented by Formula III wherein $Y^{3a}$, $Y^{3b}$, $Y^{3d}$, and $Y^{3e}$ each independently represents N.

In some implementations, the organometallic complex is represented by Formula III wherein $Y^{4a}$, $Y^{4b}$, $Y^{4d}$, and $Y^{4e}$ represents C or N. In some implementations, the organometallic complex is represented by Formula III wherein $Y^{4a}$, $Y^{4b}$, $Y^{4d}$, and $Y^{4e}$ each independently represents C or Si. In some implementations, the organometallic complex is represented by Formula III wherein $Y^{4a}$, $Y^{4b}$, $Y^{4d}$, and $Y^{4e}$ each independently represents N.

In some implementations, the organometallic complex is represented by Formula III wherein n is 0, 1, 2, or 3. In some implementations, the organometallic complex is represented by Formula III wherein n is 0. In some implementations, the organometallic complex is represented by Formula III wherein n is 1.

In some implementations, the organometallic complex is represented by Formula IV:

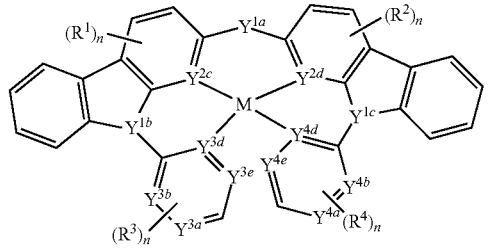

(Formula IV)

wherein:

M is Pt, Pd, or Ir;

$R^1$, $R^2$, $R^3$, or $R^4$ each independently represents hydrogen, halogen, hydroxy, amino, nitro, thiol, substituted or unsubstituted $C_1$-$C_4$ alkyl, substituted or unsubstituted alkoxy, or substituted or unsubstituted aryl;

$Y^{1a}$ represents O, S, S=O, O=S=O, Se, Se=O, O=Se=O, $NR^{5a}$, $PR^{5a}$, $AsR^{5a}$, O=$NR^{5a}$, O=$PR^{5a}$, O=$AsR^{5a}$, $BR^{5a}$, $SiR^{5a}R^{5b}$, or $CR^{5a}R^{5b}$;

$Y^{1b}$ and $Y^{1c}$ each independently represents N, P, As, B, $SiR^{5a}$, or $CR^{5a}$;

$Y^{2c}$ or $Y^{2d}$ each independently represents C or N;

$R^{5a}$ and $R^{5b}$ each independently represents substituted or unsubstituted $C_1$-$C_4$ alkyl or substituted or unsubstituted aryl;

$Y^{3a}$, $Y^{3b}$, $Y^{3d}$, and $Y^{3e}$ each independently represents C, N, or Si;

$Y^{4a}$, $Y^{4b}$, $Y^{4d}$, and $Y^{4e}$ each independently represents C, N, or Si; and n is 0, 1, 2, 3, 4, or 5.

In some implementations, the organometallic complex is represented by Formula IV wherein:

M is Pt or Pd;

$R^1$, $R^2$, $R^3$, or $R^4$ each independently represents hydrogen, halogen, hydroxy, amino, nitro, thiol, substituted or unsubstituted $C_1$-$C_4$ alkyl, substituted or unsubstituted alkoxy, or substituted or unsubstituted aryl;

$Y^{1a}$ represents O, S, $NR^{5a}$, $PR^{5a}$, $SiR^{5a}R^{5b}$, or $CR^{5a}R^{5b}$;

$Y^{1b}$ and $Y^{1c}$ each independently represents N, P, $SiR^{5a}$, or $CR^{5a}$;

$Y^{2c}$ or $Y^{2d}$ each independently represents C or N;

$R^{5a}$ and $R^{5b}$ each independently represents substituted or unsubstituted $C_1$-$C_4$ alkyl or substituted or unsubstituted aryl;

$Y^{3a}$, $Y^{3b}$, $Y^{3d}$, and $Y^{3e}$ each independently represents C or N;

$Y^{4a}$, $Y^{4b}$, $Y^{4d}$, and $Y^{4e}$ each independently represents C or N; and n is 0, 1, or 2.

In some implementations, the organometallic complex is represented by Formula IV wherein M is Pt or Pd.

In some implementations, the organometallic complex is represented by Formula IV wherein $R^1$, $R^2$, $R^3$, or $R^4$ each independently represents hydrogen, halogen, hydroxy, amino, substituted or unsubstituted $C_1$-$C_4$ alkyl, substituted or unsubstituted alkoxy, or substituted or unsubstituted aryl. In some implementations, the organometallic complex is represented by Formula IV wherein $R^1$, $R^2$, $R^3$, or $R^4$ each independently represents hydrogen, halogen, hydroxy, amino, substituted or unsubstituted $C_1$-$C_4$ alkyl. In some implementations, the organometallic complex is represented by Formula IV wherein $R^1$, $R^2$, $R^3$, or $R^4$ each independently represents hydrogen or substituted or unsubstituted $C_1$-$C_4$ alkyl.

In some implementations, the organometallic complex is represented by Formula IV wherein $Y^{1a}$ represents O, S, S=O, O=S=O, Se, Se=O, O=Se=O, $NR^{5a}$, $PR^{5a}$, $AsR^{5a}$, $BR^{5a}$, $SiR^{5a}R^{5b}$, or $CR^{5a}R^{5b}$. In some implementations, the organometallic complex is represented by Formula IV wherein $Y^{1a}$ represents O, S, S=O, O=S=O, $NR^{5a}$, $PR^{5a}$, $BR^{5a}$, $SiR^{5a}R^{5b}$, or $CR^{5a}R^{5b}$. In some implementations, the organometallic complex is represented by Formula IV wherein $Y^{1a}$ represents O, S, $NR^{5a}$, $PR^{5a}$, $SiR^{5a}R^{5b}$, or $CR^{5a}R^{5b}$. In some implementations, the organometallic complex is represented by Formula IV wherein $Y^{1a}$ represents O, $NR^{5a}$, or $CR^{5a}R^{5b}$.

In some implementations, the organometallic complex is represented by Formula IV wherein $Y^{1b}$ and $Y^{1c}$ each independently represents N, P, $SiR^{5a}$, or $CR^{5a}$. In some implementations, the organometallic complex is represented by Formula IV wherein $Y^{1b}$ and $Y^{1c}$ each independently represents N or P. In some implementations, the organometallic complex is represented by Formula IV wherein $Y^{1b}$ and $Y^{1c}$ each independently represents $SiR^{5a}$ or $CR^{5a}$. In some implementations, the organometallic complex is represented by Formula IV wherein $Y^{1b}$ and $Y^{1c}$ each independently represents N or $CR^{5a}$.

In some implementations, the organometallic complex is represented by Formula IV wherein $Y^{2c}$ or $Y^{2d}$ each independently represents C. In some implementations, the organometallic complex is represented by Formula IV wherein $Y^{2c}$ or $Y^{2d}$ each independently represents N.

In some implementations, the organometallic complex is represented by Formula IV wherein $R^{5a}$ and $R^{5b}$ each independently represents substituted or unsubstituted $C_1$-$C_4$ alkyl. In some implementations, the organometallic complex is represented by Formula IV wherein $R^{5a}$ and $R^{5b}$ each independently represents substituted or unsubstituted aryl.

In some implementations, the organometallic complex is represented by Formula IV wherein $Y^{3a}$, $Y^{3b}$, $Y^{3d}$, and $Y^{3e}$ each independently represents C or N. In some implementations, the organometallic complex is represented by Formula IV wherein $Y^{3a}$, $Y^{3b}$, $Y^{3d}$, and $Y^{3e}$ each independently represents C or Si. In some implementations, the organometallic complex is represented by Formula IV wherein $Y^{3a}$, $Y^{3b}$, $Y^{3d}$, and $Y^{3e}$ each independently represents N.

In some implementations, the organometallic complex is represented by Formula IV wherein $Y^{4a}$, $Y^{4b}$, $Y^{4d}$, and $Y^{4e}$ each independently represents C, N, or Si. In some implementations, the organometallic complex is represented by Formula IV wherein $Y^{4a}$, $Y^{4b}$, $Y^{4d}$, and $Y^{4e}$ each independently represents C or N. In some implementations, the organometallic complex is represented by Formula IV wherein $Y^{4a}$, $Y^{4b}$, $Y^{4d}$, and $Y^{4e}$ each independently represents C or Si. In some implementations, the organometallic complex is represented by Formula IV wherein $Y^{4a}$, $Y^{4b}$, $Y^{4d}$, and $Y^{4e}$ each independently represents N.

In some implementations, the organometallic complex is represented by Formula IV wherein n is 0, 1, 2, or 3. In some implementations, the organometallic complex is represented by Formula IV wherein n is 0. In some implementations, the organometallic complex is represented by Formula IV wherein n is 1.

Suitable electron blocking materials include carbazole based host materials, such as those shown below.

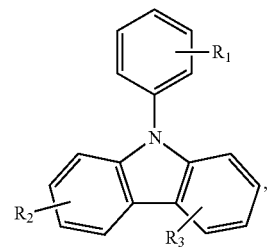

-continued

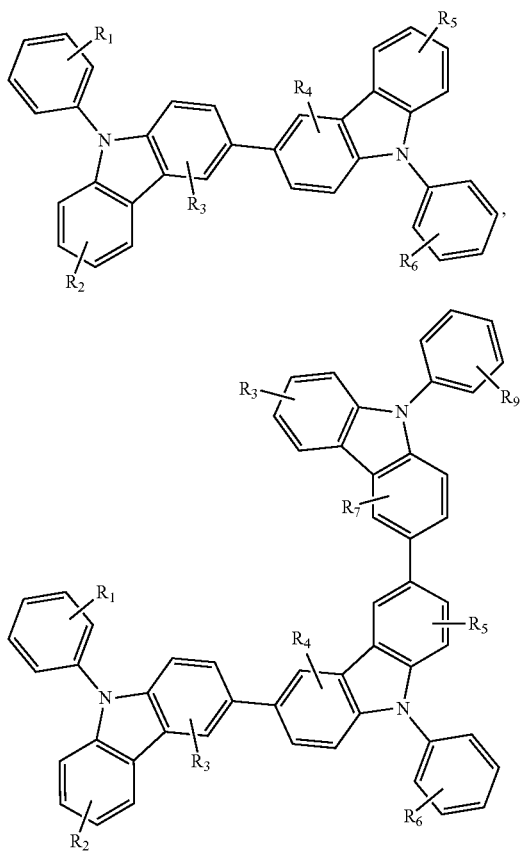

where each of $R^1$-$R^9$ is independently hydrogen, nitro, hydroxyl, halogen, or substituted or unsubstituted amino, thio, alkyl, alkenyl, alkynyl, aryl, heteroaryl, cycloalkane, cycloalkane, heterocyclyl, alkoxy, haloalkyl, arylalkane, or arylalkene.

In some implementations, suitable electron blocking materials include carbazole based host materials, such as those shown below.

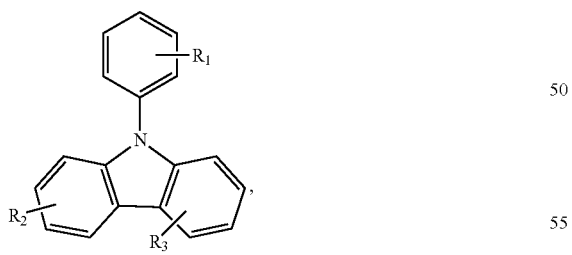

where each of $R^1$-$R^3$ is independently hydrogen, nitro, hydroxyl, halogen, or substituted or unsubstituted amino, thio, alkyl, alkenyl, alkynyl, aryl, heteroaryl, cycloalkane, cycloalkane, heterocyclyl, alkoxy, haloalkyl, arylalkane, or arylalkene.

As described herein, a doped electron blocking material includes a fluorescent dopant. Suitable fluorescent dopants include those shown below.

1. Aromatic Hydrocarbons and their Derivatives

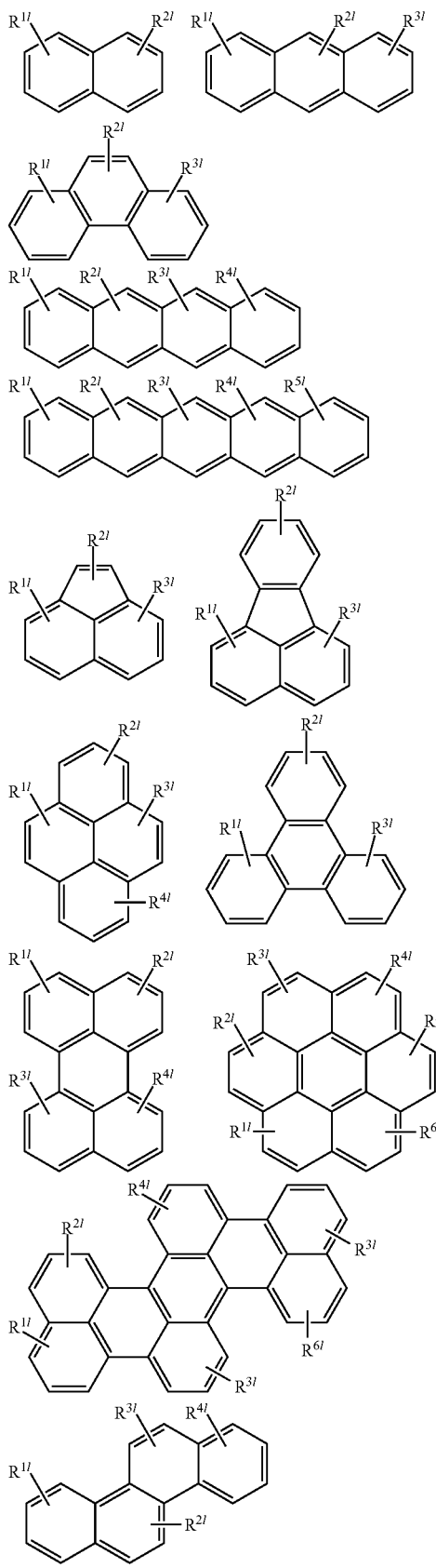

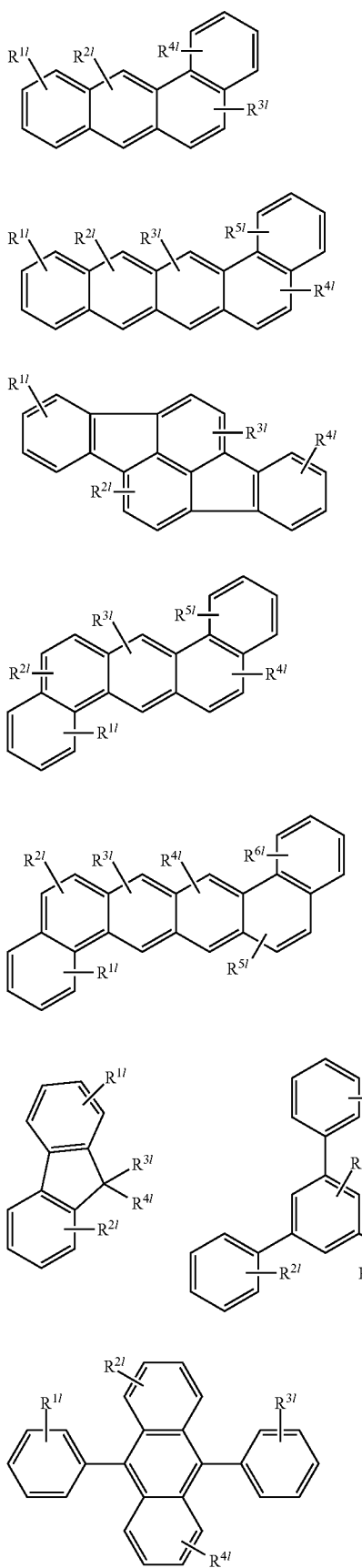
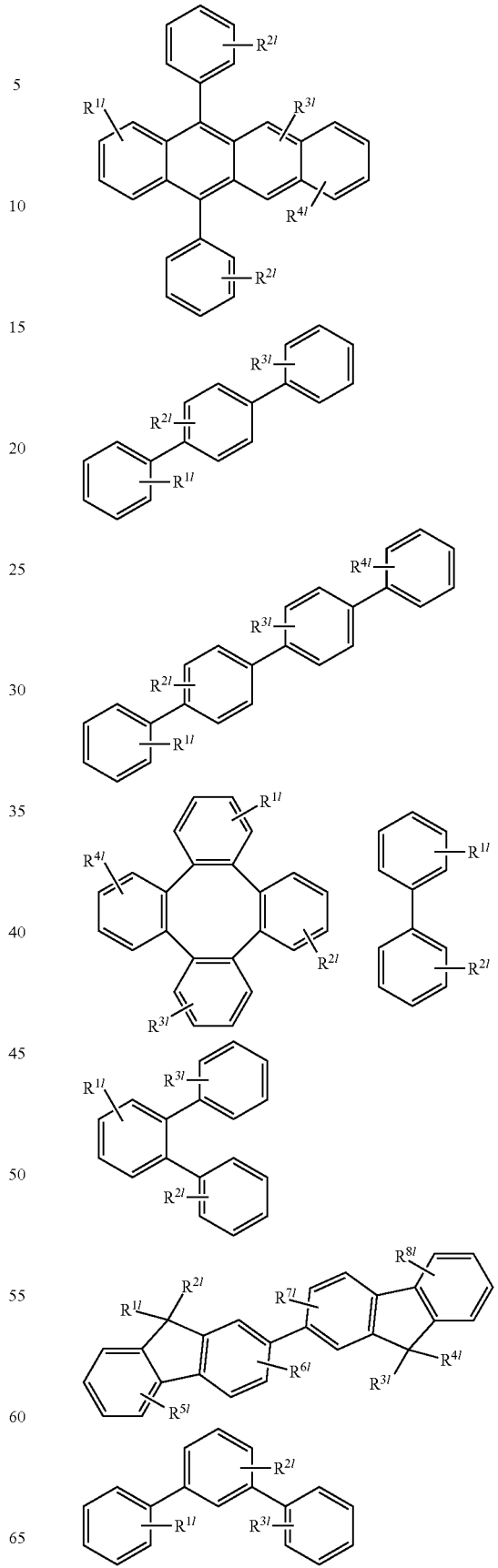

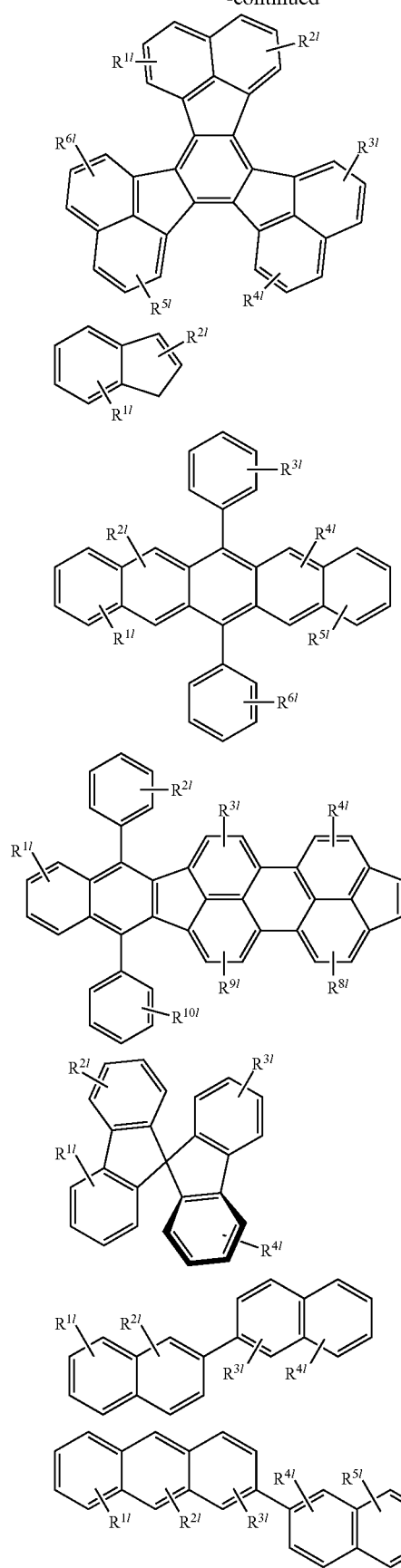
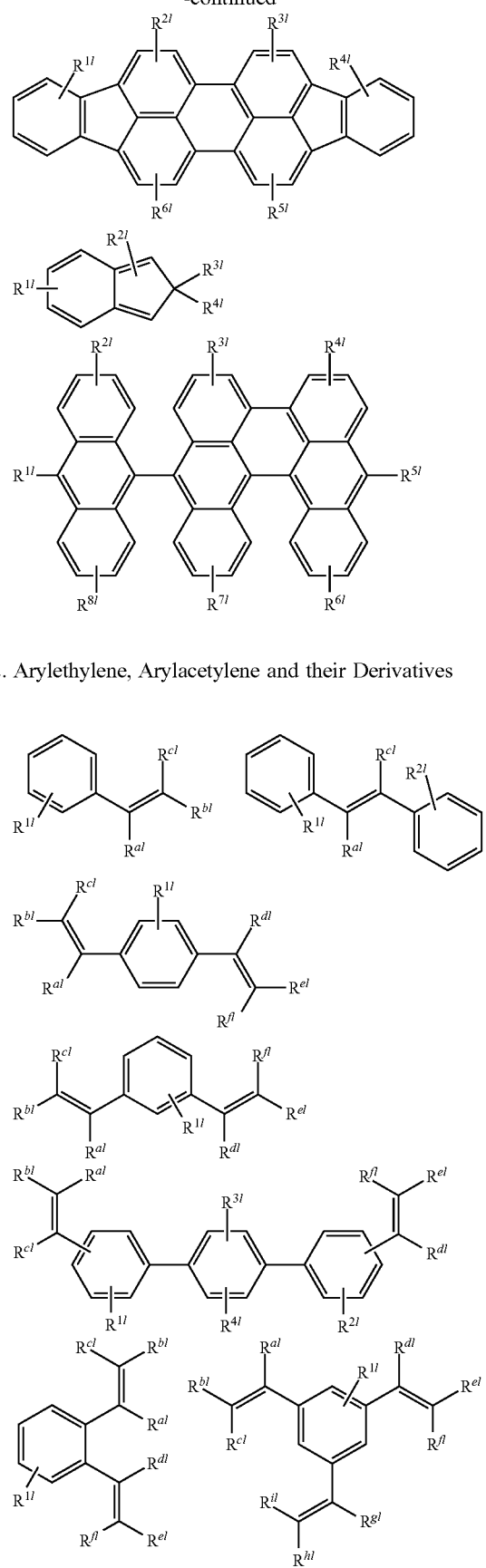
2. Arylethylene, Arylacetylene and their Derivatives

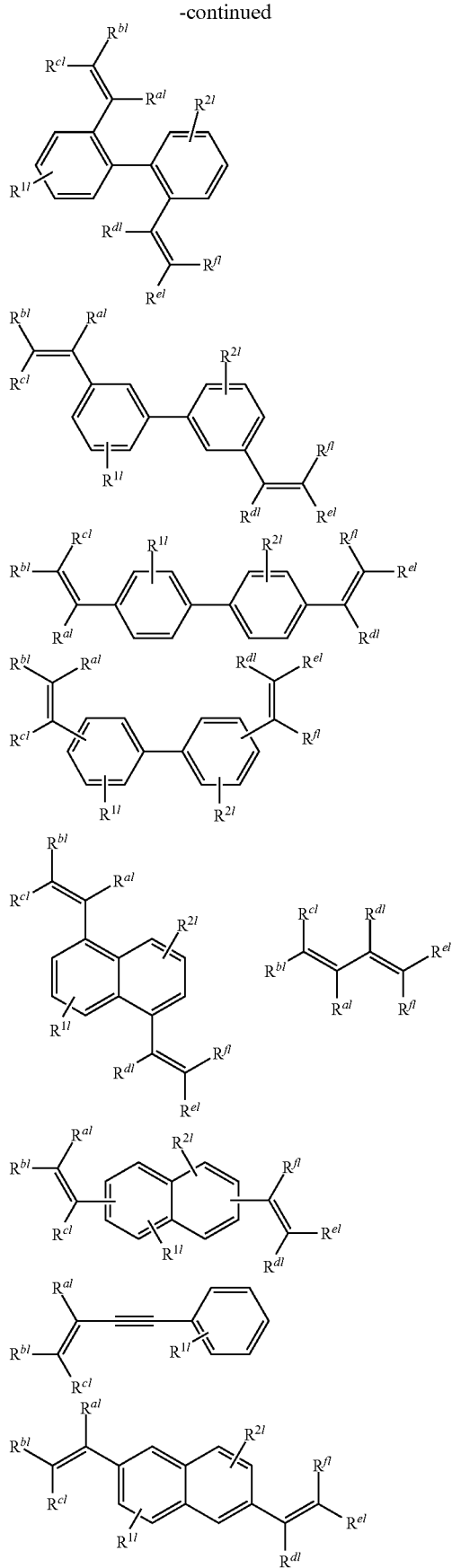

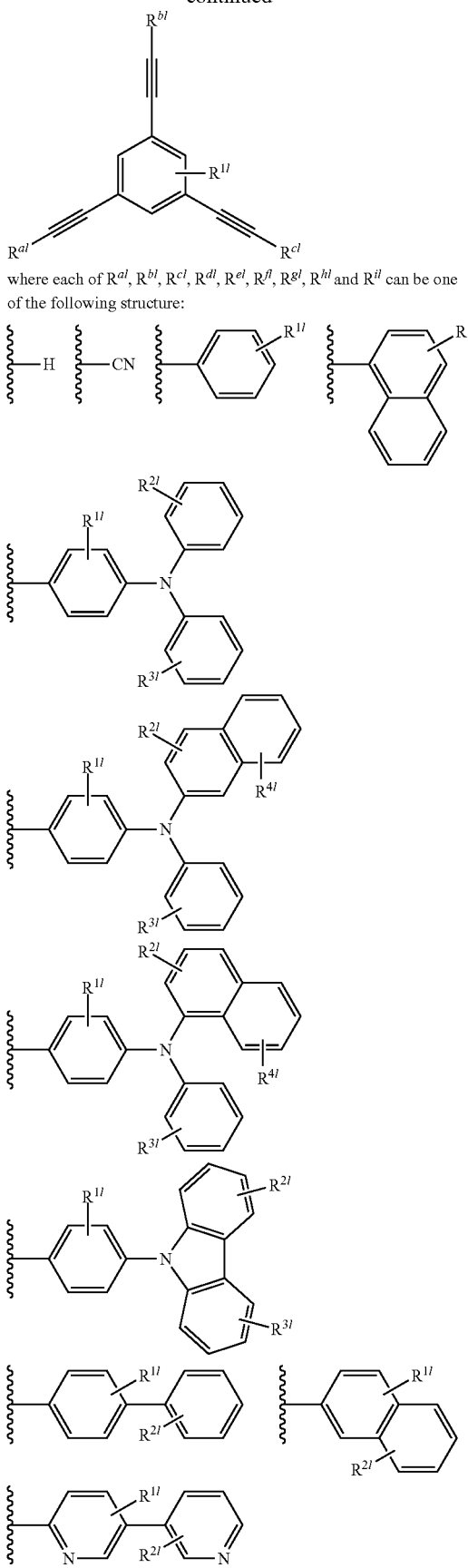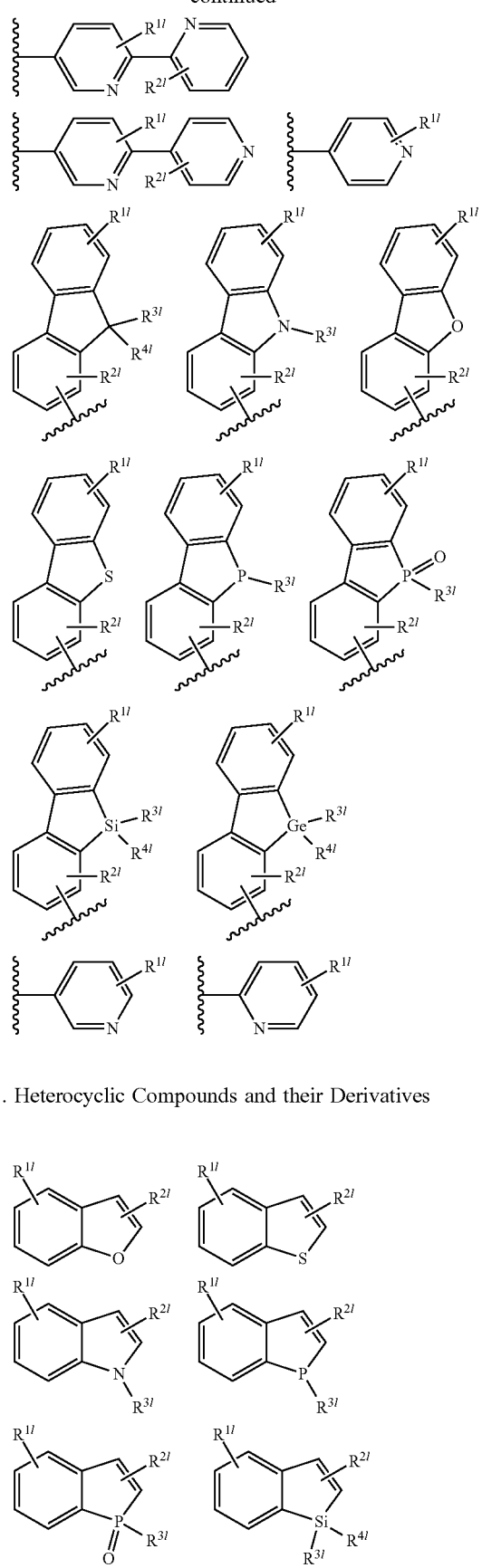
3. Heterocyclic Compounds and their Derivatives

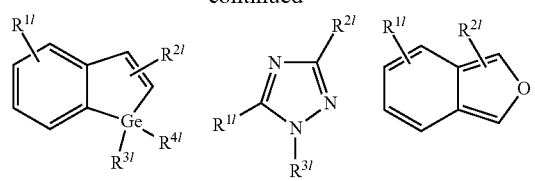
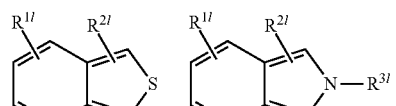
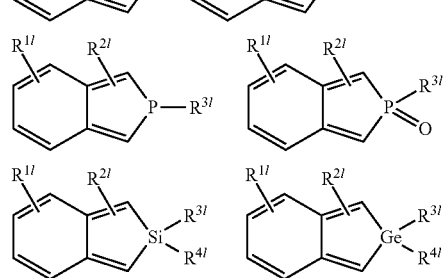
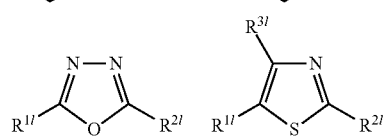
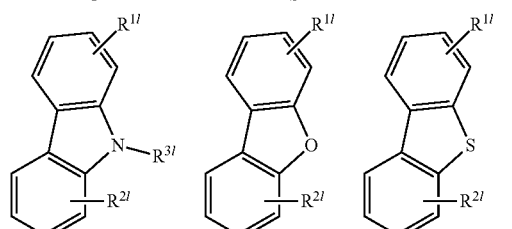
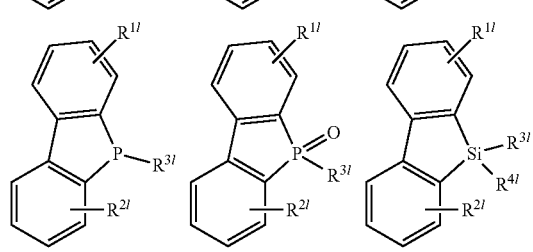
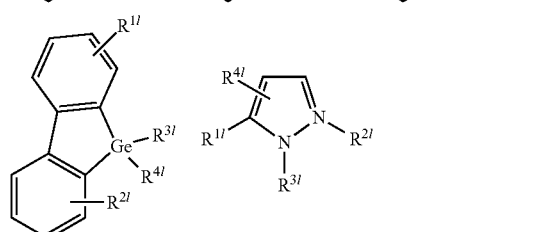
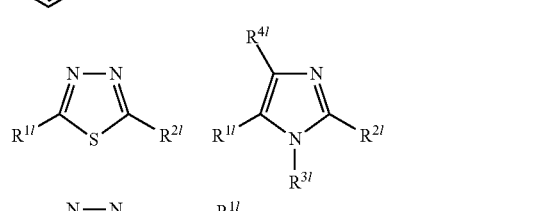
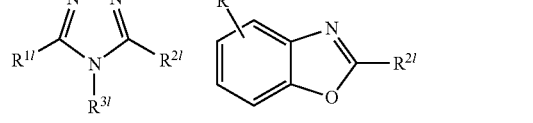
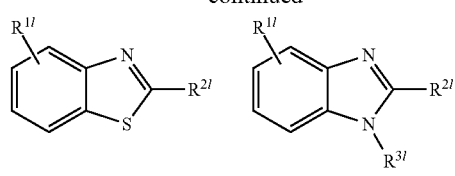
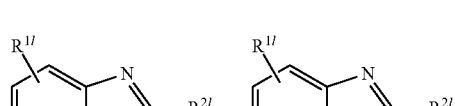
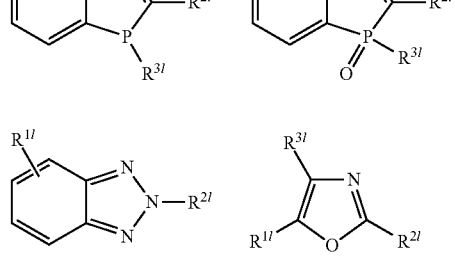
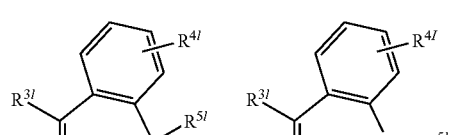
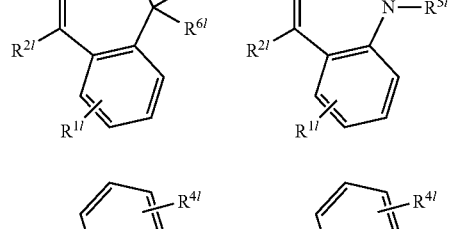
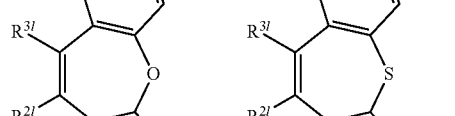
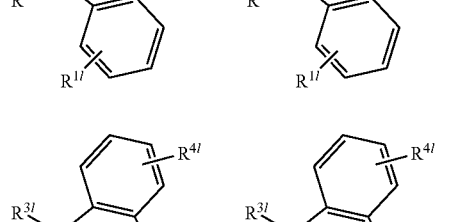
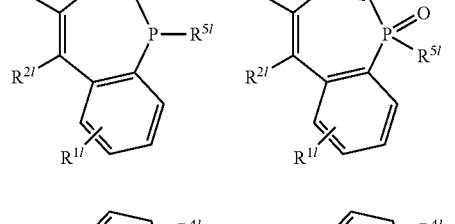
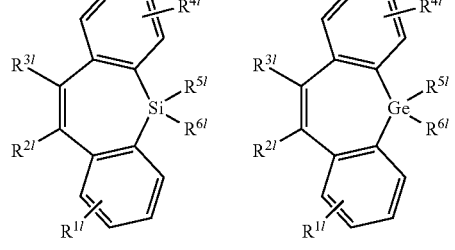

-continued
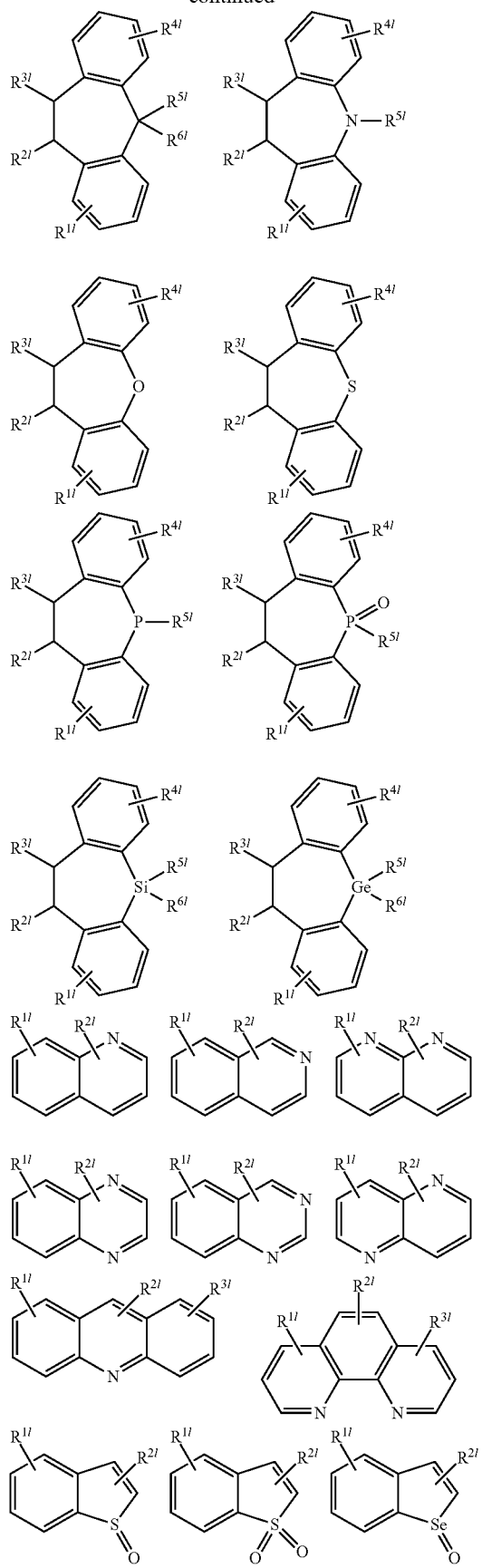
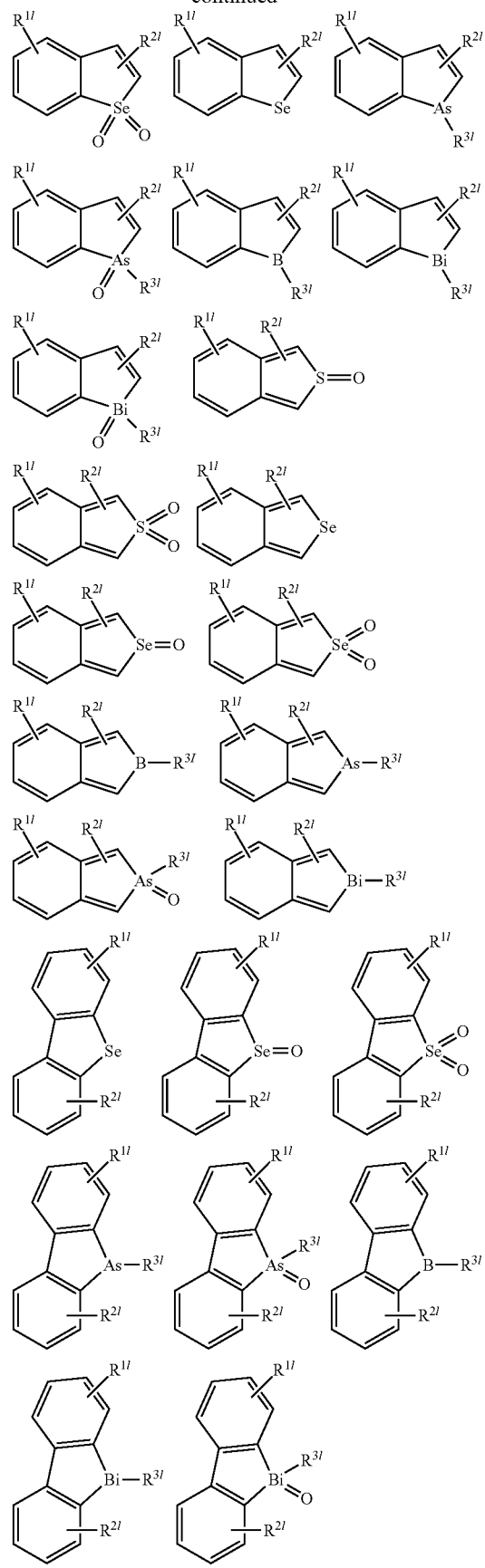

-continued
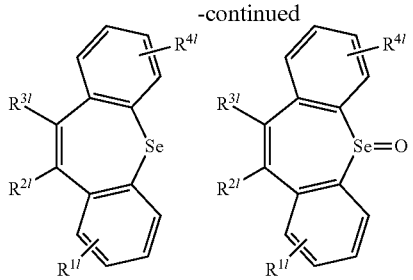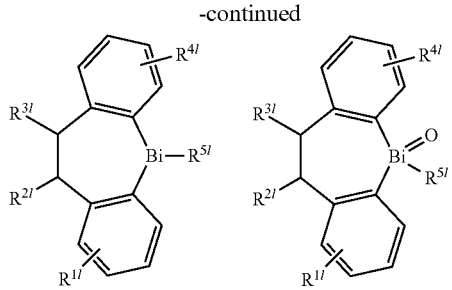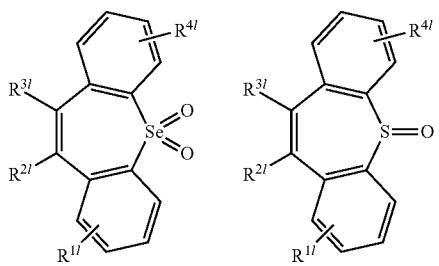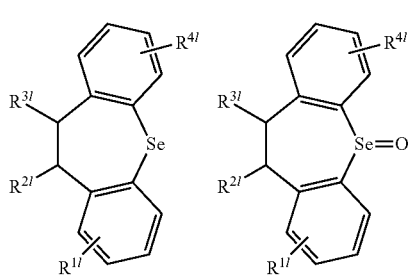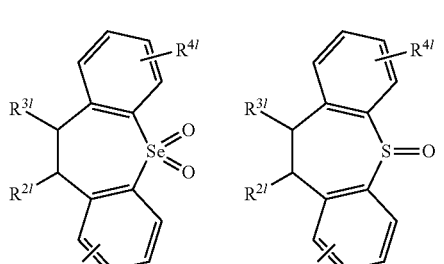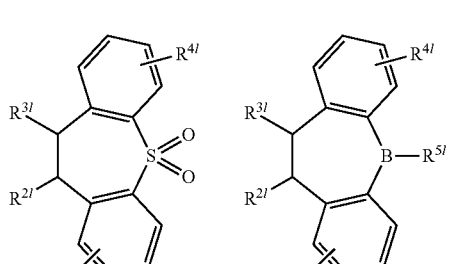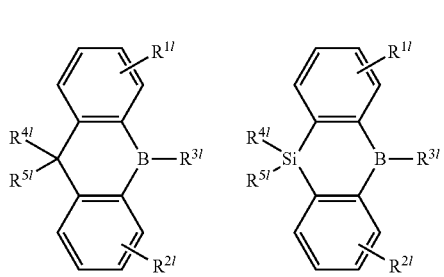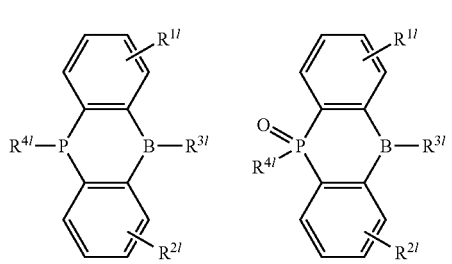

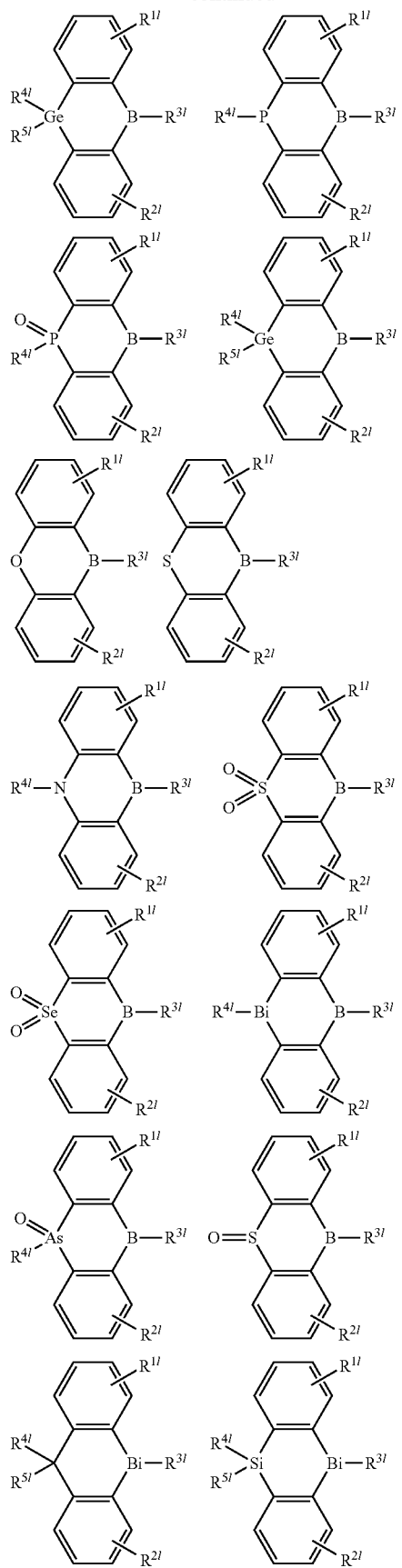
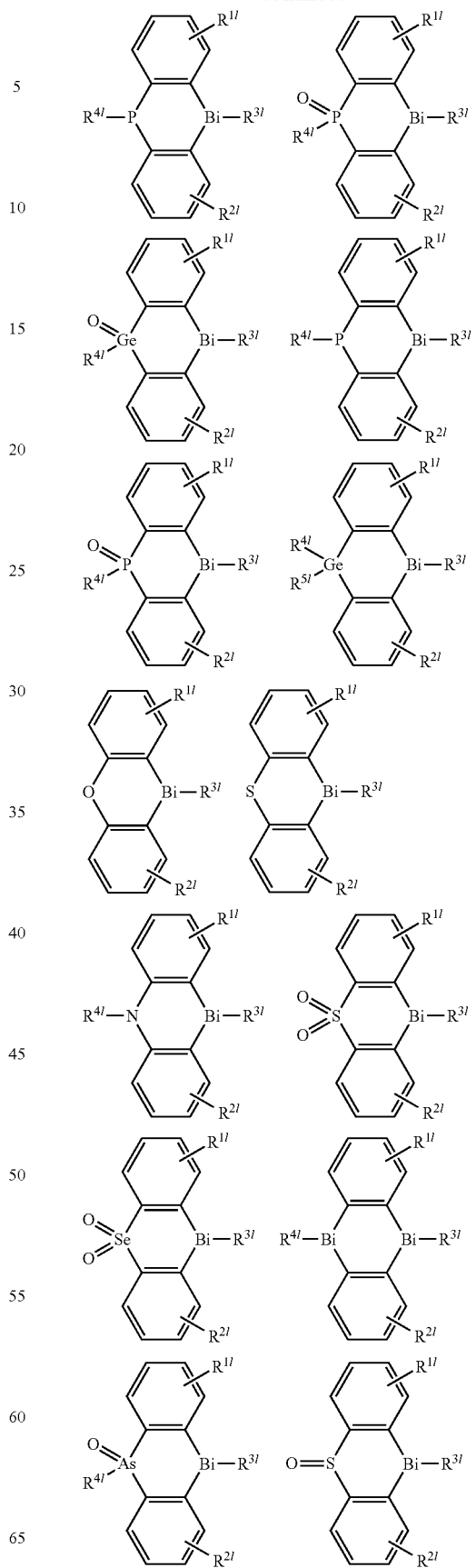

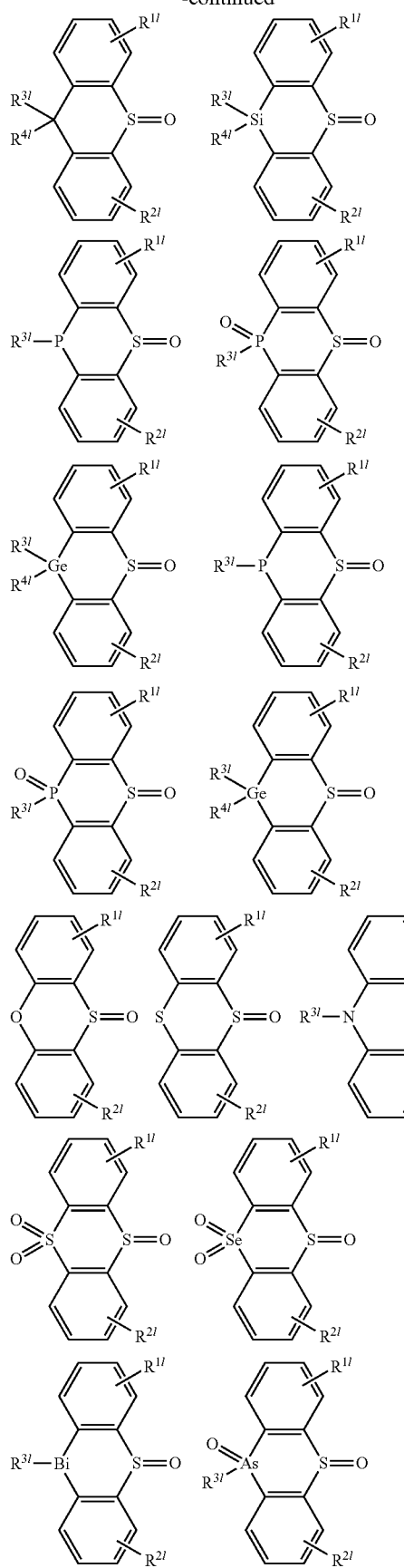
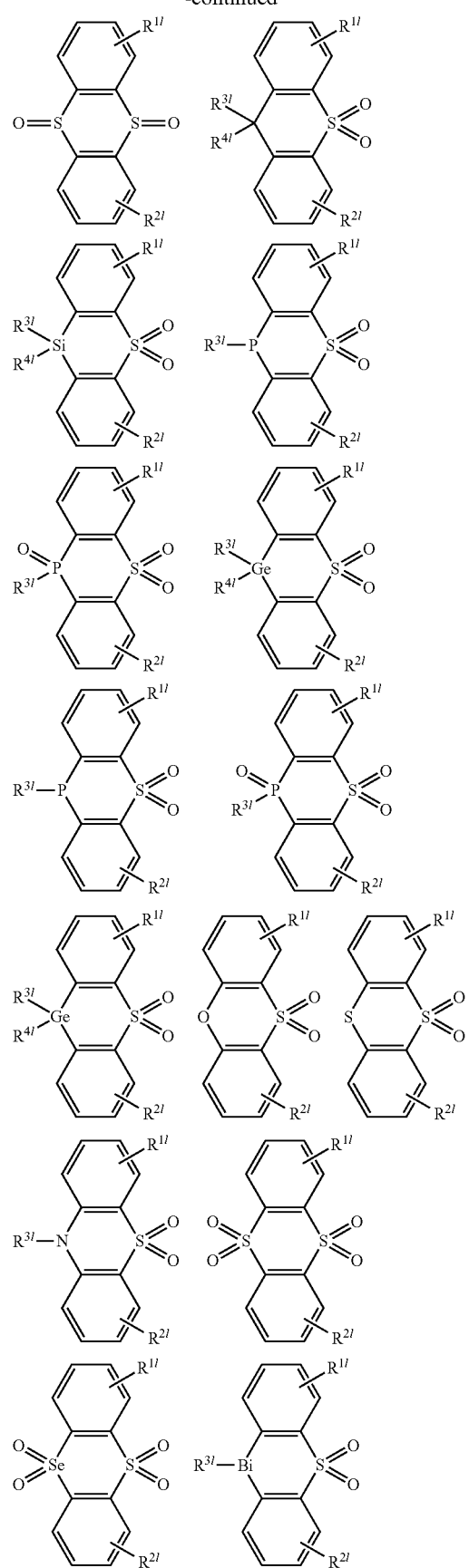

-continued
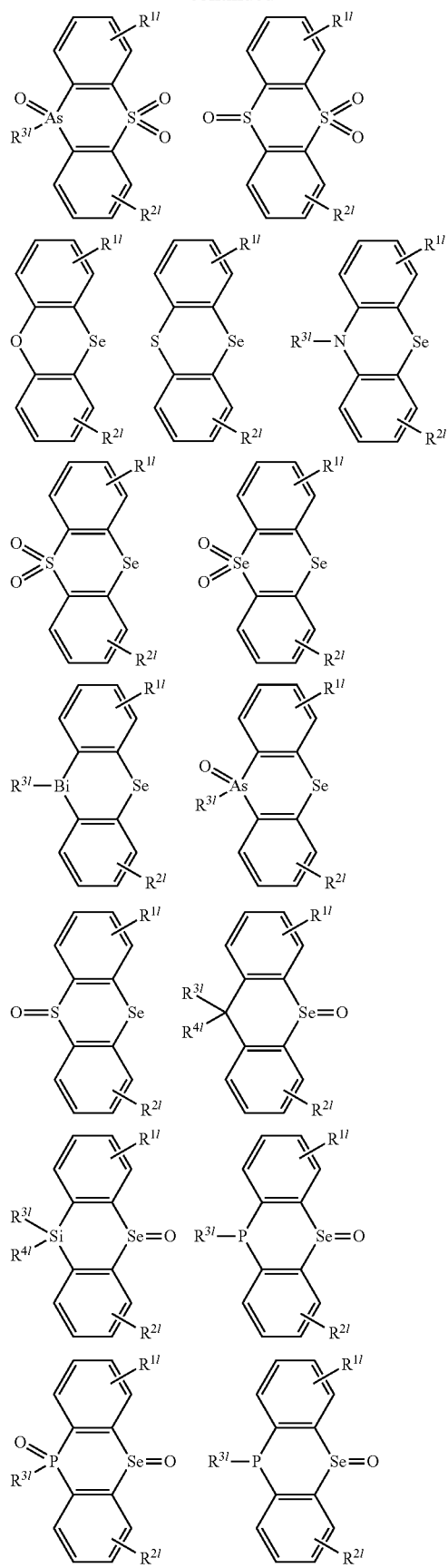
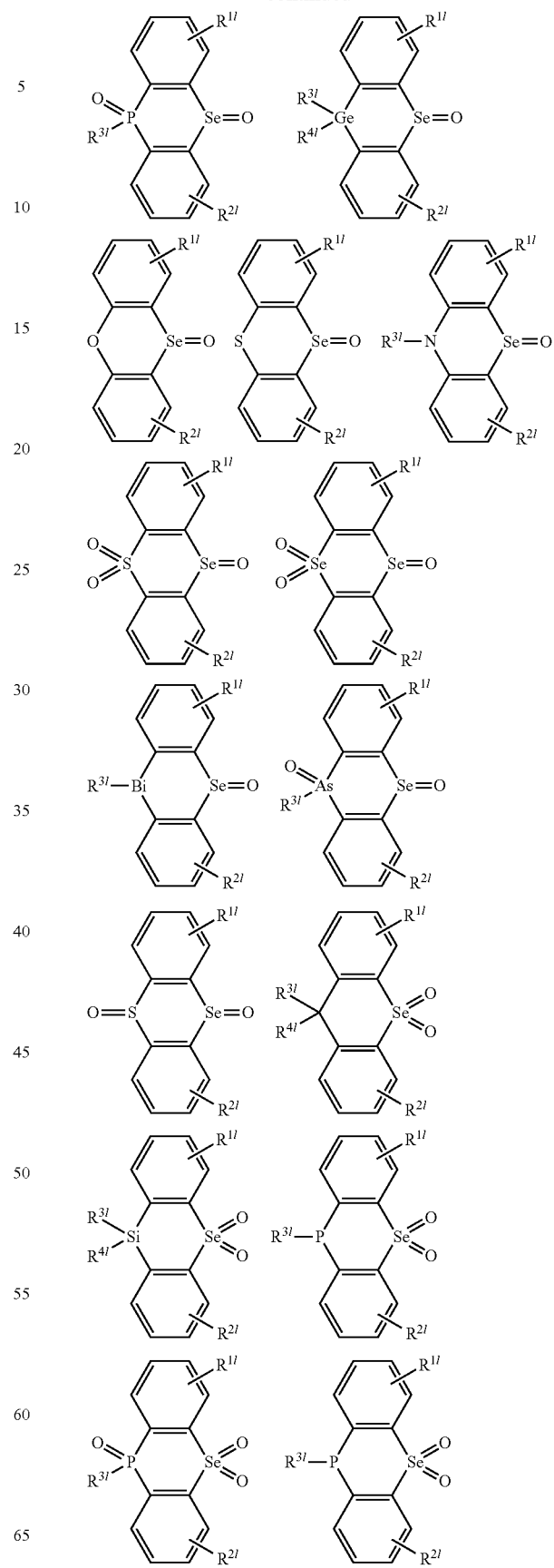

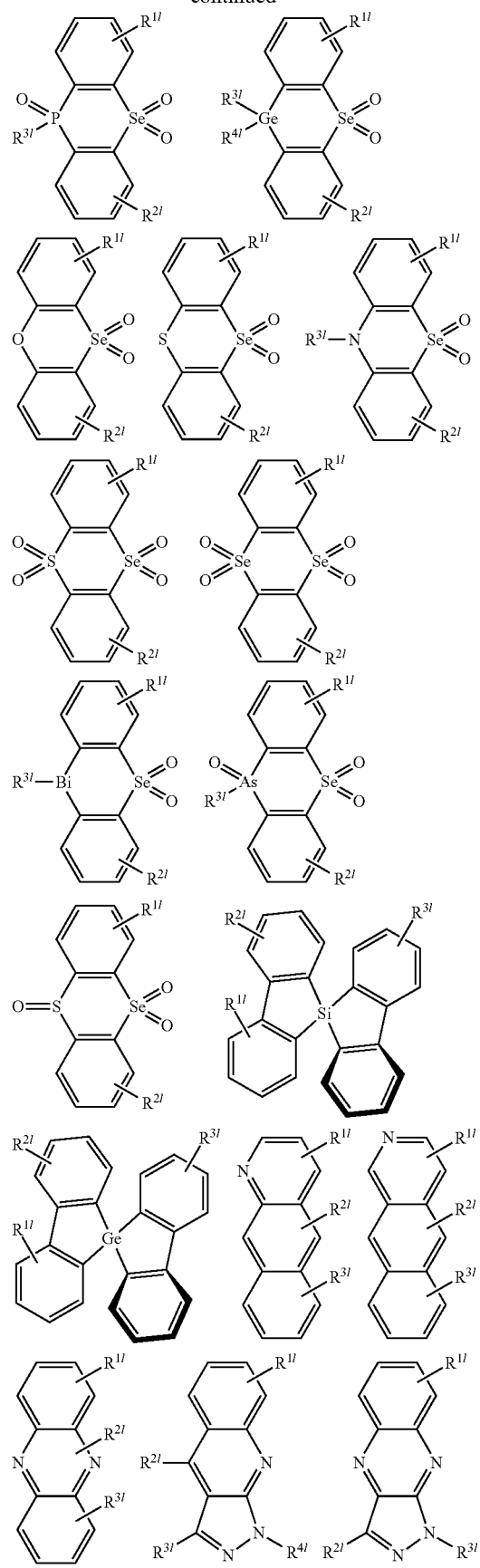
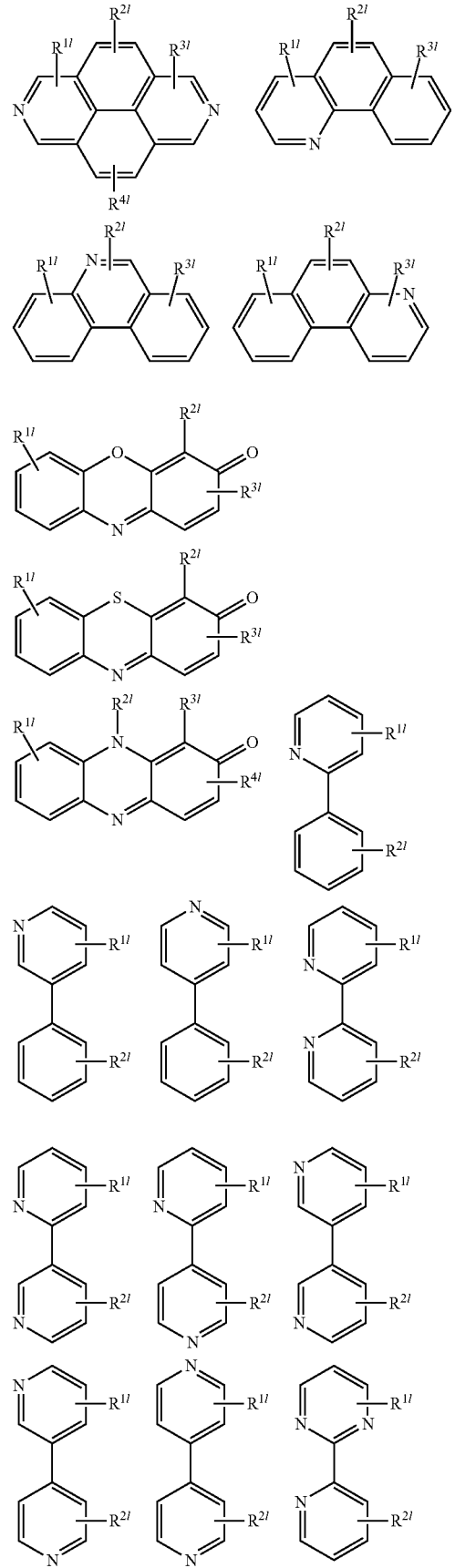

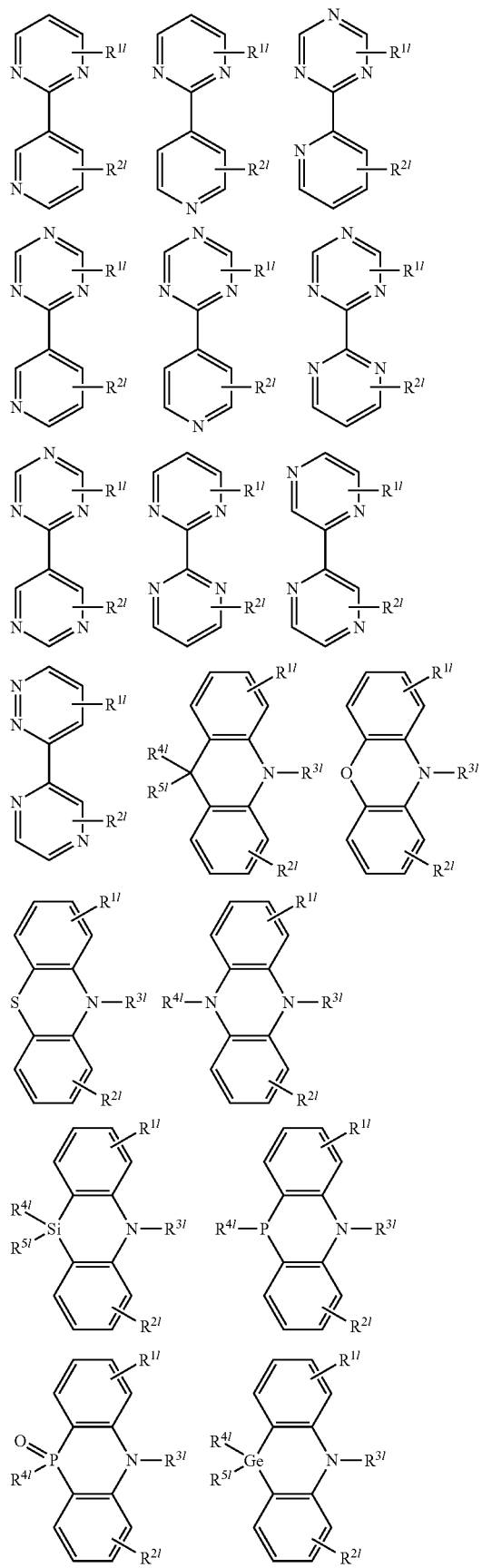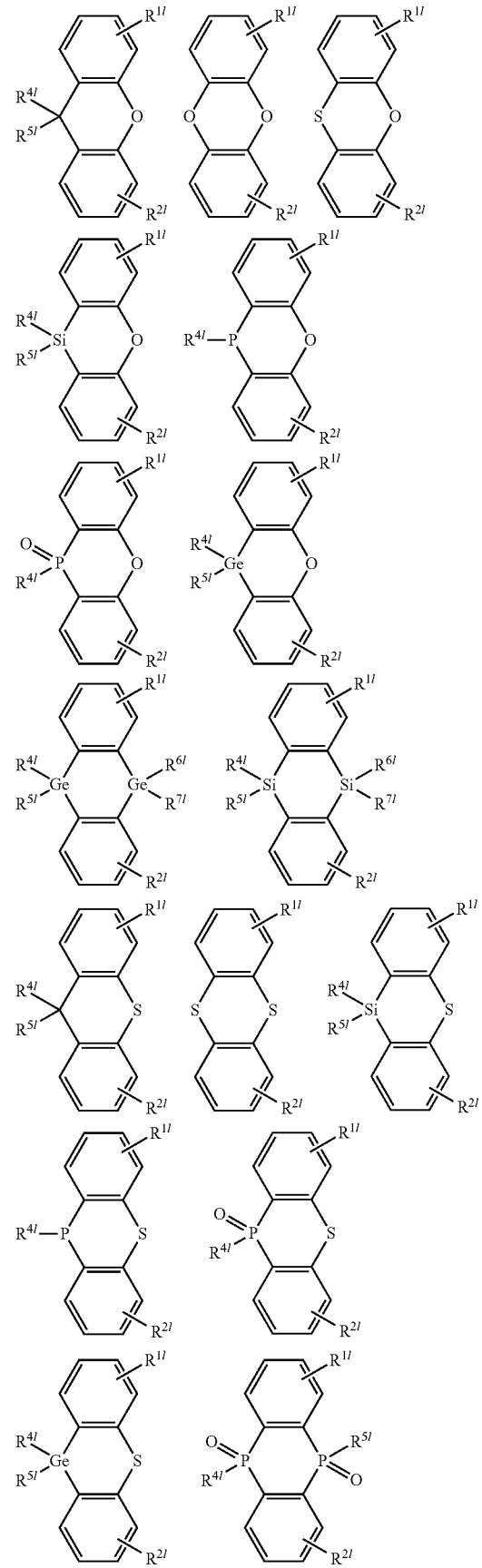

-continued

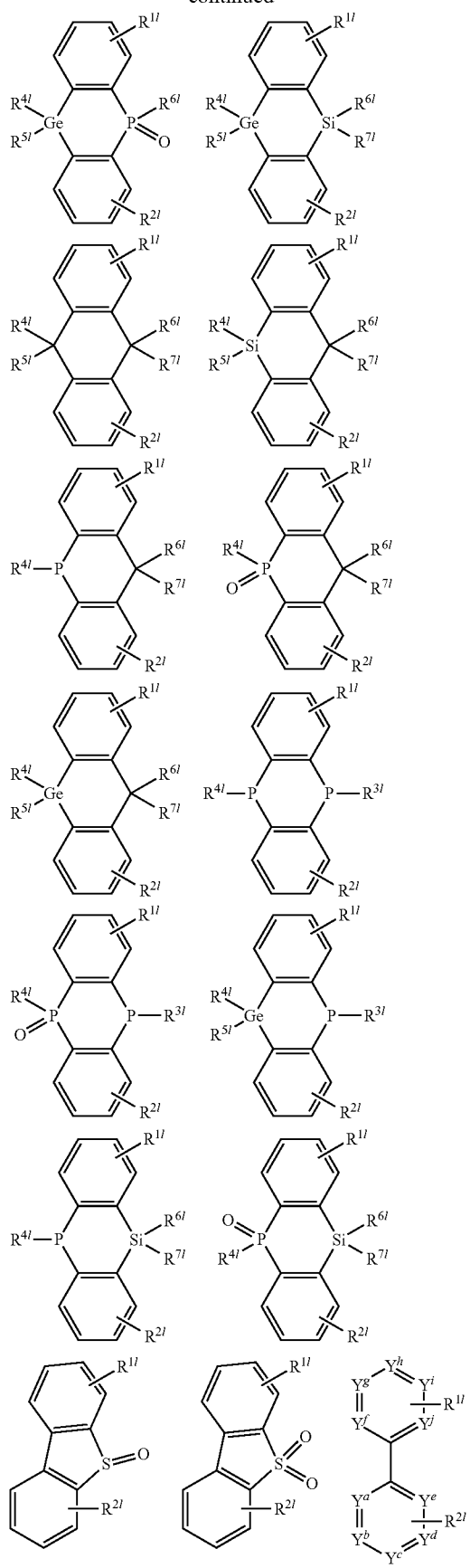

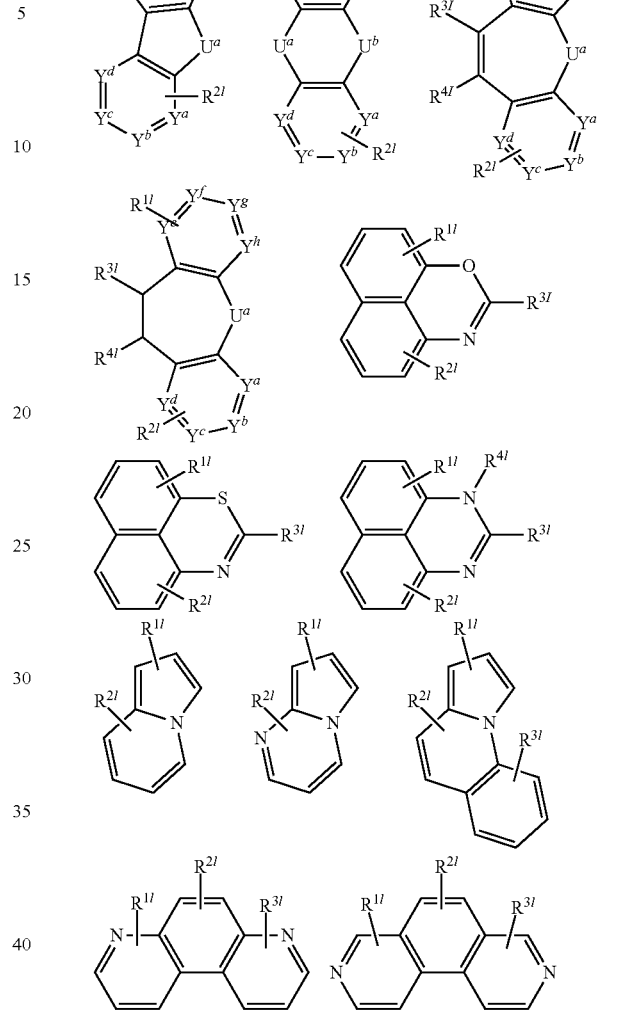

where:

each of $R^{11}$, $R^{21}$, $R^{31}$, $R^{41}$, $R^{51}$, $R^{61}$, $R^{71}$, and $R^{81}$ is independently a mono-, di-, or tri-substitution, and if present each of $R^{11}$, $R^{21}$, $R^{31}$, $R^{41}$, $R^{51}$, $R^{61}$, $R^{71}$, and $R^{81}$ is independently hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, substituted or unsubstituted alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, or silyl, each of $Y^a$, $Y^b$, $Y^c$, $Y^d$, $Y^e$, $Y^f$, $Y^g$, $Y^h$, $Y^i$, $Y^j$, $Y^k$, $Y^l$, $Y^m$, $Y^n$, $Y^o$, and $Y^p$ is independently C, N, or B, each of $U^a$, $U^b$, and $U^c$ is independently $CH_2$, $CR^1R^2$, $C=O$, $CH_2$, $SiR^1R^2$, $GeH_2$, $GeR^1R^2$, NH, $NR^3$, PH, $PR^3$, $R^3P=O$, $AsR^3$, $R^3As=O$, O, S, $S=O$, $SO_2$, Se, $Se=O$, $SeO_2$, BH, $BR^3$, $R^3Bi=O$, BiH, or $BiR^3$, and each of W, $W^a$, $W^b$, and $W^c$ is independently CH, CR', $SiR^1$, GeH, $GeR^1$, N, P, B, Bi, or Bi=O.

Figure 2A:
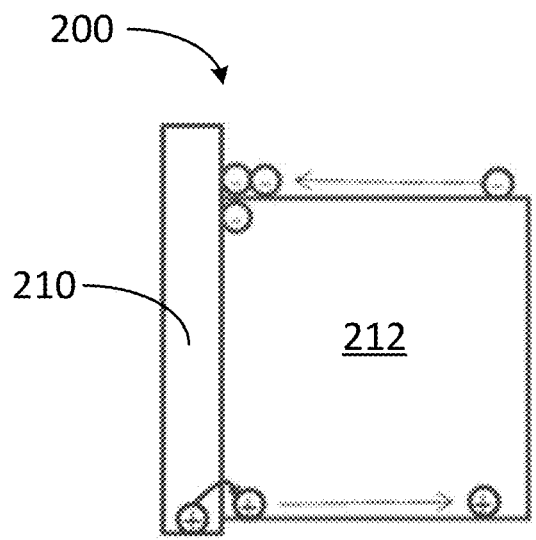
FIGS. 2A and 2B depict charge transporting and trapping for OLEDs with undoped and doped electron blocking layers, respectively.
Figure 2B:
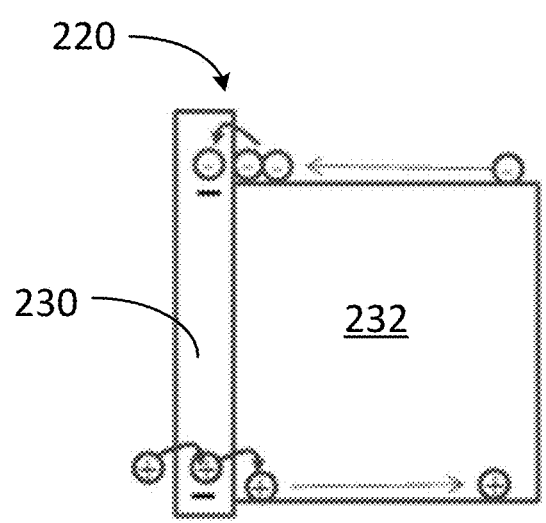

FIGS. 2A and 2B depict charge transporting and trapping for OLEDs with an undoped EBL and a doped EBL, respectively. FIG. 2A depicts a portion of OLED 200 with undoped EBL 210 and EML 212. FIG. 2B depicts a portion of OLED 220 with doped EBL 230 and EML 232. As depicted in FIG. 2B, the presence of a dopant in EBL 230 may alleviate charge imbalance inside EML 232 by improving the hole injection from EBL 230 to EML 232 or partially transporting stacked electrons at the EBL/EML interface. The dopant concentration is typically selected to reduce or prevent quenching of excitons from the emissive material.

Components in the devices described herein are listed below.

ITO (Anode): indium tin oxide
HATCN (HIL): dipyrazino[2,3f:2',3'-h]quinoxaline 2,3,6,7,10,11-hexacarbonitrile
NPD (HTL): N,N'-di-1-naphthyl-N,N-diphenyl-1,1'-biphenyl-4,4'diamine
TrisPCz (EBL): 9,9',9"-triphenyl-9H,9'H,9"H-3,3':6',3"-tercarbazole

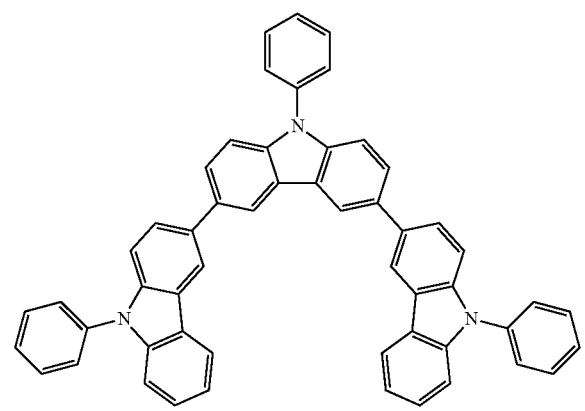 [SMILES: c1ccc(-n2c3ccccc3c3cc(-c4ccc5c(c4)c4cc(-c6ccc7c(c6)c6ccccc6n7-c6ccccc6)ccc4n5-c4ccccc4)ccc32)cc1]

Pd3O3 (EML Emitting Material):

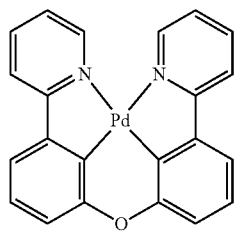

PtN3N (EML Emitting Material)

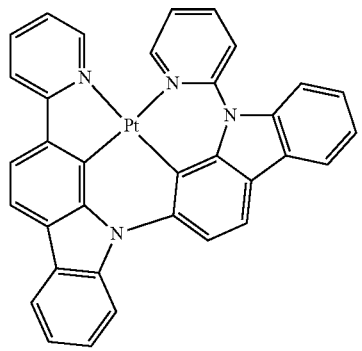

PdN3N (EML Emitting Material)

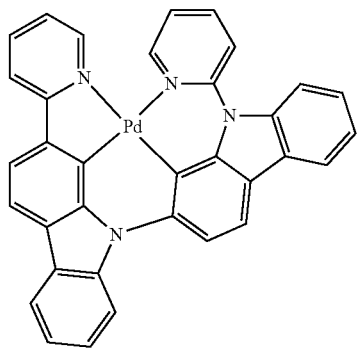

PtNON (EML Emitting Material)

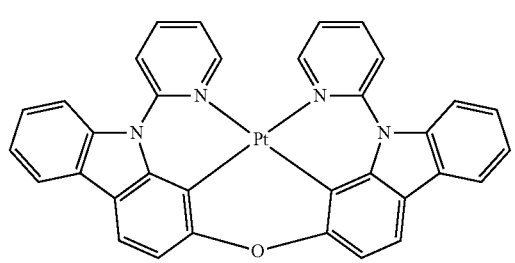

mCBP (EML host): 3,3-di(9H-carbazol-9-yl)biphenyl
BAlq (HBL): bis(2-methyl-8-quinolinolate)-4-(phenyl phenolato) aluminum
BPyTP (ETL): 2,7-di(2,2'-bipyridin-5-yl)triphenylene
LiF (HIL): lithium fluoride
Al (Cathode): aluminum
TBPe (a blue fluorescent emitter): 2,5,8,11-tetra-tert-butylperylene

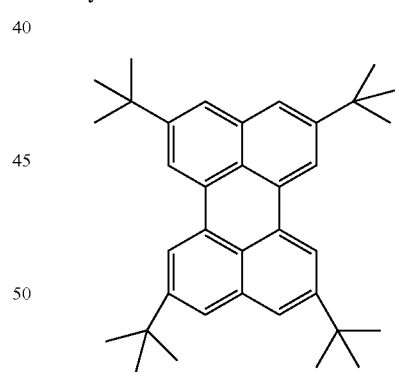

Devices 1 and 2 were prepared with the structures below.
Device 1: ITO/HATCN/NPD/TrisPCz/10% Pd3O3:mCBP/BAlq/BPyTP/LiF/Al
Device 2: ITO/HATCN/NPD/10% Pd3O3:mCBP/BAlq/BPyTP/LiF/Al Thus, Device 1 includes an EBL formed of TrisPCz, and Device 2 does not include an EBL. FIGS. 3A-3D show electroluminescent spectra, external quantum efficiency (EQE) versus luminance, power efficiency versus luminance, and operational lifetime, respectively, for Pd3O3 in Device 1 (circles) and Device 2 (squares). The device operational lifetime was measured at a constant drive current of 20 mA/cm$^2$.

Pd3O3 is a planar deep blue emitting palladium complex for use in excimer based white devices. As shown in FIG. 3A, the electroluminescent spectra for Devices 1 and 2 were similar. As shown in FIGS. 3B and 3C, Device 1 with Pd3O3 was very efficient, reaching peak EQEs and power efficiencies of 19.9% and 60.5 lm/W. The roll-off for these devices was also less significant than most reported excimer-based white OLEDs with EQE values of 14.6% at 1000 cd/m$^2$. The device operational lifetimes of Devices 1 and 2 were measured at accelerated conditions by driving the devices at a constant current of 20 mA/cm$^2$.

As shown in FIG. 3D, Device 1 also demonstrated an operational lifetime to 70% of initial luminance ($LT_{70}$) of 63 hours at a brightness of 5043 cd/m$^2$. Furthermore, extrapolating these accelerated testing results to practical luminance of 1000 cd/m$^2$ yields a lifetime of 986 h. On the other hand, the operational lifetime of Device 2 ($LT_{70}$=294 hours at 20 mA/cm$^2$) is longer than Device 1 ($LT_{70}$=63 hours). The efficiency of Device 2 is lower than that of Device 1, possibly due to exciton formation in the NPD layer and possible exciton quenching by the NPD layer. Thus, it is thought that having an EBL that confines the excitons inside the EML and also alleviates the charge imbalance in the EML may extend the operational lifetime of Pd3O3 based devices.

Devices 3 and 4 were prepared with the following structures.

Device 3: ITO/HATCN/NPD/TrisPCz (6 nm)/4% TBPe: TrisPCz (4 nm)/10% Pd3O3:mCBP/BAlq/BPyTP/LiF/Al Device 4: ITO/HATCN/NPD/4% TBPe:TrisPCz (4 nm)/ 10% Pd3O3:mCBP/BAlq/BPyTP/LiF/Al Thus, Device 3 includes an undoped EBL (TrisPCz) and a doped EBL (4% TBPe:TrisPCz), while Device 4 includes a doped EBL only.

Figure 4A:
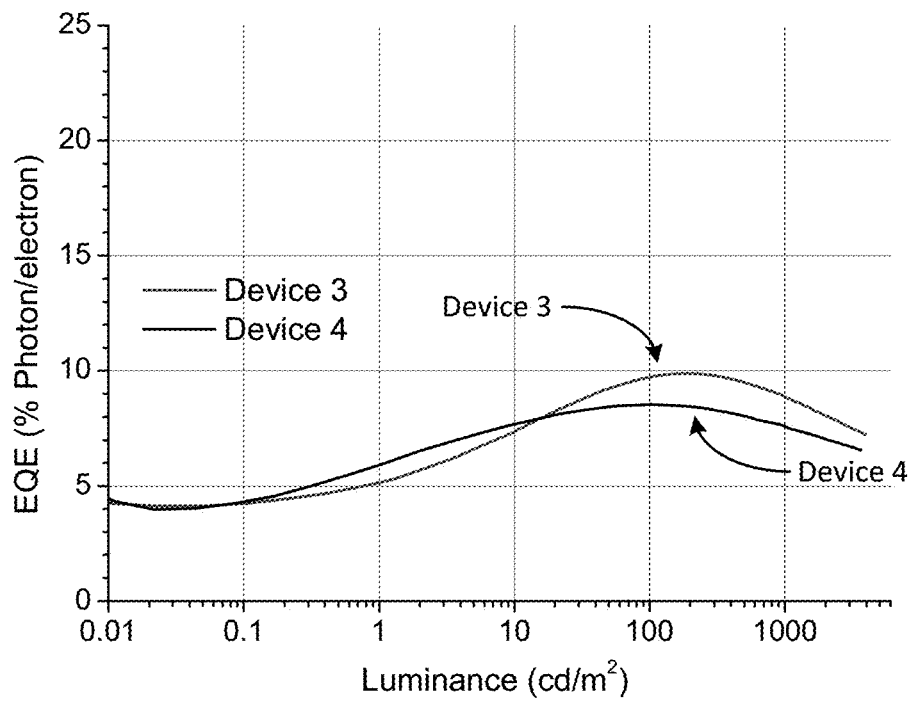
FIGS. 4A and 4B show EQE versus luminance and operation lifetime, respectively, for OLEDs with doped electron blocking layers, with and without an undoped electron blocking layer.
Figure 4B:
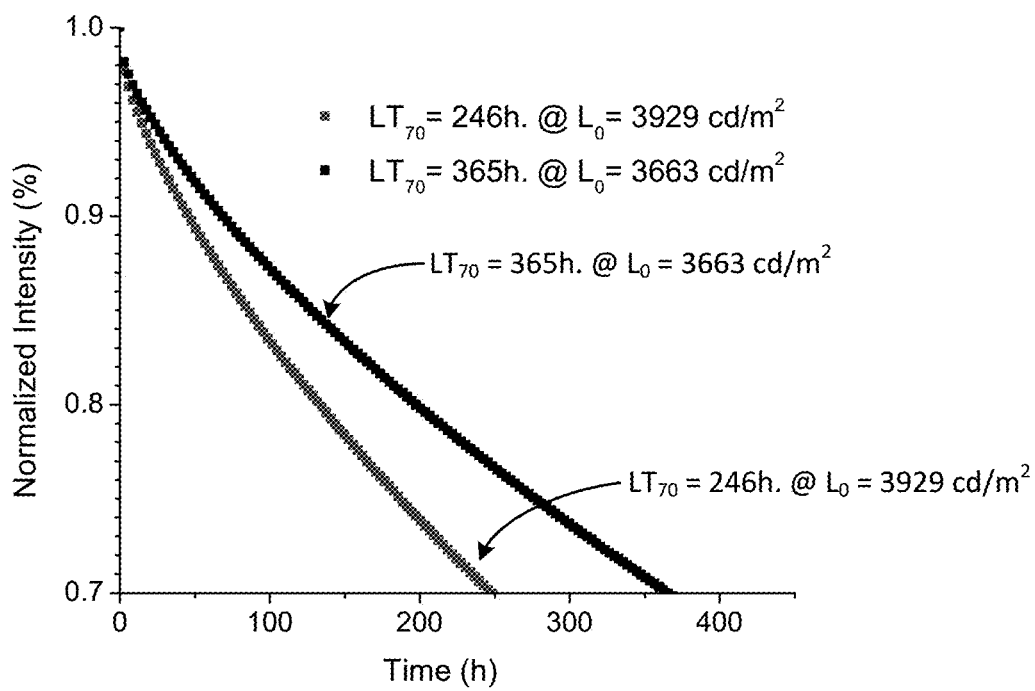

FIGS. 4A and 4B show EQE versus luminance and operational lifetime, respectively, for Devices 3 and 4. The device operational lifetime was measured at a constant drive current of 20 mA/cm$^2$. The addition of TBPe is believed to alleviate the charge imbalance inside of the Pd3O3-containing EML by improving the hole injection from EBL to EML, or partially transporting stacked electron at the EBL/EML interface.

Notably, the dopant concentration of TBPe should be relatively low to reduce or prevent possible quenching of Pd3O3 excitons. As shown in FIGS. 4A and 4B, Device 4 has a peak efficiency of over 8% and $LT_{70}$ of 365 hours with the brightness of 3663 cd/cm$^2$. Extrapolating these accelerated testing results to practical luminance of 1000 cd/m$^2$ yields $LT_{70}$ of 3300 hours for Device 4. The estimated $LT_{50}$ of Device 4 at 1000 cd/m$^2$ is expected to exceed 7000 hours, which is close to a desired lifetime target of excimer-based white OLEDs ($LT_{50}$=10000 hours at 1000 cd/m$^2$). Thus, Device 4, with a doped EBL, is shown to improve the efficiency as well as the operational lifetime of Device 2.

Figure 6A:
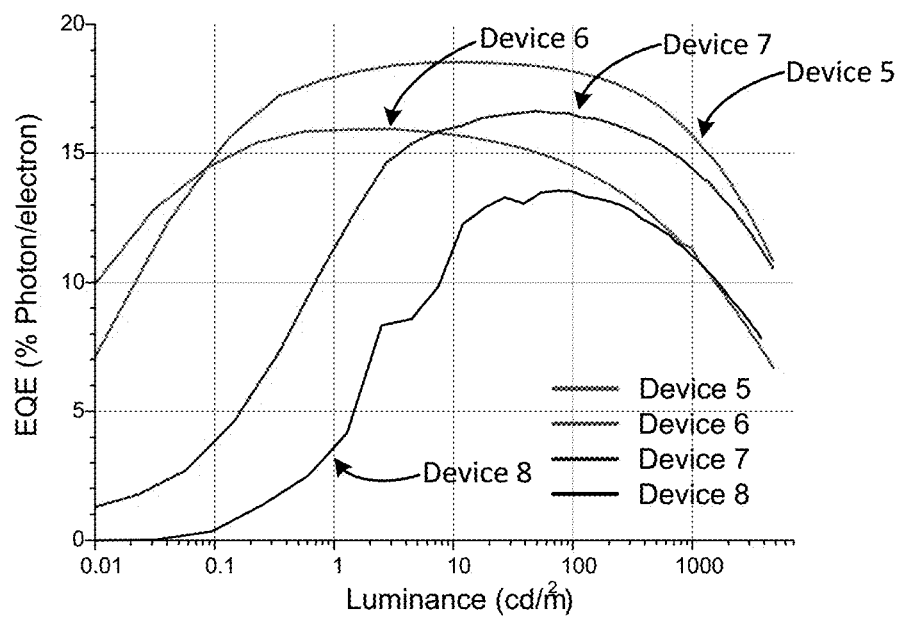
FIGS. 6A and 6B show EQE versus current density and relative luminance versus operational time at a constant current of 20 mA/cm$^2$, respectively, for red-emitting OLEDs.
Figure 6B:
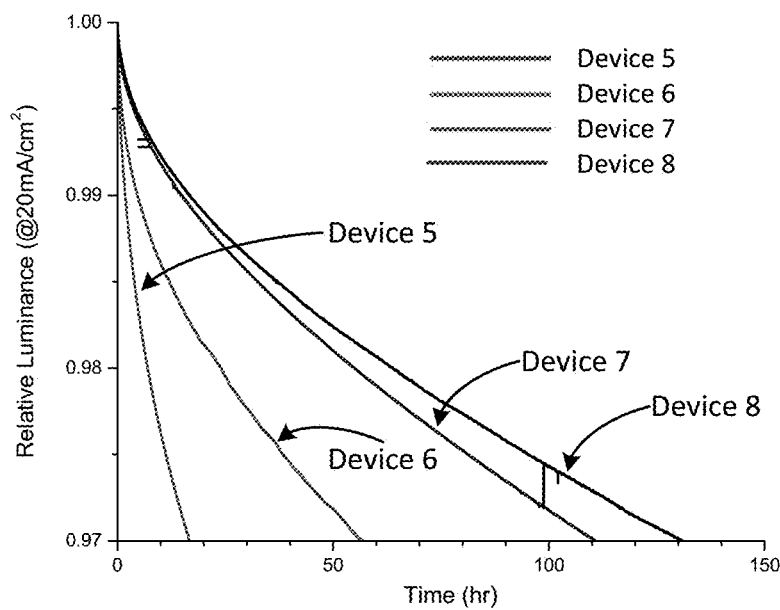

Higher efficiency in organic light emitting diodes (OLEDs) may be achieved by confining electron and hole recombination within the EML. To achieve this, electron transporting/hole blocking and hole transporting/electron blocking layers that preferentially transport one charge type while blocking the other may be used. FIGS. 6A and 6B show EQE versus current density and relative luminance versus operational time at a constant current of 20 mA/cm$^2$ for the following red-emitting PtN3N devices:

Device 5: ITO/HATCN/NPD/TrisPCz/10% PtN3N:CBP(25 nm)/BAlq/BPyTP/LiF/Al

Device 6: ITO/HATCN/NPD/10% PtN3N:CBP(25 nm)/ BAlq/BPyTP/LiF/Al

Device 7: ITO/HATCN/NPD/TrisPCz/20% PtN3N:CBP(10 nm)/6% PtN3N:CBP(20 nm)/BAlq/BPyTP/LiF/Al Device 8: ITO/HATCN/NPD/20% PtN3N:CBP(10 nm)/6% PtN3N:CBP(20 nm)/BAlq/BPyTP/LiF/Al As can be seen in the comparison of Device 5 (single EML, with EBL) and Device 6 (single EML, no EBL) in FIGS. 5A and 5B, the addition of the EBL (TrisPCz) shows an enhancement in the peak EQE of the device. This enhancement may be attributed to the EBL's ability to confine electrons within the emissive layer. This confinement, however, may lead to charge buildup at the EML-EBL interface and result in a faster device degradation process.

Higher efficiency in OLEDs may be achieved by confining electron and hole recombination within the EML. To achieve this, electron transporting/hole blocking and hole transporting/electron blocking layers that preferentially transport one charge type while blocking the other may be used. The addition of an electron blocking layer (EBL) including a carbazole compound shows an enhancement in the peak EQE of the device. This enhancement may be attributed to the role of the EBL in confining electrons within the emissive layer. This confinement, however, may lead to charge buildup at the EML-EBL interface, thereby resulting in a faster device degradation process.

Figure 5A:
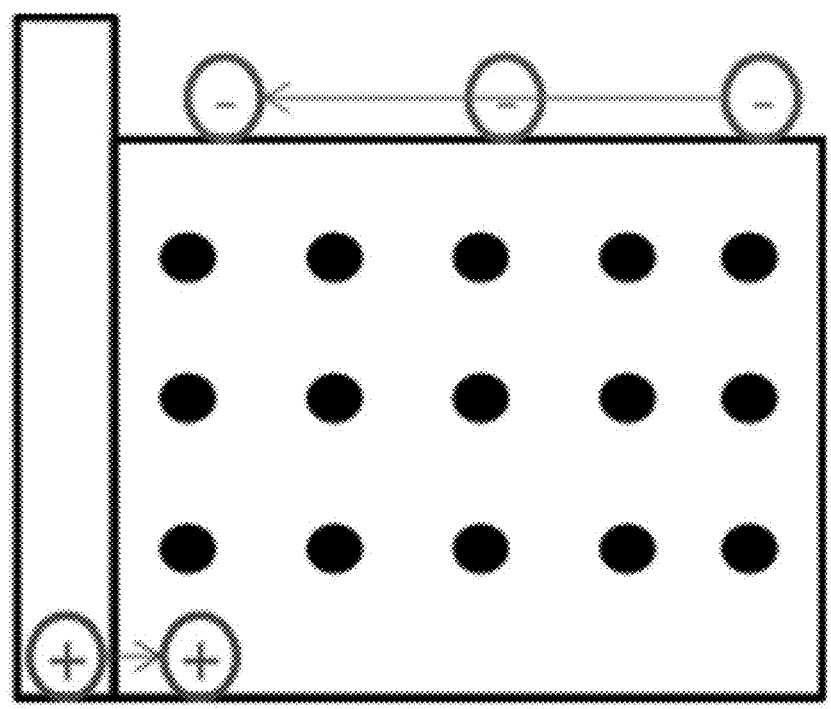
FIG. 5A depicts charge transporting and trapping for a device having a single EML.
Figure 5B:
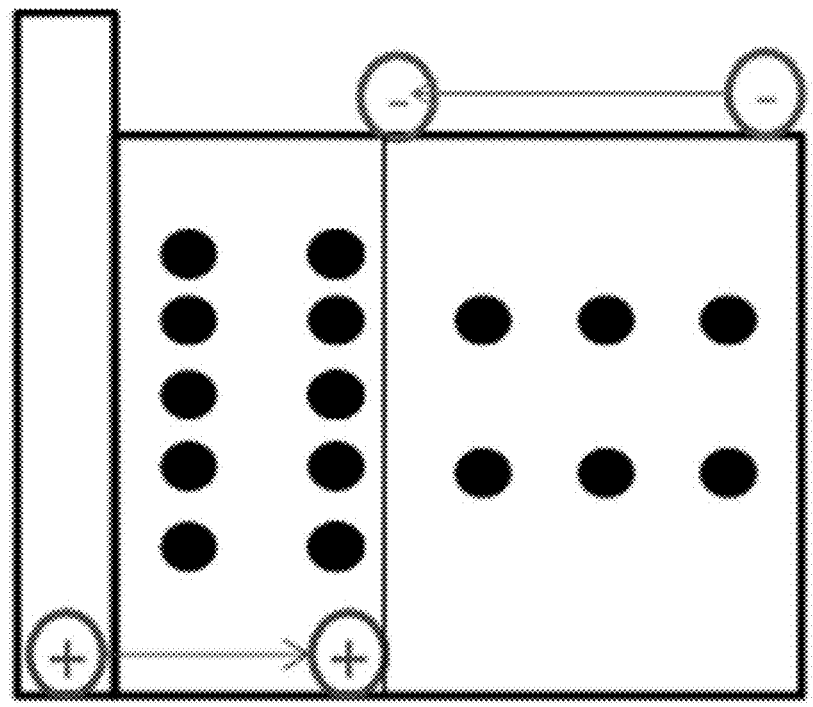
FIG. 5B depicts charge transporting and trapping for a device having a multi-EML.

Exciton formation may be at least partially contained inside of the emissive layer by controlling hole-electron recombination with a multi-EML, with or without a charge-blocking layer. As described herein, a multi-EML generally refers a first EML in direct contact with a second EML, where the emitter concentration of the first EML (hole favorable) exceeds that of the second EML (electron favorable). FIG. 5A depicts charge transporting and trapping for a device having a single EML. FIG. 5B depicts charge transporting and trapping for a device having a multi-EML. In contrast to the device in FIG. 5A, in which electrons and holes recombine at an anode/emissive layer interface, the difference in emitter concentration in the first EML and second EML of the device depicted in FIG. 5B shifts the recombination zone to an interior of the emissive layer (i.e., at the interface of the first EML and the second EML), which tends to confine exciton formation in the emissive layer.

FIGS. 6A and 6B show EQE versus current density and relative luminance versus operational time at the constant current of 20 mA/cm$^2$, respectively, for red-emitting PtN3N devices having the following structures:

Device 5: ITO/HATCN/NPD/TrisPCz/10% PtN3N:CBP(25 nm)/BAlq/BPyTP/LiF/Al

Device 6: ITO/HATCN/NPD/10% PtN3N:CBP(25 nm)/ BAlq/BPyTP/LiF/Al

Device 7: ITO/HATCN/NPD/TrisPCz/20% PtN3N:CBP(10 nm)/6% PtN3N:CBP(20 nm)/BAlq/BPyTP/LiF/Al Device 8: (ITO/HATCN/NPD/20% PtN3N:CBP(10 nm)/6% PtN3N:CBP(20 nm)/BAlq/BPyTP/LiF/Al)

Figure 6C:
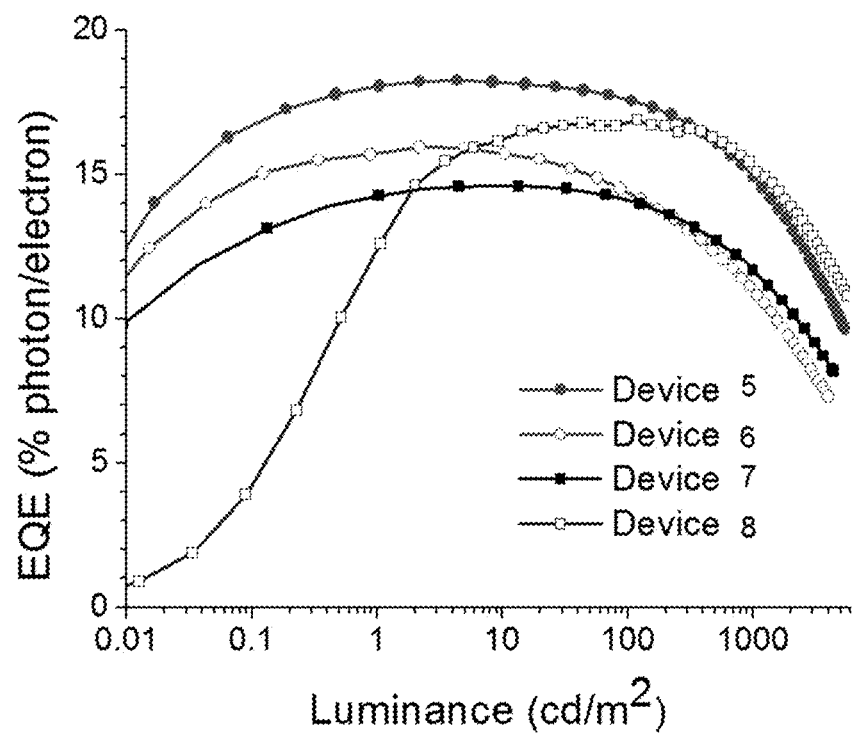
FIGS. 6C and 6D show EQE versus current density and relative luminance versus operational time, respectively, at a constant current of 20 mA/cm$^2$ for PtN3N devices.
Figure 6D:
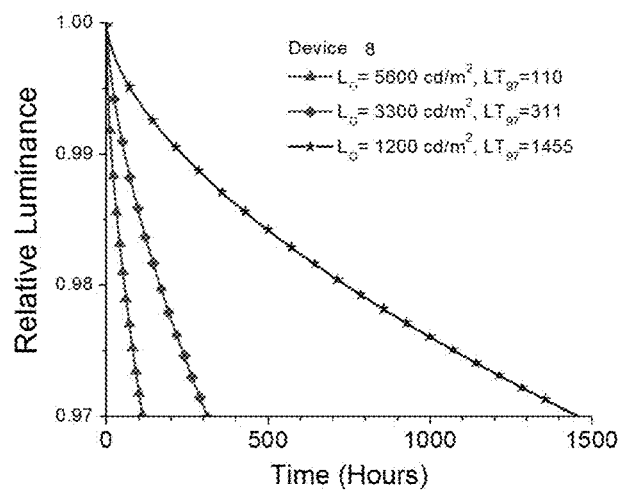
Figure 6E:
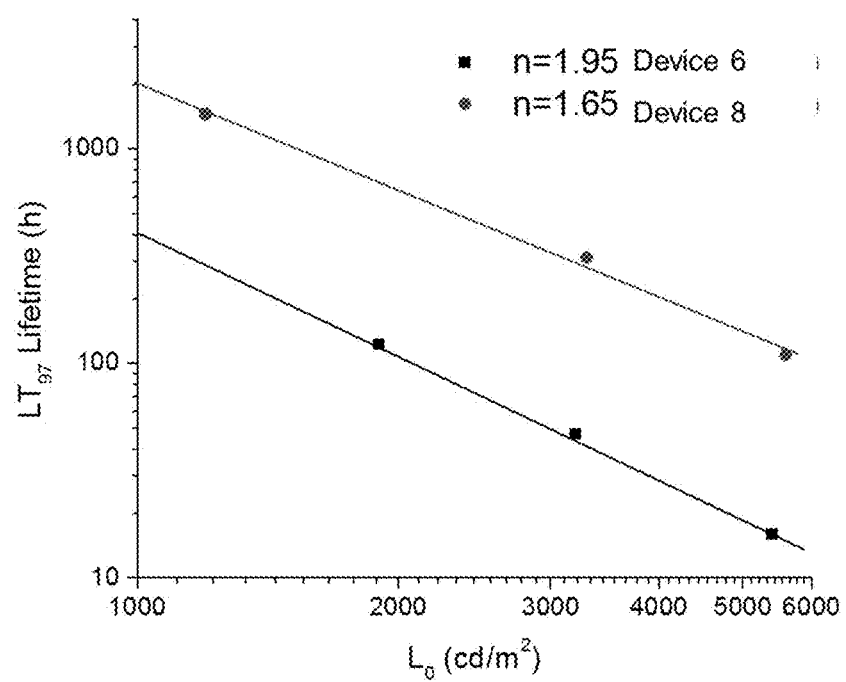
FIG. 6E shows the $LT_{97}$ lifetime versus current density for PtN3N devices.

Comparison of Devices 5 (single EML, with EBL) and 6 (single EML, no EBL) as well as Devices 7 (multi-EML, with EBL) and 8 (multi-EML, no EBL) in FIGS. 6A and 6B show that the Devices 5 and 7 (with EBL) yield an accelerated lifetime more than 4 times longer than the corresponding devices with a standard EML (Device 5). As seen in FIG. 6A, Devices 5 and 7 show device efficiency of about 15% when tested at 1000 cd/m$^2$. In the Devices 6 and 8, the enhancement in lifetime observed is closer to 2.5 times that of the corresponding devices with. These devices also exhibit comparable efficiencies at 1000 cd/m$^2$. By comparing Device 5 (single EML, with EBL) and Device 7 (multi-EML, with EBL) in FIG. 6A, the EML modification improves the device operation stability of PtN3N based devices with a TrisPCz EBL while maintaining the device efficiency of close to 15% at 1000 cd/m². Additional data can be seen in FIGS. 6C and 6D which also show EQE versus current density and relative luminance versus operational time, respectively, at the constant current of 20 mA/cm². FIG. 6E shows the $LT_{97}$ lifetime versus current density for PtN3N devices.

Figure 7A:
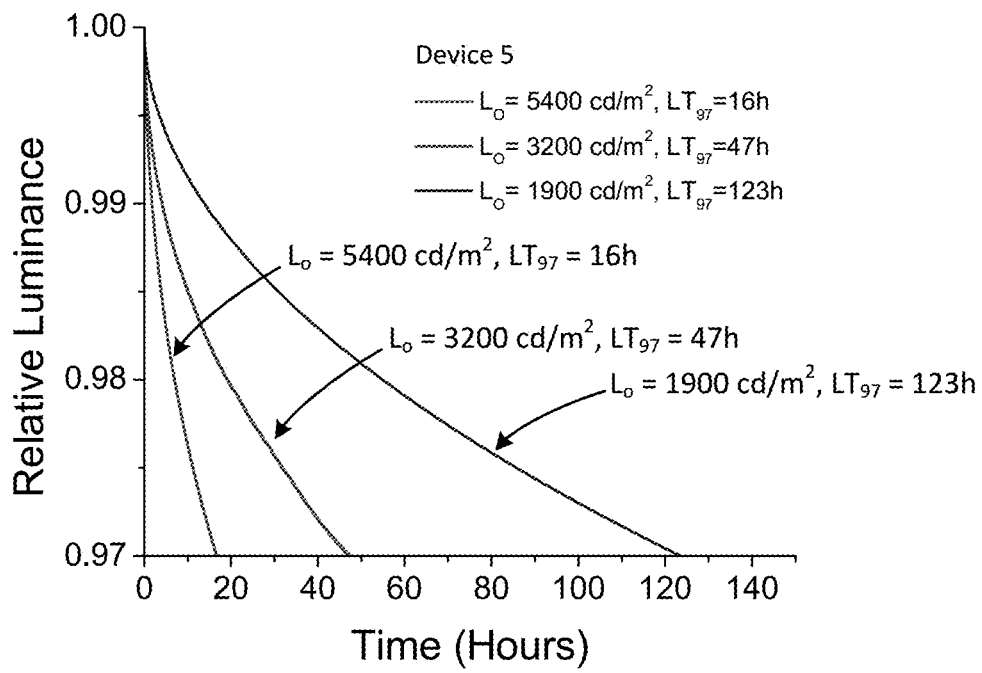
FIGS. 7A and 7B show relative luminance versus operational time at various brightnesses for red-emitting OLEDS.
Figure 7B:
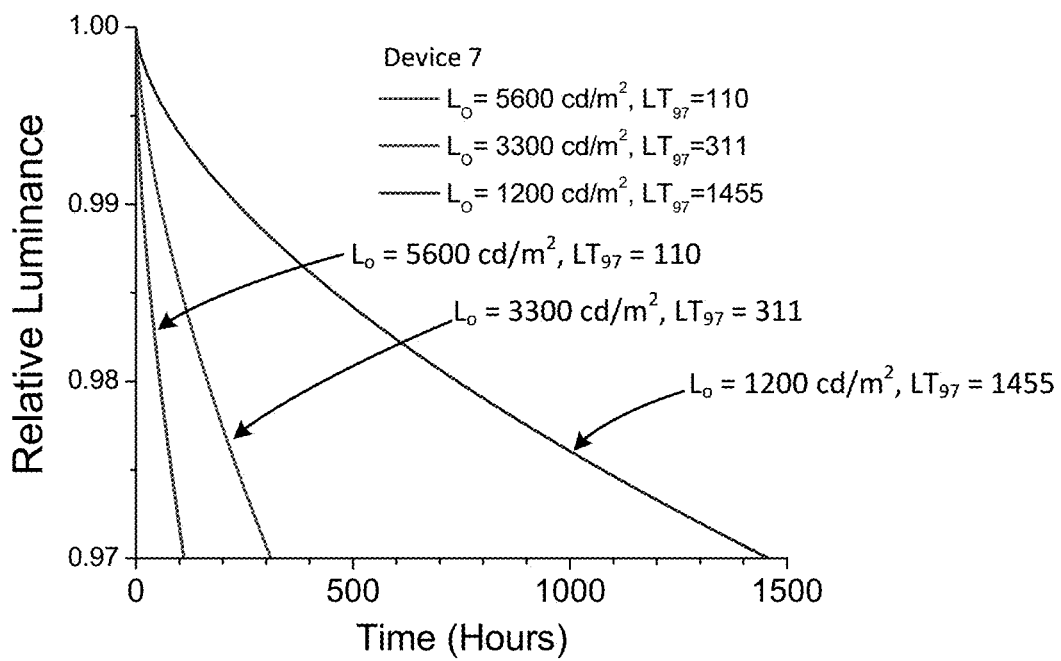

FIGS. 7A and 7B show relative luminance versus operational time at 5400 cd/m², 3200 cd/m², and 1900 cd/m² for Devices 5 and 7.

Figure 8A:
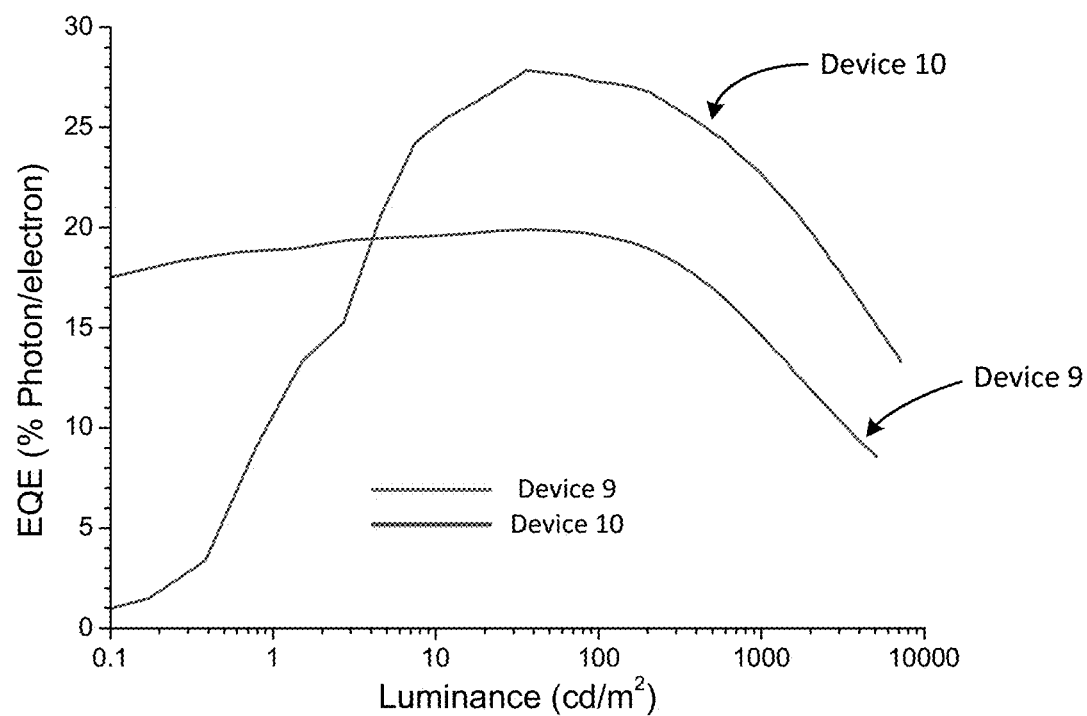
FIGS. 8A and 8B show EQE versus brightness and relative luminance versus operational time at the constant current of 20 mA/cm$^2$, respectively, for excimer-based white OLEDs.
Figure 8B:
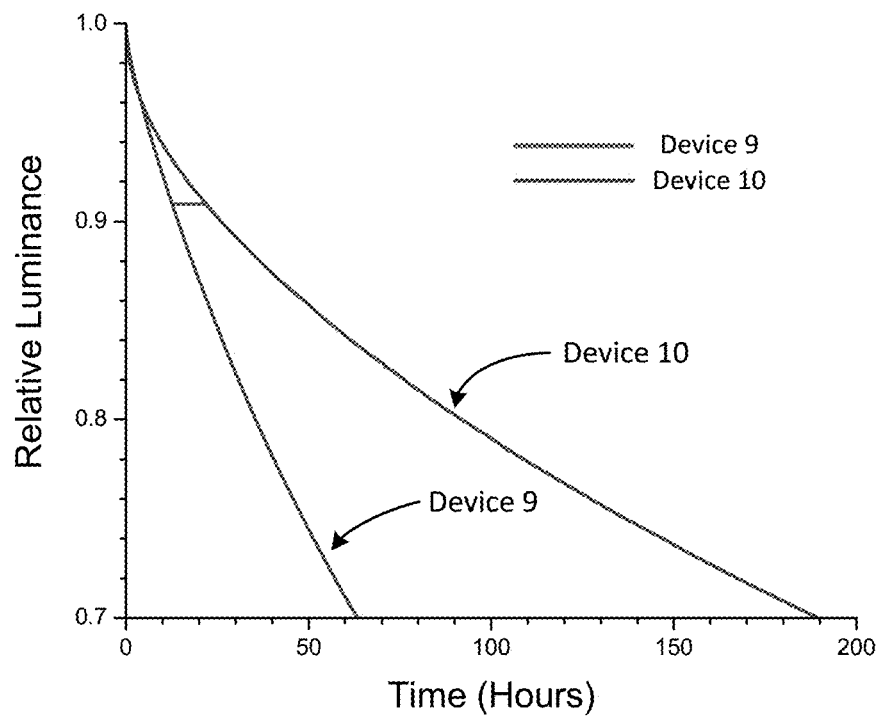

FIGS. 8A and 8B show EQE versus brightness and relative luminance versus operational time at the constant current of 20 mA/cm², respectively, for excimer-based white OLEDs employing Pd3O3 devices with the following structures:

Device 9: ITO/HATCN/NPD/TrisPCz/10% Pd3O3:CBP(25 nm)/BAlq/BPyTP/LiF/Al)

Device 10 (ITO/HATCN/NPD/TrisPCz/20% Pd3O3:CBP (10 nm)/6% Pd3O3:CBP(20 nm)/BAlq/BPyTP/LiF/Al)

As shown in FIGS. 8A and 8B, Device 10 achieved an efficiency of over 22% at 1000 cd/m² and demonstrated an operational lifetime to 70% of initial luminance ($LT_{70}$) of 190 hours at the brightness of 8500 cd/m². Device 9, with single dopant concentration, demonstrated a lower device efficiency and lower $LT_{70}$ of 63 hours at the lower brightness.

Figure 9A:
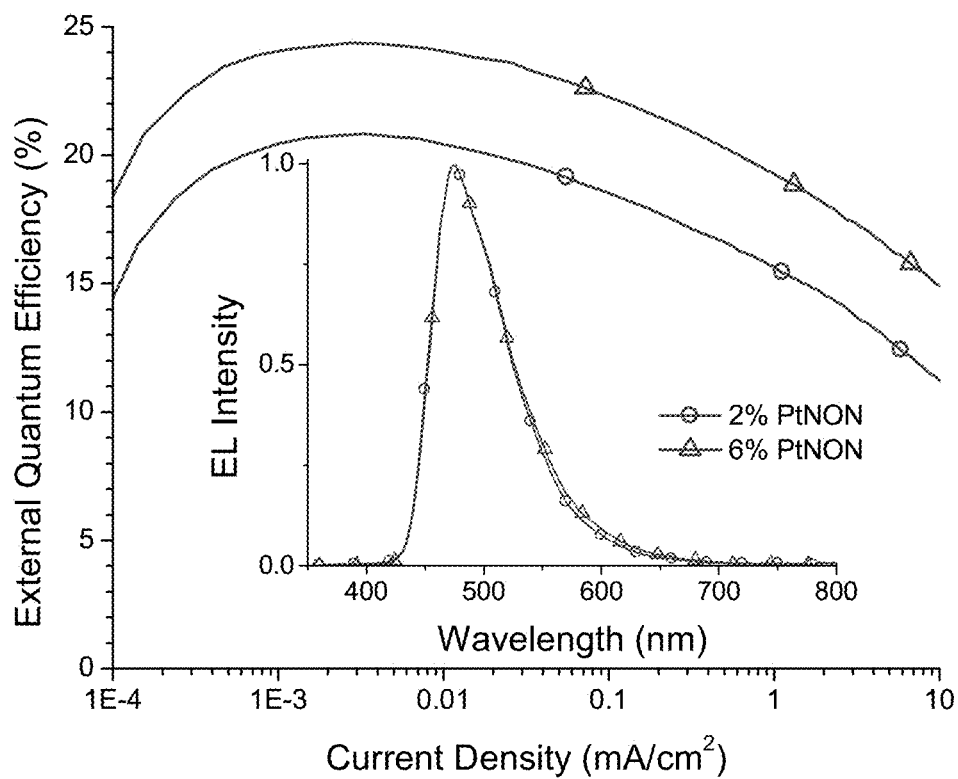
FIG. 9A shows EQE versus current density and electroluminescent spectra for blue-emitting devices.
Figure 9B:
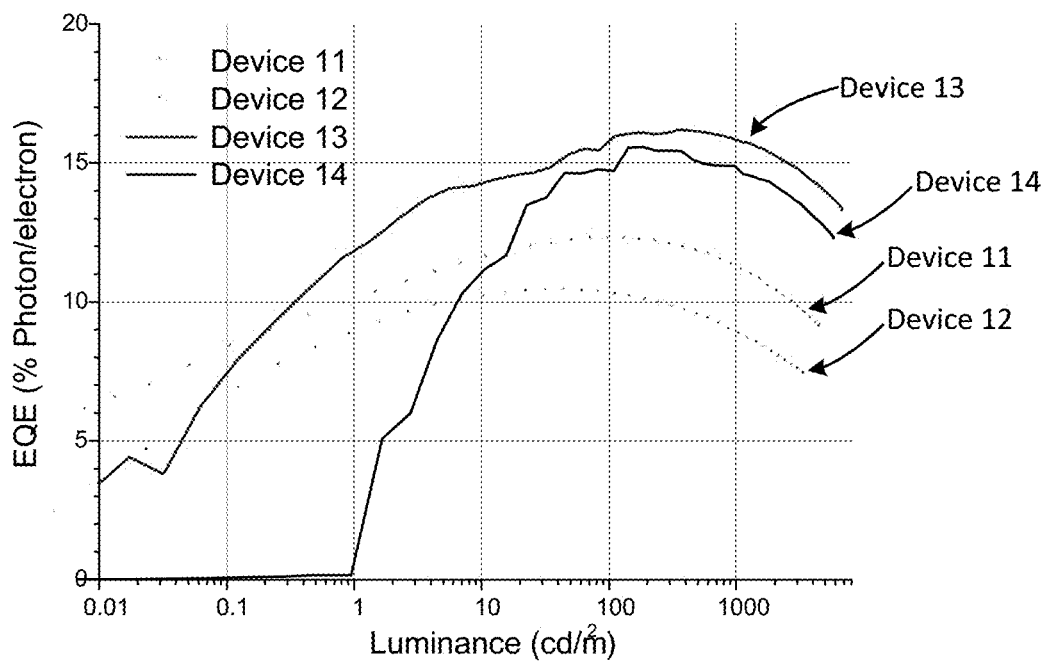
FIGS. 9B and 9C show plots of external quantum efficiency versus current density and relative luminance versus operational time at a constant current of 20 mA/cm$^2$ for blue-emitting devices.
Figure 9C:
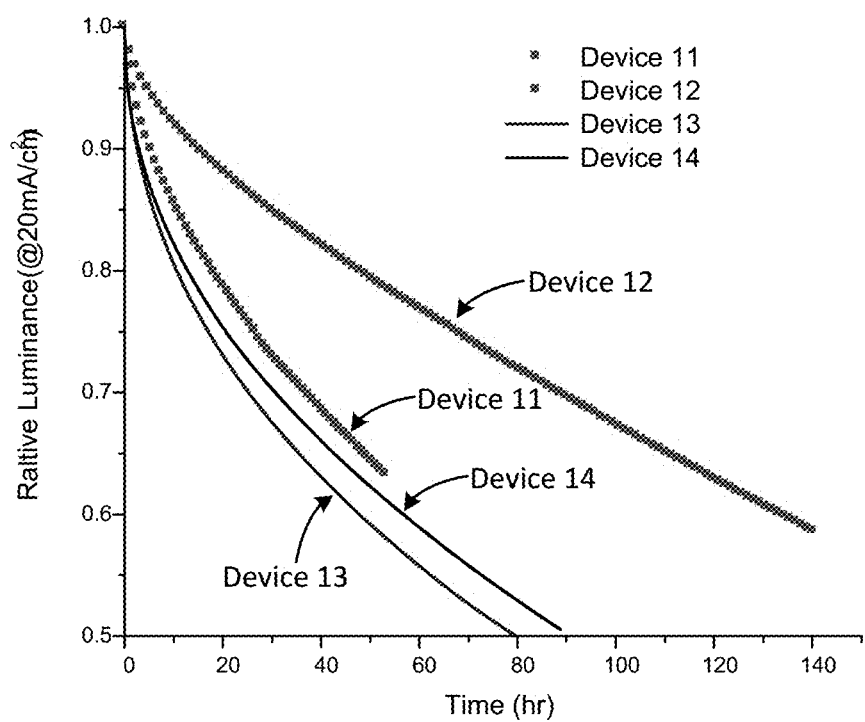

FIG. 9A shows EQE versus current density and electroluminescent spectra for blue PtNON devices with 2% (circles) and 6% (triangles) doping concentrations in the structure: ITO/HATCN/NPD/TAPC/x% PtNON: 26mCPy/DPPS/BmPyPB/LiF/Al FIGS. 9B and 9C show plots of EQE versus luminance and relative luminance versus operational time at a constant current of 20 mA/cm² for PtNON devices having the following structures:

Device 11: ITO/HATCN/NPD/TrisPCz/10% PtNON:mCBP (25 nm)/mCBT/BPyTP/LiF/Al

Device 12: ITO/HATCN/NPD/10% PtNON: mCBP(25 nm)/mCBT/BPyTP/LiF/Al)

Device 13: ITO/HATCN/NPD/TrisPCz/20% PtNON:mCBP (10 nm)/6% PtNON:mCBP(20 nm)/mCBT/BPyTP/LiF/Al Device 14: ITO/HATCN/NPD/20% PtNON:mCBP(10 nm)/6% PtNON:mCBP(20 nm)/mCBT/BPyTP/LiF/Al Device architecture with dual EMLs have improved device efficiency using PtNON-based blue phosphorescent OLED with a limited set of potential stable charge-transporting and host materials. One PtNON device (Device 13) have achieved device efficiency over 16% at 1000 cd/m². Device 13 demonstrated a very good operational lifetime to 50% of initial luminance ($LT_{50}$) of 80 h at the brightness of 6700 cd/m². Furthermore, extrapolating these accelerated testing results to practical luminance of 1000 cd/m² yields lifetimes of 2030 hr for Device 13.

Figure 9D:
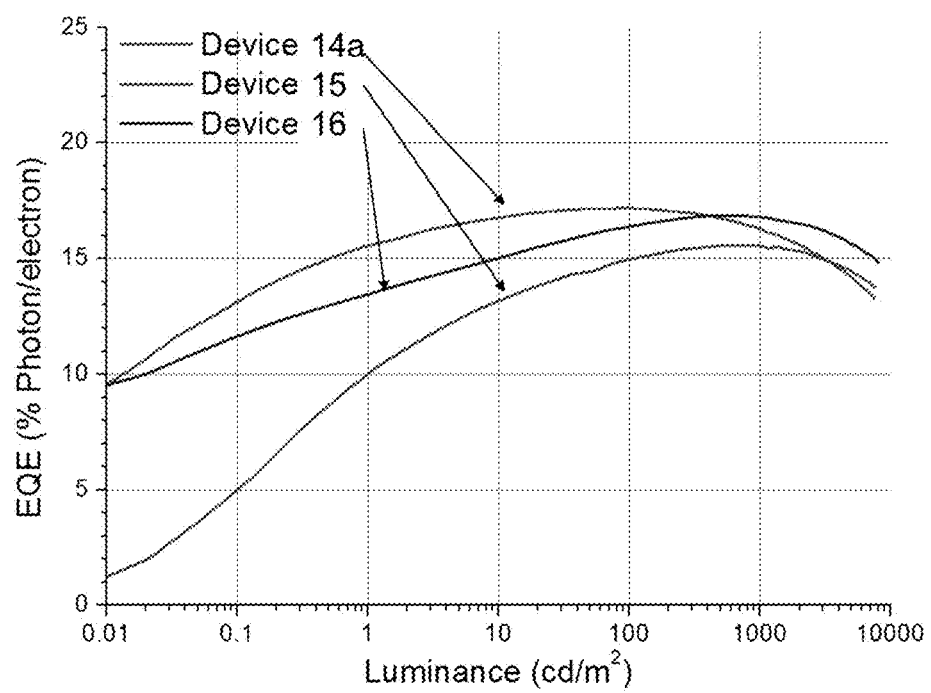
FIGS. 9D and 9E show plots of EQE versus luminance and relative luminance versus operational time, respectively, at a constant current of 20 mA/cm$^2$ for PtNON.
Figure 9E:
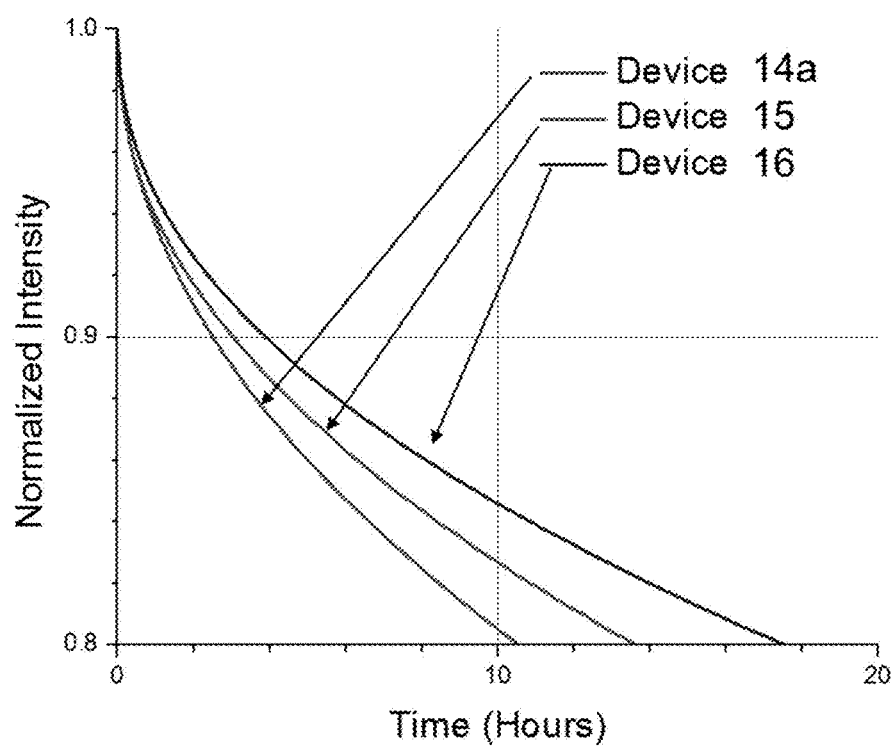

FIGS. 9D and 9E show plots of EQE versus luminance and relative luminance versus operational time, respectively, at a constant current of 20 mA/cm² for PtNON devices similar to Device 13 having the following EML modifications:

Device 14a EML: 20 wt % PtNON (10 nm)/6 wt % PtNON (20 nm)/

Device 15 EML: 20 wt % PtNON (5 nm)/16 wt % PtNON (5 nm)/12 wt % PtNON (5 nm)/10 wt % PtNON (5 nm)/8wt % PtNON (5 nm)/6 wt % PtNON (5 nm)/

Device 16 EML: 20 wt % PtNON (10 nm)/10 wt % PtNON (10 nm)/6 wt % PtNON (10 nm)

Figure 10A:
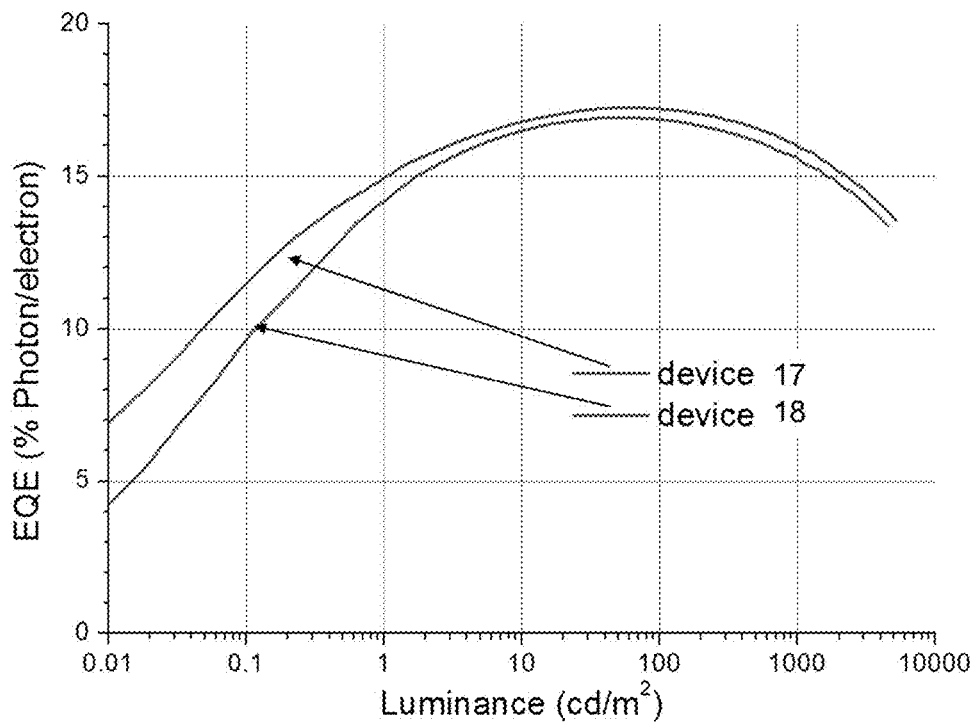
FIGS. 10A and 10B show plots of EQE versus luminance and relative luminance versus wavelength, respectively, for devices with doped TBPe layer.
Figure 10B:
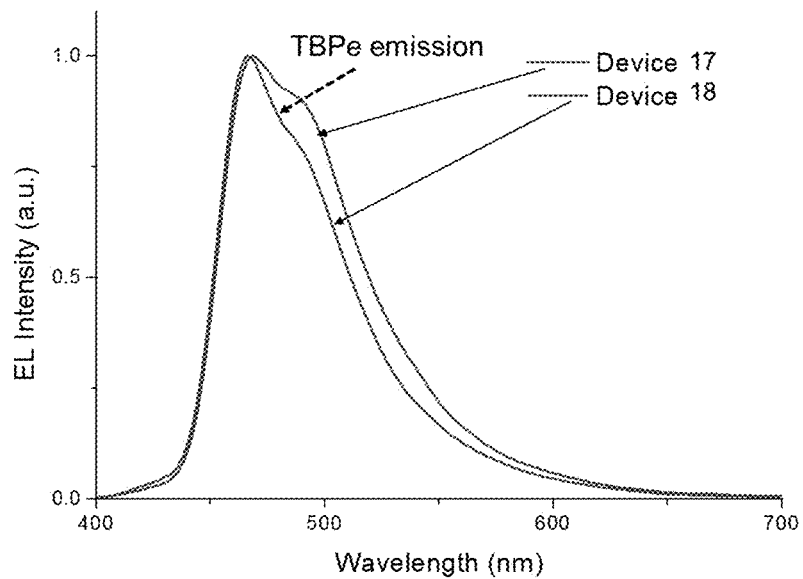

FIGS. 10A and 10B show plots of EQE versus luminance and relative luminance versus wavelength, respectively, for devices with doped TBPe layer, where the devices have similar structures as Device 13 with some EML modifications:

Device 17 EML: 20 wt % PtNON (10 nm)/2 wt % TBPe: mCBP(2 nm)/10 wt % PtNON (4 nm)/2 wt % TBPe: mCBP(2 nm)/10 wt % PtNON (4 nm)/6 wt % PtNON (10 nm)

Device 18 EML: 20 wt % PtNON (10 nm)/2 wt % TBPe: mCBP(2 nm)/10 wt % PtNON (4 nm)/2 wt % TBPe: mCBP(2 nm)/10 wt % PtNON (4 nm)/2 wt % TBPe: mCBP(2 nm)/6 wt % PtNON (10 nm)

Figure 11:
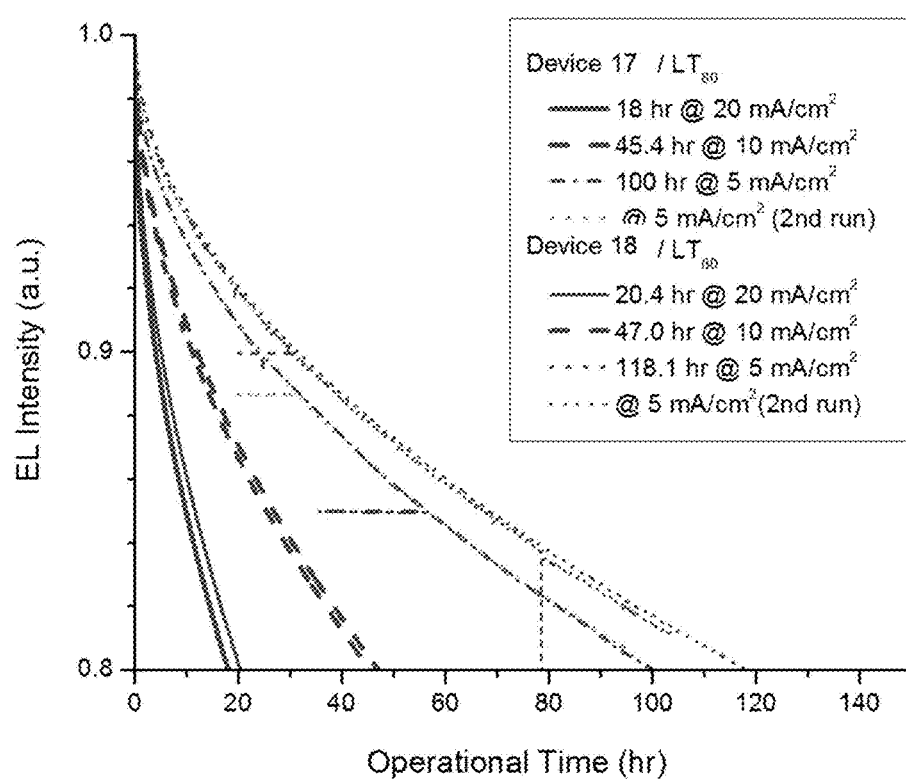
FIG. 11 shows a plot of relative intensity versus operational time for PtNON devices with doped TBPe layer.

The device efficiency remains similar for PtNON devices with doped TBPe layer, and EL spectra are blue shifted due to efficient energy transfer from PtNON to blue fluorescent emitter TBPe. FIG. 11 shows a plot of relative intensity versus operational time for PtNON devices with doped TBPe layer (Device 17 and Device 18). Unexpectedly, such devices have longer operational lifetime than PtNON only devices with improved color purity and similar device. Device 18 has better operational lifetime than Device 16 at the various current densities.

Figure 12A:
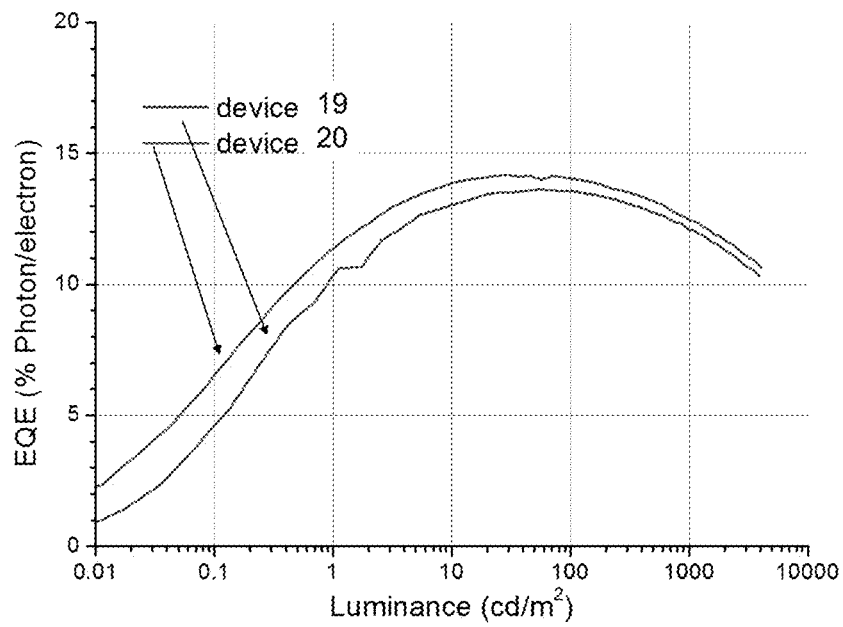
FIGS. 12A and 12B show plots of EQE versus luminance and EL intensity versus operational time, respectively, for devices with doped TBPe layer.
Figure 12B:
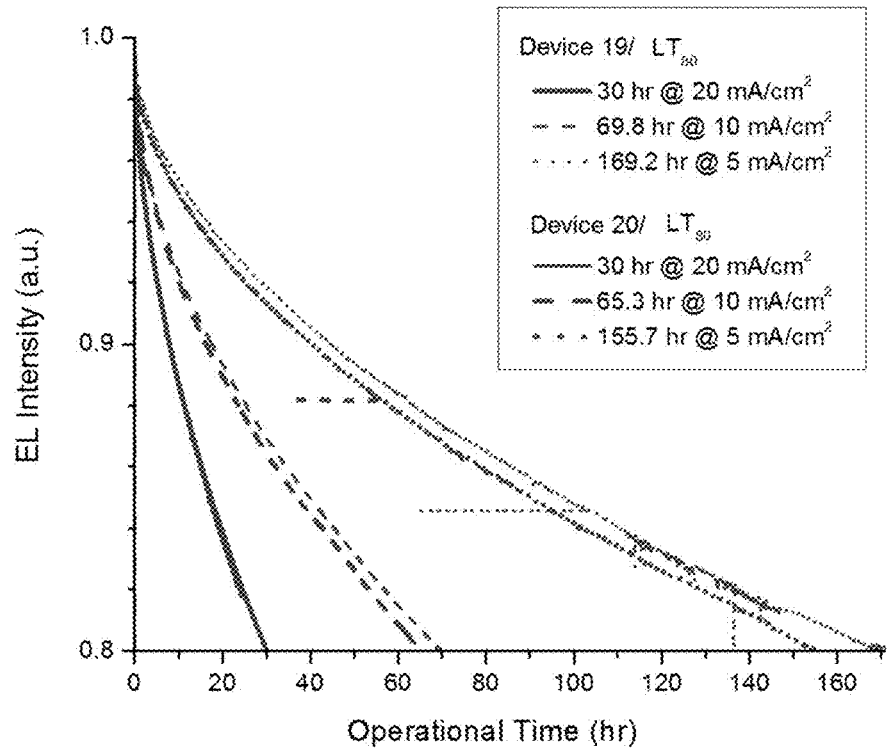

FIGS. 12A and 12B show plots of EQE versus luminance and EL intensity versus operational time, respectively, for devices with doped TBPe layer, where the devices have similar structures as Device 13 with some EML modifications:

Device 19 EML: 20 wt % PtNON (4 nm)/2 wt % TBPe: mCBP(2 nm)/20 wt % PtNON (4 nm)/2 wt % TBPe: mCBP(2 nm)/10 wt % PtNON (4 nm)/2 wt % TBPe: mCBP(2 nm)/10 wt % PtNON (4 nm)/6 wt % PtNON (10 nm)

Device 20 EML: 20 wt % PtNON (4 nm)/2 wt % TBPe: mCBP(2 nm)/20 wt % PtNON (4 nm)/2 wt % TBPe: mCBP(2 nm)/10 wt % PtNON (4 nm)/2 wt % TBPe: mCBP(2 nm)/10 wt % PtNON (4 nm)/2 wt % TBPe: mCBP(2 nm)/6 wt % PtNON (10 nm)

Although the device efficiencies drop slightly for Device 19 and Device 20, the operational lifetime further improved with more doped TBPe layers.

Figure 13:
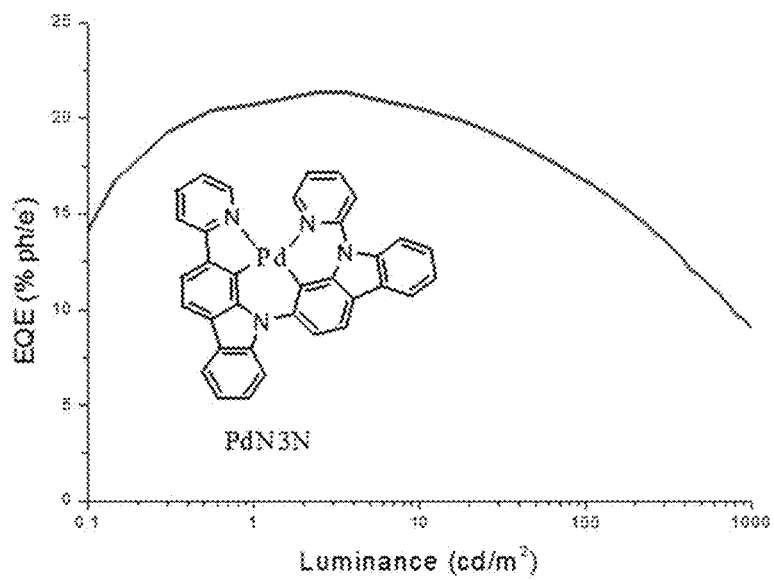
FIG. 13 shows a plot of EQE versus luminance for PdN3N device.

FIG. 13 shows a plot of EQE versus luminance for PdN3N device having the following structure:

Device 21a: ITO/HATCN/NPD(30 nm)/TAPC(10 nm)/6% PdN3N:CBP (25 nm)/DPPS(10 nm)/BmPyPB(30 nm)LiF/Al.

Figure 14:
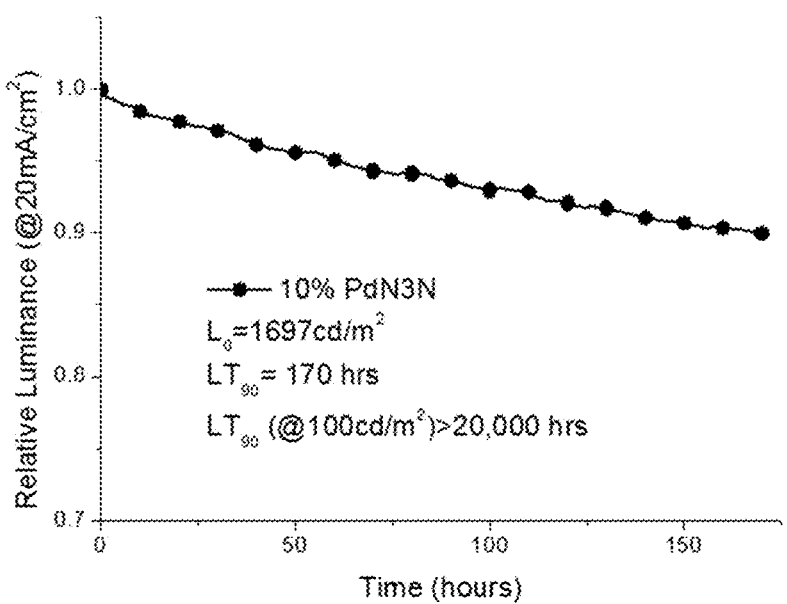
FIG. 14 shows a plot of the relative intensity versus time for PdN3N device.
Figure 15A:
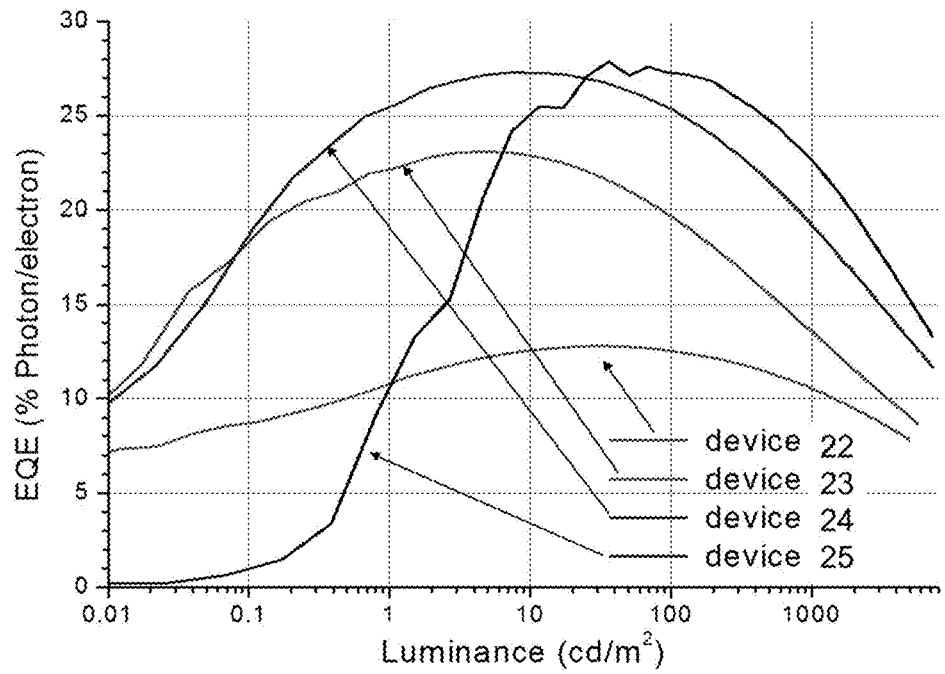
FIGS. 15A and 15B show plots of EQE versus luminance and EL intensity versus operational time, respectively, for Pd3O3 devices.
Figure 15B:
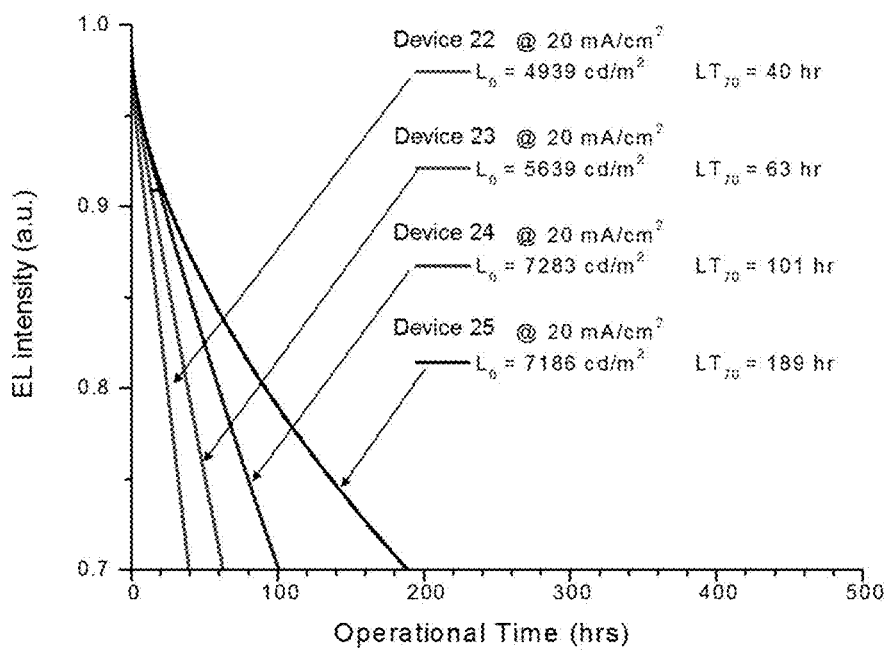

FIG. 14 shows a plot of the relative intensity versus time for PdN3N device having the following structure:

Device 21b: HATCN (10 nm)NPD(40 nm)/6% PdN3N:CBP (25 nm)/BAlq(10 nm)/Alq3(40 nm)/LiF/Al FIGS. 15A and 15B show plots of EQE versus luminance and EL intensity versus operational time, respectively, for Pd3O3 devices having the structures ITO/HATCN (10 nm)/NPD (40 nm)/TrisPCz (10 nm)/EML/BAlq (10 nm)/BPyTP (40 nm)/LiF (1 nm)/Al, where the EML is varied as follows:

Device 22: 6% Pd3O3: 26mCPy (30 nm)

Device 23: 10% Pd3O3: 26mCPy (10 nm)/6% Pd3O3: 26mCPy (20 nm)

Device 24: 20% Pd3O3: 26mCPy (10 nm)/6% Pd3O3: 26mCPy (20 nm)

Device 25: 20% Pd3O3: 26mCP (10 nm)/6% Pd3O3: 26mCPy (20 nm)

Figure 15C:
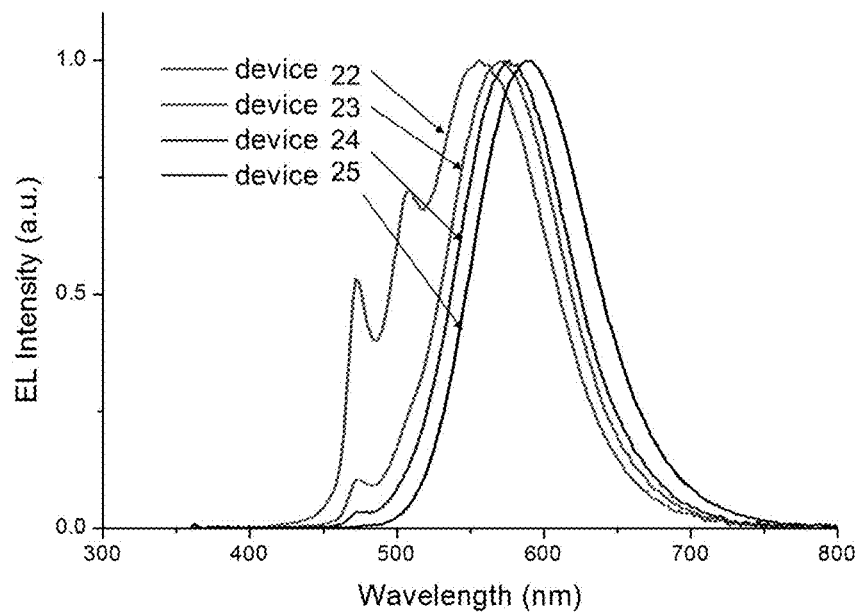
FIG. 15C shows a plot of El intensity versus wavelength for Pd3O3 devices.

FIG. 15C shows a plot of El intensity versus wavelength for Pd3O3 devices (Device 22, Device 23, Device 24, and Device 25).

Figure 16A:
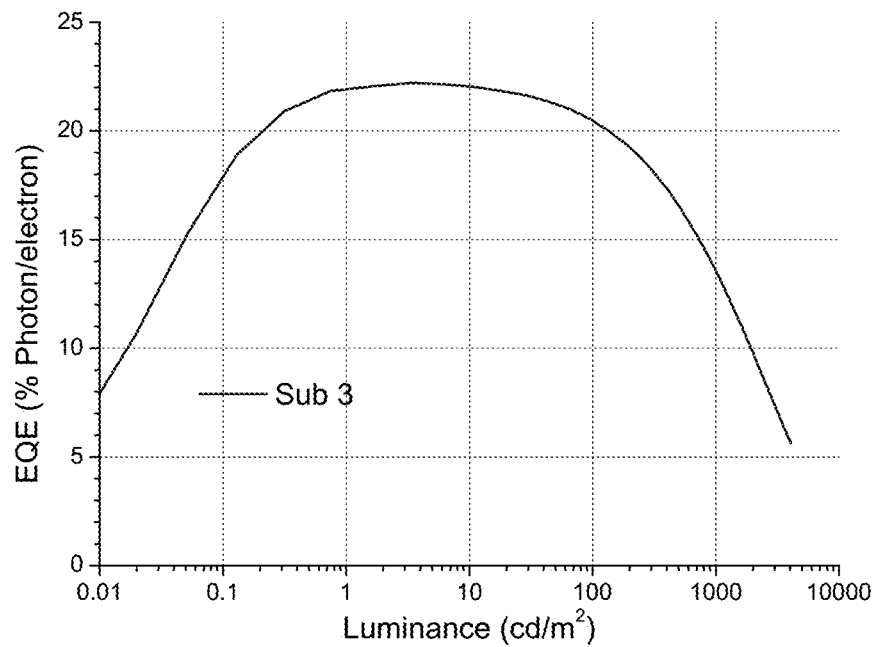
FIGS. 16A and 16B show plots of EQE versus luminance and EL intensity versus operational time, respectively, for PdN3N devices.
Figure 16B:
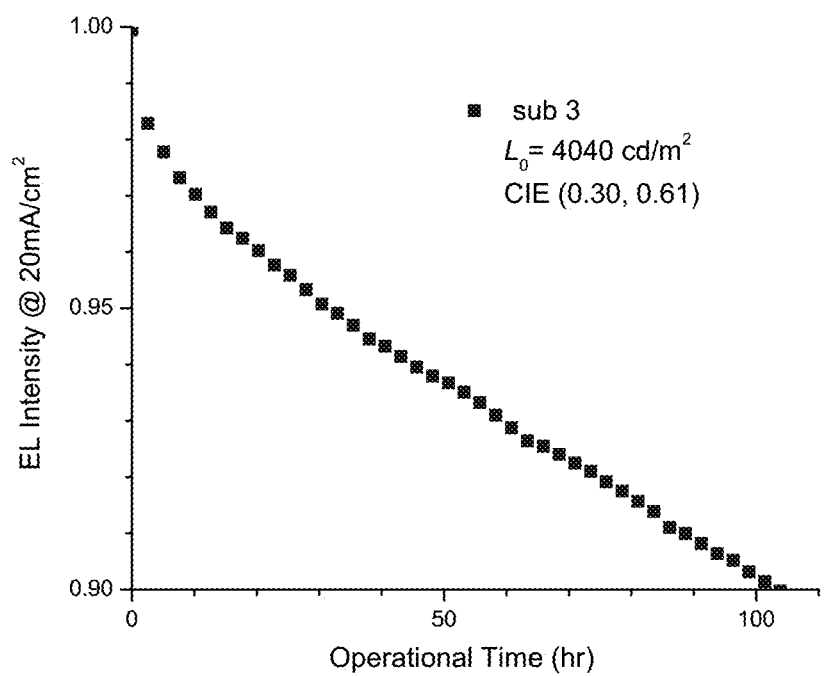

FIGS. 16A and 16B show plots of EQE versus luminance and EL intensity versus operational time, respectively, for PdN3N devices having the following structures: Device 26: HATCN(10 nm)NPD(40 nm)/TrisPCz(10 nm)/20% PdN3N:CBP(10 nm)/6% PdN3N:CBP(20 nm)/Balq(10 nm)/BPyTP (40 nm)/LiF/Al Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description. Changes may be made in the elements described herein without departing from the spirit and scope as described in the following claims.

What is claimed is:

1. An organic light emitting device comprising:
   an anode;
   a cathode; and
   an emissive layer between the anode and the cathode, the emissive layer comprising a first emissive layer in direct contact with a second emissive layer, the first emissive layer comprising a first emitter and a host and the second emissive layer comprising a second emitter and a host,
      the concentration of the first emitter in the first emissive layer exceeds the concentration of the second emitter in the second emissive layer;
      wherein the concentration of the host in the first emissive layer is less than the concentration of the host in the second emissive layer
      wherein the difference between the concentration of the first emitter in the first emissive layer and the concentration of the second emitter in the second emissive layer is equal to the difference between the concentration of the host in the second emissive layer and the concentration of the host in the first emissive layer; and
      wherein the second emissive layer is positioned between the first emissive layer and the cathode;
      wherein each of the first emitter and the second emitter comprises an organometallic complex represented by Formula I:

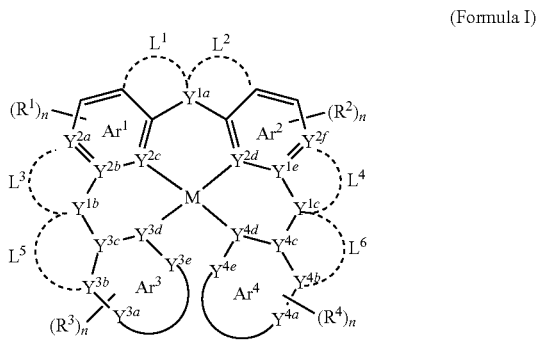

(Formula I)

wherein:
M is Pt, Pd, or Ir;
$R^1$, $R^2$, $R^3$, $R^4$, $R^8$, $R^9$, and $R^{10}$ each independently represents hydrogen, halogen, hydroxy, amino, nitro, thiol, substituted or unsubstituted $C_1$-$C_4$ alkyl, substituted or unsubstituted alkoxy, or substituted or unsubstituted aryl;

$Y^{1a}$ represents O, S, S=O, O=S=O, Se, Se=O, O=Se=O, N, $NR^{5a}$, P, $PR^{5a}$, As, $AsR^{5a}$, O=$NR^{5a}$, O=$PR^{5a}$, O=$AsR^{5a}$, B, $BR^{5a}$, $SiR^{5a}$, $SiR^{5a}R^{5b}$, $CR^{5a}$, or $CR^{5a}R^{5b}$;

$Y^{1b}$ and $Y^{1c}$ each independently represents O, S, S=O, O=S=O, Se, Se=O, O=Se=O, N, $NR^{5a}$, P, $PR^{5a}$, As, $AsR^{5a}$, O=$NR^{5a}$, O=$PR^{5a}$, O=$AsR^{5a}$, B, $BR^{5a}$, $SiR^{5a}$, $SiR^{5a}R^{5b}$, $CR^{5a}$, $CR^{5a}R^{5b}$, or a single bond, wherein if $Y^{1b}$ represents a single bond, $Y^{2e}$ and $Y^{4c}$ are directly linked by a single bond, and if $Y^{1c}$ represents a single bond, $Y^{2b}$ and $Y^{3c}$ are directly linked by a single bond;

$Y^{2a}$, $Y^{2b}$, $Y^{2c}$, $Y^{2d}$, $Y^{2e}$, and $Y^{2f}$ each independently represents C or N;

provided that only one of $Y^{2c}$ and $Y^{2d}$ represent N;

$R^{5a}$, $R^{5b}$, and $R^{5c}$ each independently represents substituted or unsubstituted $C_1$-$C_4$ alkyl or substituted or unsubstituted aryl;

$R^{6a}$, $R^{6b}$, and $R^{6c}$ each independently represents substituted or unsubstituted $C_1$-$C_4$ alkyl or substituted or unsubstituted aryl;

$R^{7a}$, $R^{7b}$, and $R^{7c}$ each independently represents substituted or unsubstituted $C_1$-$C_4$ alkyl or substituted or unsubstituted aryl;

$Y^{3a}$, $Y^{3b}$, $Y^{3c}$, $Y^{3d}$, and $Y^{3e}$ each independently represents C, N, Si, O, or S;

$Y^{4a}$, $Y^{4b}$, $Y^{4c}$, $Y^{4d}$, and $Y^{4e}$ each independently represents C, N, Si, O, or S;

each of $L^1$, $L^2$, $L^3$, $L^4$, $L^5$, and $L^6$ is independently absent or represents a linking group;

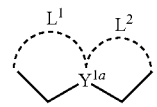

represents one of the following:

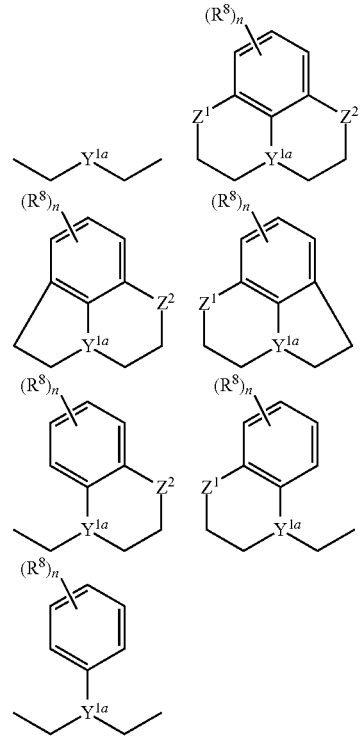

wherein $Z^1$, $Z^2$ independently represents O, S, S=O, O=S=O, Se, Se=O, O=Se=O, $NR^{5a}$, $PR^{5a}$, $AsR^{5a}$, O=$NR^{5a}$, O=$PR^{5a}$, O=$AsR^{5a}$, $BR^{5a}$, $SiR^{5a}R^{5b}$, or $CR^{5a}R^{5b}$;

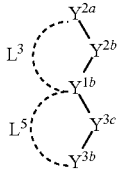

represents one of the following:

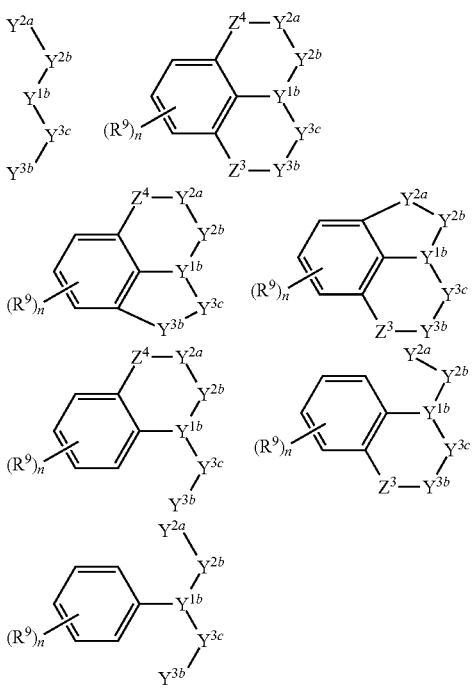

wherein $Z^3$ and $Z^4$ each independently represents O, S, S=O, O=S=O, Se, Se=O, O=Se=O, $NR^{6a}$, $PR^{6a}$, $AsR^{6a}$, O=$NR^{6a}$, O=$PR^{6a}$, O=$AsR^{6a}$, $BR^{6a}$, $SiR^{6a}R^{6b}$, or $CR^{6a}R^{6b}$;

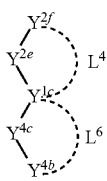

represents one of the following:

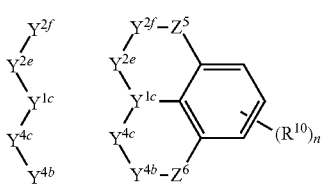

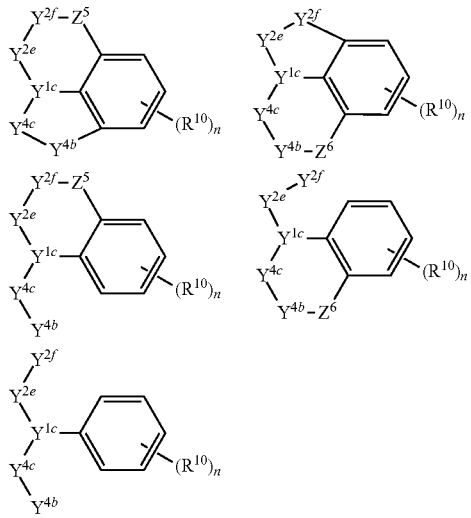

wherein $Z^5$ and $Z^6$ each independently represents O, S, S=O, O=S=O, Se, Se=O, O=Se=O, $NR^{7a}$, $PR^{7a}$, $AsR^{7a}$, O=$NR^{7a}$, O=$PR^{7a}$, O=$AsR^{7a}$, $BR^{7a}$, $SiR^{7a}R^{7b}$, or $CR^{7a}R^{7b}$;

$Ar^3$ and $Ar^4$ each independently represents a substituted or unsubstituted 5-membered ring or a 6-membered aromatic ring; and n is 0, 1, 2, 3, 4, 5, or 6.

2. The organic light emitting device of claim 1, wherein the emissive layer comprises a third emissive layer comprising a third emitter and a host, wherein the third emissive layer is in direct contact with the second emissive layer, the concentration of the second emitter in the second emissive layer exceeds the concentration of the third emitter in the third emissive layer;

the concentration of the host in the second emissive layer is less than the concentration of the host in the third emissive layer; and wherein the third emissive layer is positioned between the second emissive layer and the cathode.

3. The organic light emitting device of claim 2, wherein the emissive layer comprises a fourth emissive layer comprising a fourth emitter and a host, wherein the fourth emissive layer is in direct contact with the third emissive layer, the concentration of the third emitter in the third emissive layer exceeds the concentration of the fourth emitter in the fourth emissive layer;

the concentration of the host in the third emissive layer is less than the concentration of the host in the fourth emissive layer; and wherein the fourth emissive layer is positioned between the third emissive layer and the cathode.

4. The organic light emitting device of claim 1, wherein the first emitter and the second emitter are the same.

5. The organic light emitting device of claim 1, wherein at least one of the first and second emitters emits red or blue light.

6. The organic light emitting device of claim 1, wherein the organometallic complex is represented by Formula II:

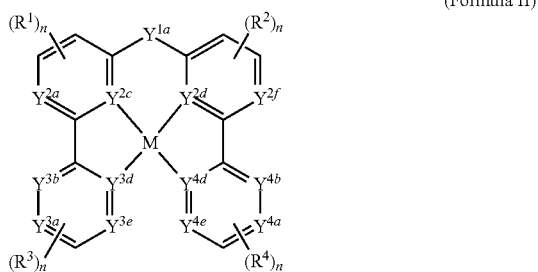

(Formula II)

wherein:
M is Pt, Pd, or Ir;
$R^1$, $R^2$, $R^3$, and $R^4$ each independently represents hydrogen, halogen, hydroxy, amino, nitro, thiol, substituted or unsubstituted $C_1$-$C_4$ alkyl, substituted or unsubstituted alkoxy, or substituted or unsubstituted aryl;
$Y^{1a}$ represents O, S, S=O, O=S=O, Se, Se=O, O=Se=O, $NR^{5a}$, $PR^{5a}$, $AsR^{5a}$, O=$NR^{5a}$, O=$PR^{5a}$, O=$AsR^{5a}$, $BR^{5a}$, $SiR^{5a}R^{5b}$, or $CR^{5a}R^{5b}$;
$Y^{2a}$, $Y^{2c}$, $Y^{2d}$, and $Y^{2f}$ each independently represents C or N;
provided that only one of $Y^{2c}$ and $Y^{2d}$ represent N;
$R^{5a}$, $R^{5b}$, and $R^{5c}$ each independently represents substituted or unsubstituted $C_1$-$C_4$ alkyl or substituted or unsubstituted aryl;
$Y^{3a}$, $Y^{3b}$, $Y^{3d}$, and $Y^{3e}$ each independently represents C, N, or Si;
$Y^{4a}$, $Y^{4b}$, $Y^{4d}$, and $Y^{4e}$ each independently represents C, N, or Si;
n is 0, 1, 2, 3, or 4.

7. The organic light emitting device of claim 1, wherein the organometallic complex is represented by Formula III:

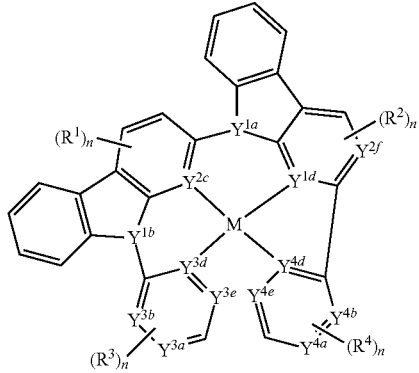

(Formula III)

wherein:
M is Pt, Pd, or Ir;
$R^1$, $R^2$, $R^3$, and $R^4$ each independently represents hydrogen, halogen, hydroxy, amino, nitro, thiol, substituted or unsubstituted $C_1$-$C_4$ alkyl, substituted or unsubstituted alkoxy, or substituted or unsubstituted aryl;
$Y^{1a}$ represents N, P, As, B, $SiR^{5a}$, or $CR^{5a}$;
$Y^{1b}$ represents N, P, As, B, $SiR^{5a}$, or $CR^{5a}$;
$Y^{2c}$, $Y^{2d}$, and $Y^{2f}$ each independently represents C or N;
provided that only one of $Y^{2d}$ and $Y^{2c}$ represent N;
$R^{5a}$ each independently represents substituted or unsubstituted $C_1$-$C_4$ alkyl or substituted or unsubstituted aryl;
$Y^{3a}$, $Y^{3b}$, $Y^{3d}$, and $Y^{3e}$ each independently represents C, N, or Si;
$Y^{4a}$, $Y^{4b}$, $Y^{4d}$, and $Y^{4e}$ each independently represents C, N, or Si; and
n is 0, 1, 2, 3, 4, or 5.

8. The organic light emitting device of claim 7, wherein:
M is Pt or Pd;
$R^1$, $R^2$, $R^3$, and $R^4$ each independently represents hydrogen, halogen, hydroxy, amino, nitro, thiol, substituted or unsubstituted $C_1$-$C_4$ alkyl, substituted or unsubstituted alkoxy, or substituted or unsubstituted aryl;
$Y^{1a}$ represents N, P, $SiR^{5a}$, or $CR^{5a}$;
$Y^{1b}$ represents N, P, $SiR^{5a}$, or $CR^{5a}$;
$Y^{2c}$, $Y^{2d}$, and $Y^{2f}$ each independently represents C or N;
provided that only one of $Y^{2d}$ and $Y^{2c}$ represent N;
$R^{5a}$ each independently represents substituted or unsubstituted $C_1$-$C_4$ alkyl or substituted or unsubstituted aryl;
$Y^{3a}$, $Y^{3b}$, $Y^{3d}$, and $Y^{3e}$ each independently represents C or N;
$Y^{4a}$, $Y^{4b}$, $Y^{4d}$, and $Y^{4e}$ each independently represents C or N; and
n is 0, 1, or 2.

9. The organic light emitting device of claim 1, wherein the organometallic complex is represented by Formula IV:

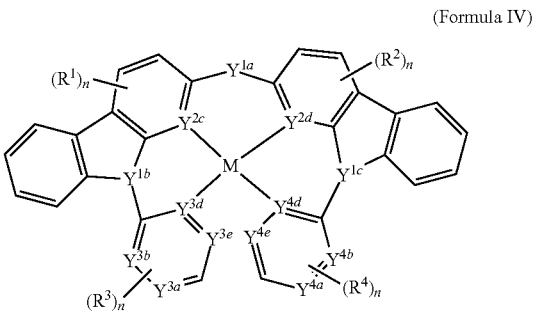

(Formula IV)

wherein:
M is Pt, Pd, or Ir;
$R^1$, $R^2$, $R^3$, or $R^4$ each independently represents hydrogen, halogen, hydroxy, amino, nitro, thiol, substituted or unsubstituted $C_1$-$C_4$ alkyl, substituted or unsubstituted alkoxy, or substituted or unsubstituted aryl;
$Y^{1a}$ represents O, S, S=O, O=S=O, Se, Se=O, O=Se=O, $NR^{5a}$, $PR^{5a}$, $AsR^{5a}$, O=$NR^{5a}$, O=$PR^{5a}$, O=$AsR^{5a}$, $BR^{5a}$, $SiR^{5a}R^{5b}$, or $CR^{5a}R^{5b}$;
$Y^{1b}$ and $Y^{1c}$ each independently represents N, P, As, B, $SiR^{5a}$, or $CR^{5a}$;
$Y^{2c}$ or $Y^{2d}$ each independently represents C or N;
provided that only one of $Y^{2d}$ and $Y^{2c}$ represent N;
$R^{5a}$ and $R^{5b}$ each independently represents substituted or unsubstituted $C_1$-$C_4$ alkyl or substituted or unsubstituted aryl;
$Y^{3a}$, $Y^{3b}$, $Y^{3d}$, and $Y^{3e}$ each independently represents C, N, or Si;
$Y^{4a}$, $Y^{3b}$, $Y^{3d}$, and $Y^{4e}$ each independently represents C, N, or Si; and
n is 0, 1, 2, 3, 4, or 5.

10. The organic light emitting device of claim 1, wherein the organometallic complex has one of the following structures:

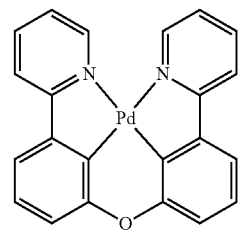

-continued

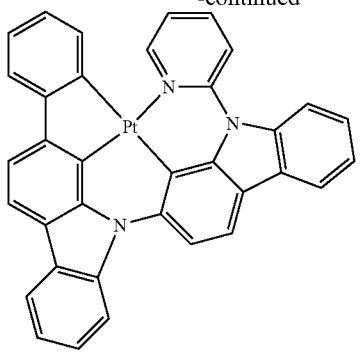

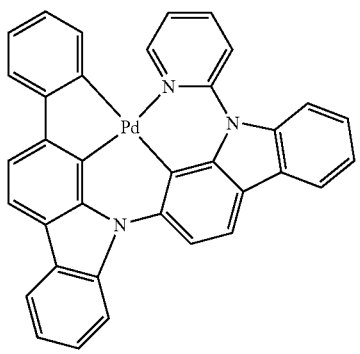

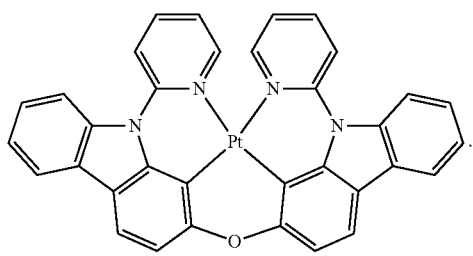

11. The organic light emitting device of claim 1, comprising an electron blocking layer between the anode and the emissive layer.

12. The organic light emitting device of claim 11, wherein the electron blocking layer comprises a host material and a dopant.

13. The organic light emitting device of claim 12, wherein host material comprises a carbazole-based material.

14. The organic light emitting device of claim 13, wherein the carbazole-based material comprises one of the following structures:

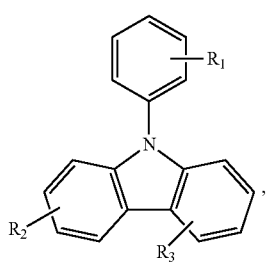

-continued

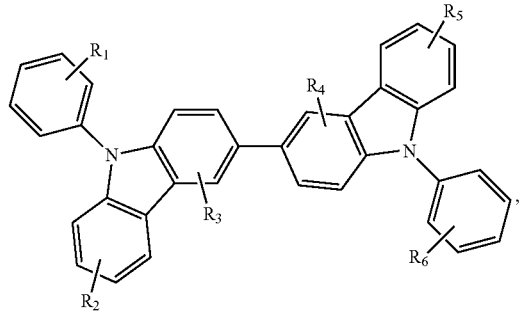

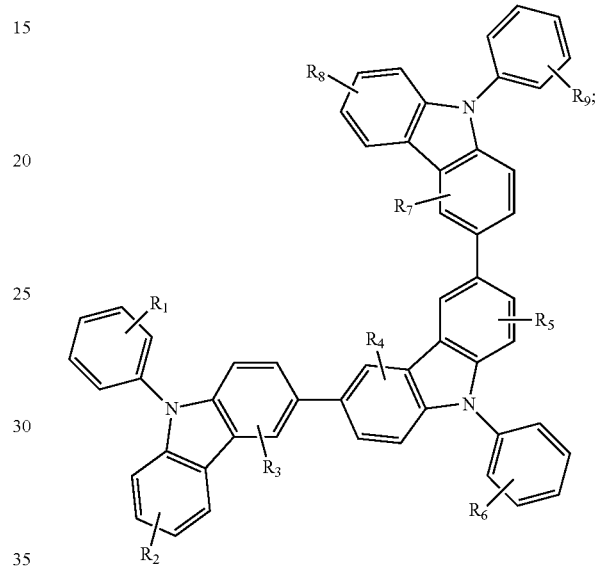

wherein each of $R^1$-$R^9$ is independently hydrogen, nitro, hydroxyl, halogen, or substituted or unsubstituted amino, thio, alkyl, alkenyl, alkynyl, aryl, heteroaryl, cycloalkane, cycloalkane, heterocyclyl, alkoxy, haloalkyl, arylalkane, or arylalkene.

15. The organic light emitting device of claim 12, wherein the dopant is a fluorescent material.

16. The organic light emitting device of claim 15, wherein the fluorescent material comprises one of the following structures:

1. Aromatic Hydrocarbons and Their Derivatives

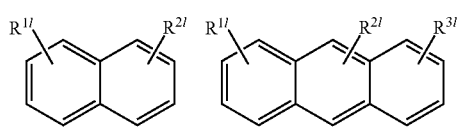

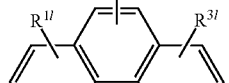

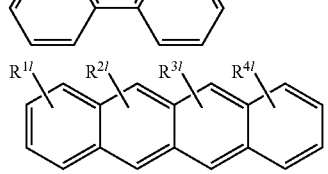

-continued
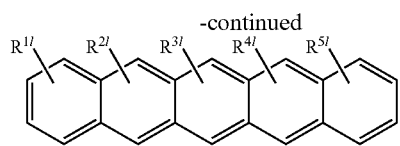
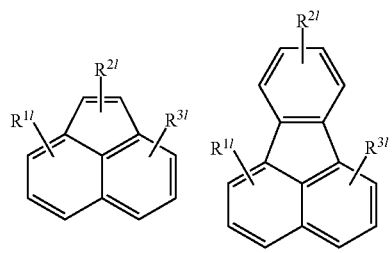
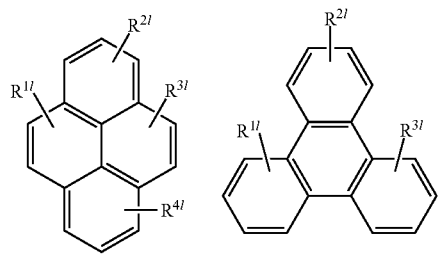
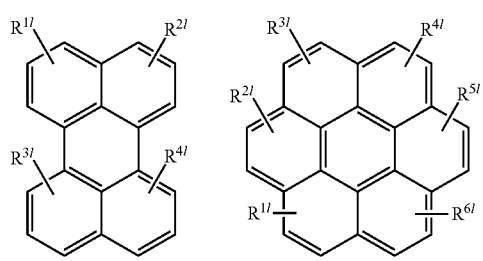
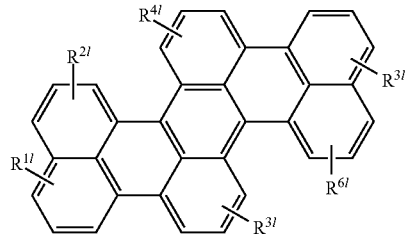
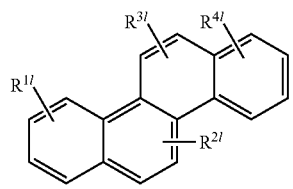
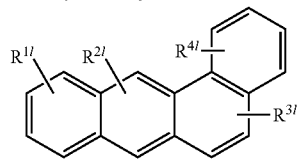
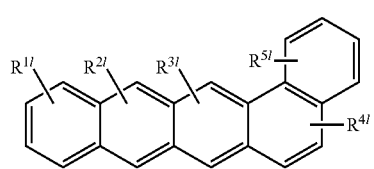
-continued
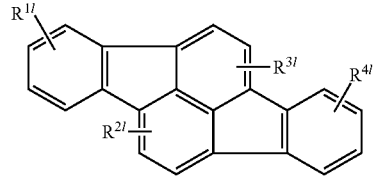
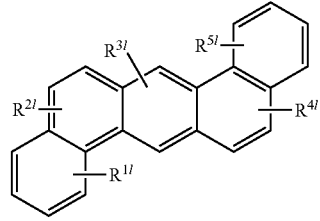
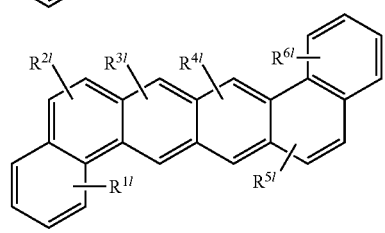
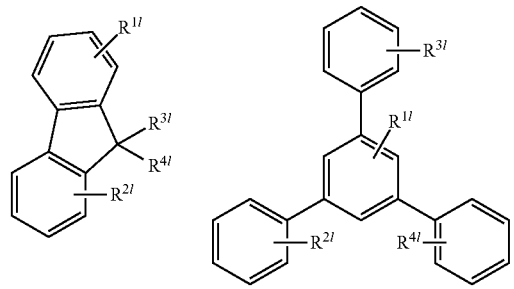
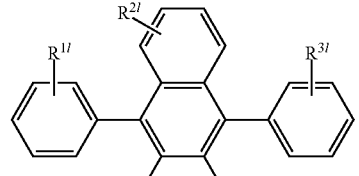
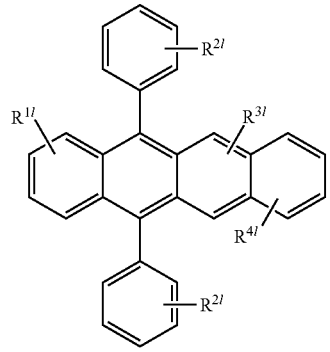
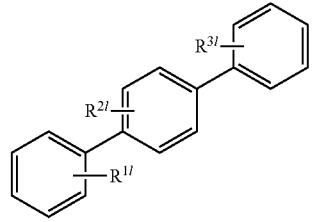

-continued
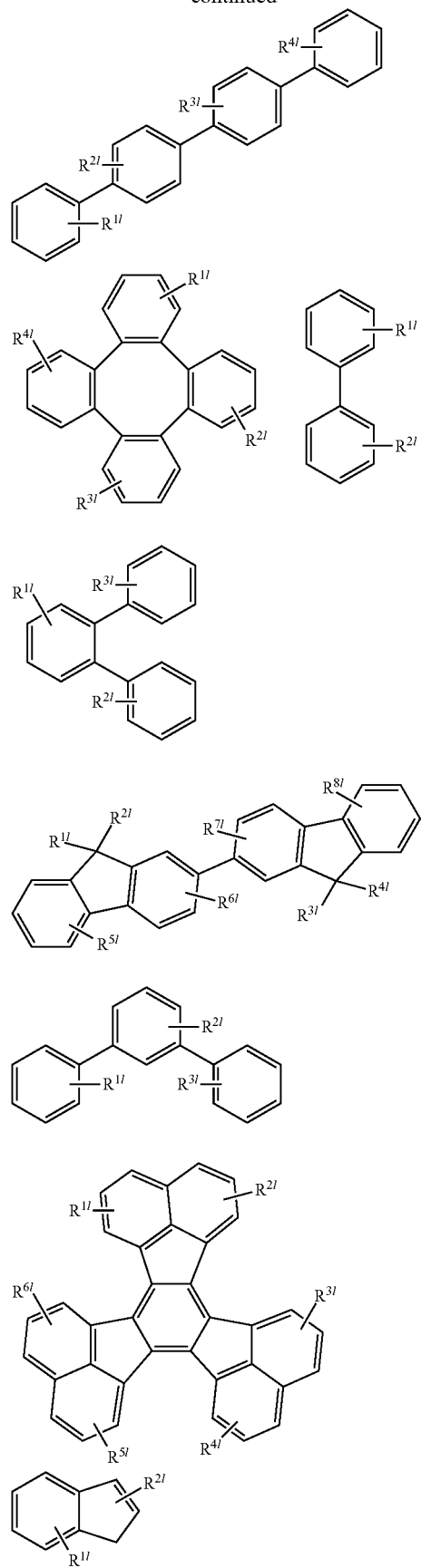
-continued
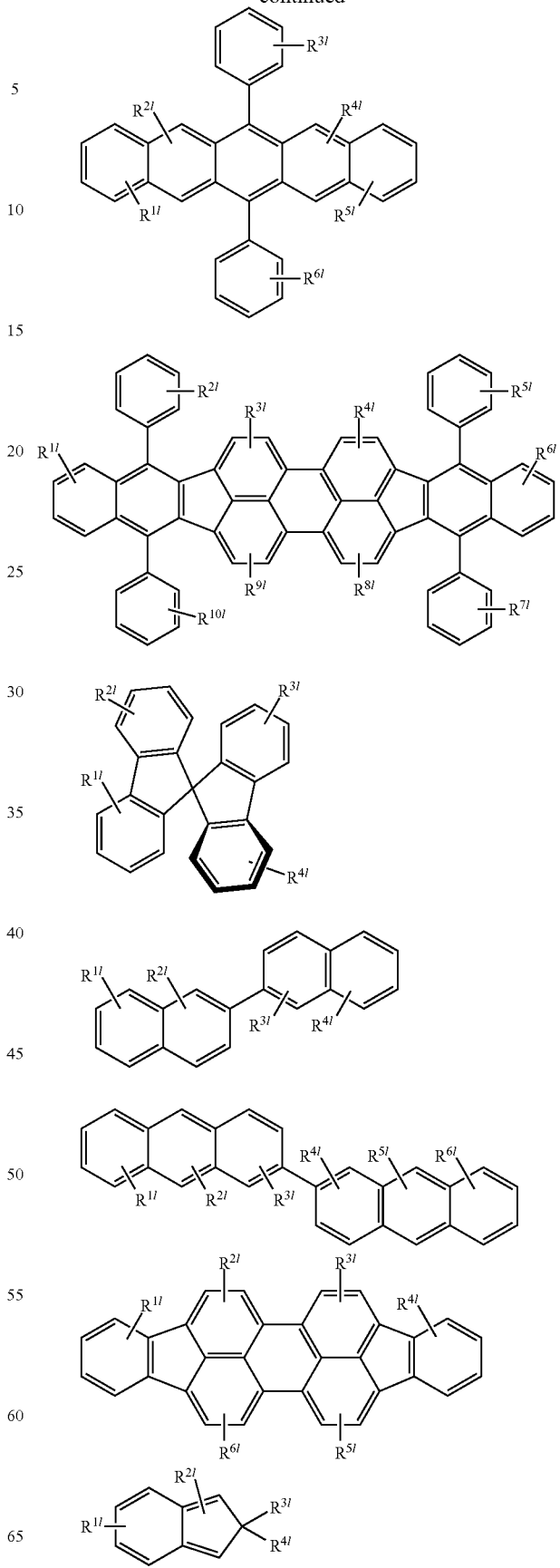

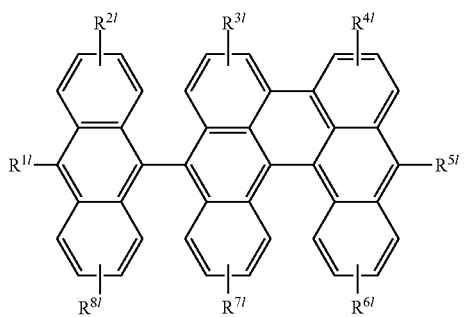
2. Arylethylene, Arylacetylene and Their Derivatives
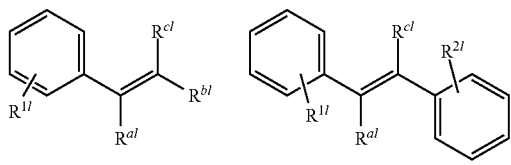
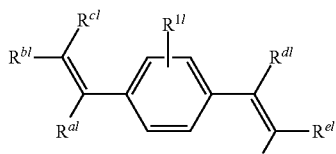
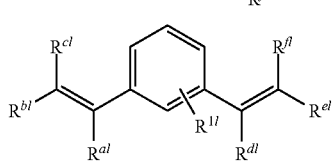
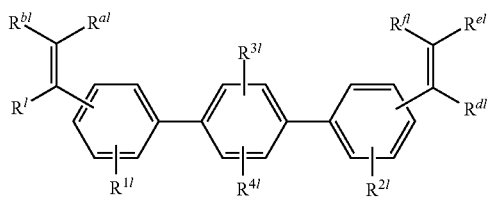
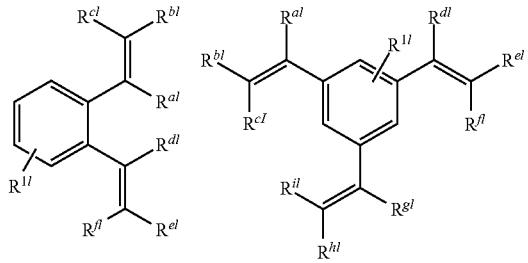
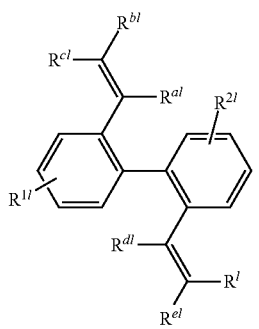
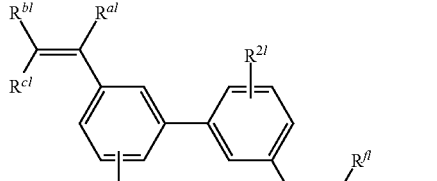
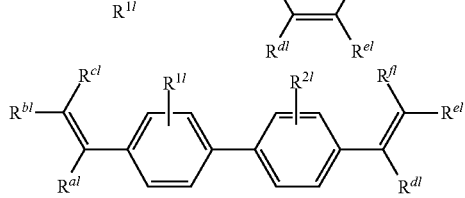
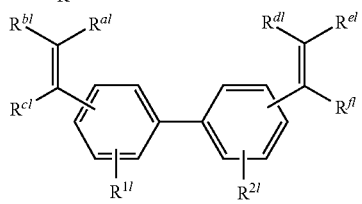
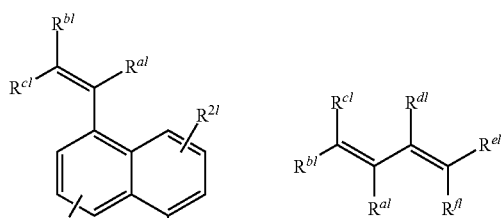
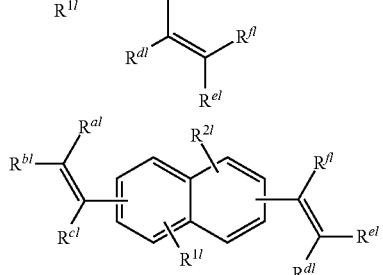
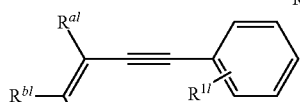
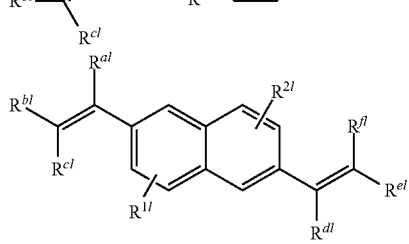
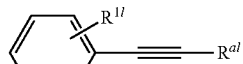
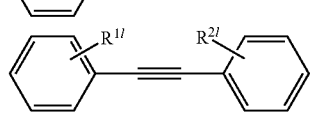
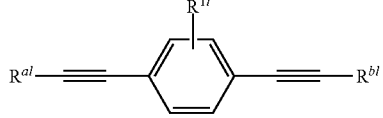

-continued
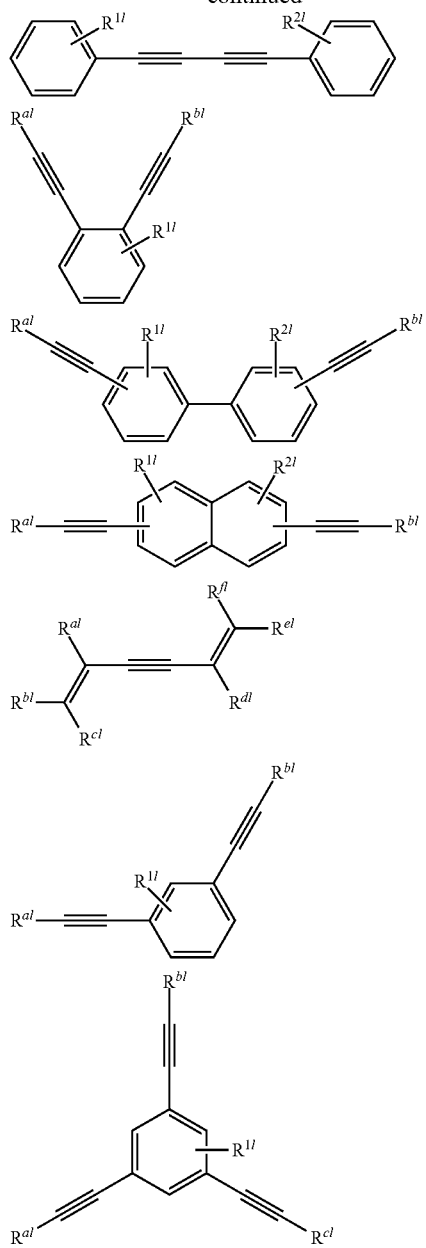
where each of $R^{al}$, $R^{bl}$, $R^{cl}$, $R^{dl}$, $R^{el}$, $R^{fl}$, $R^{gl}$, $R^{hl}$ and $R^{il}$ can be one of the following structure:
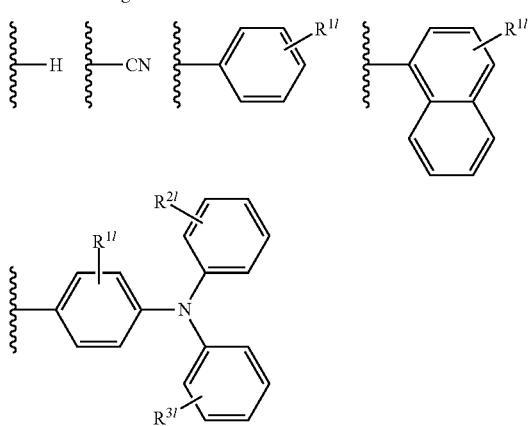
-continued
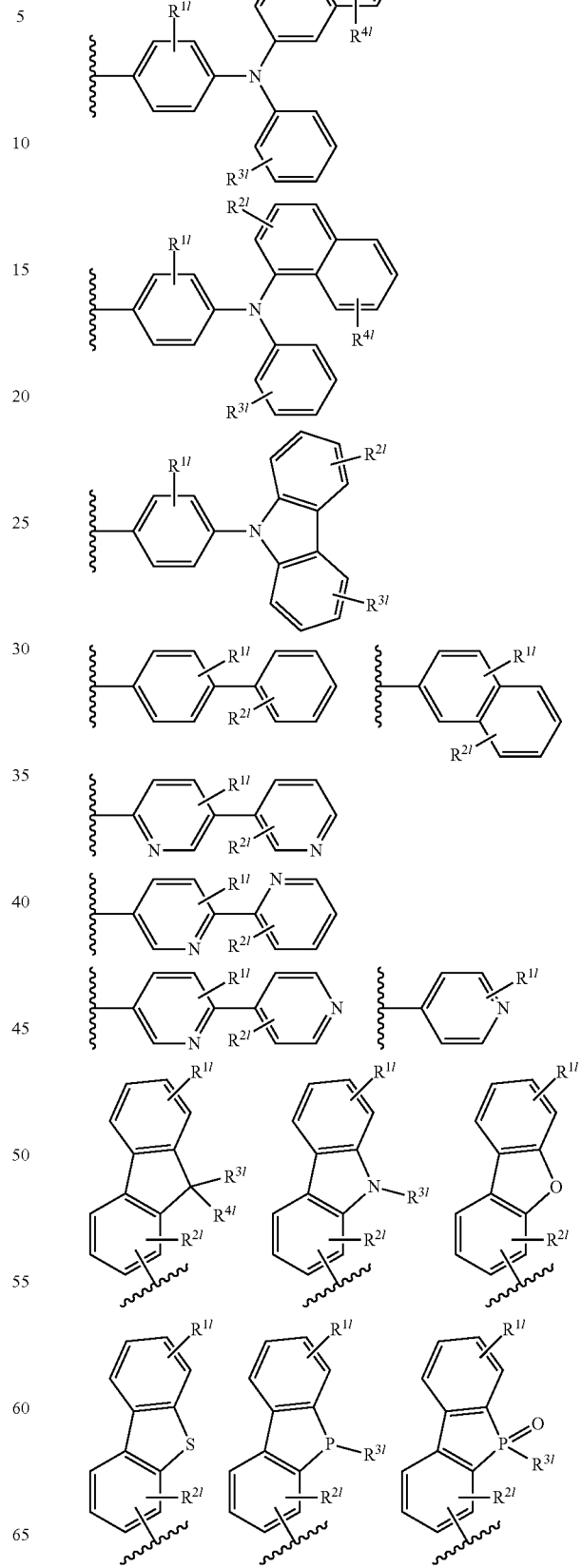

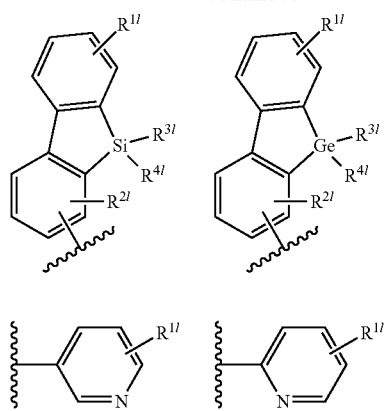
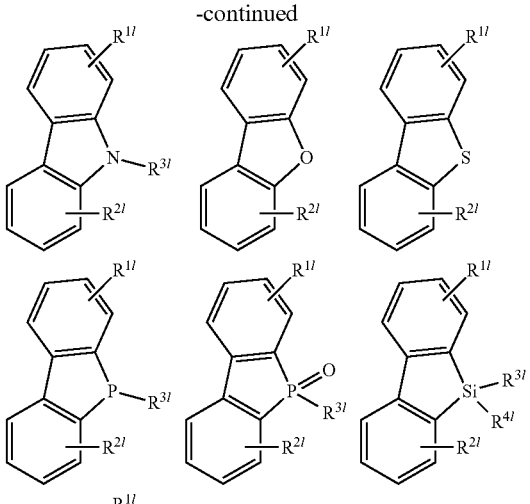
3. Heterocyclic Compounds and Their Derivatives
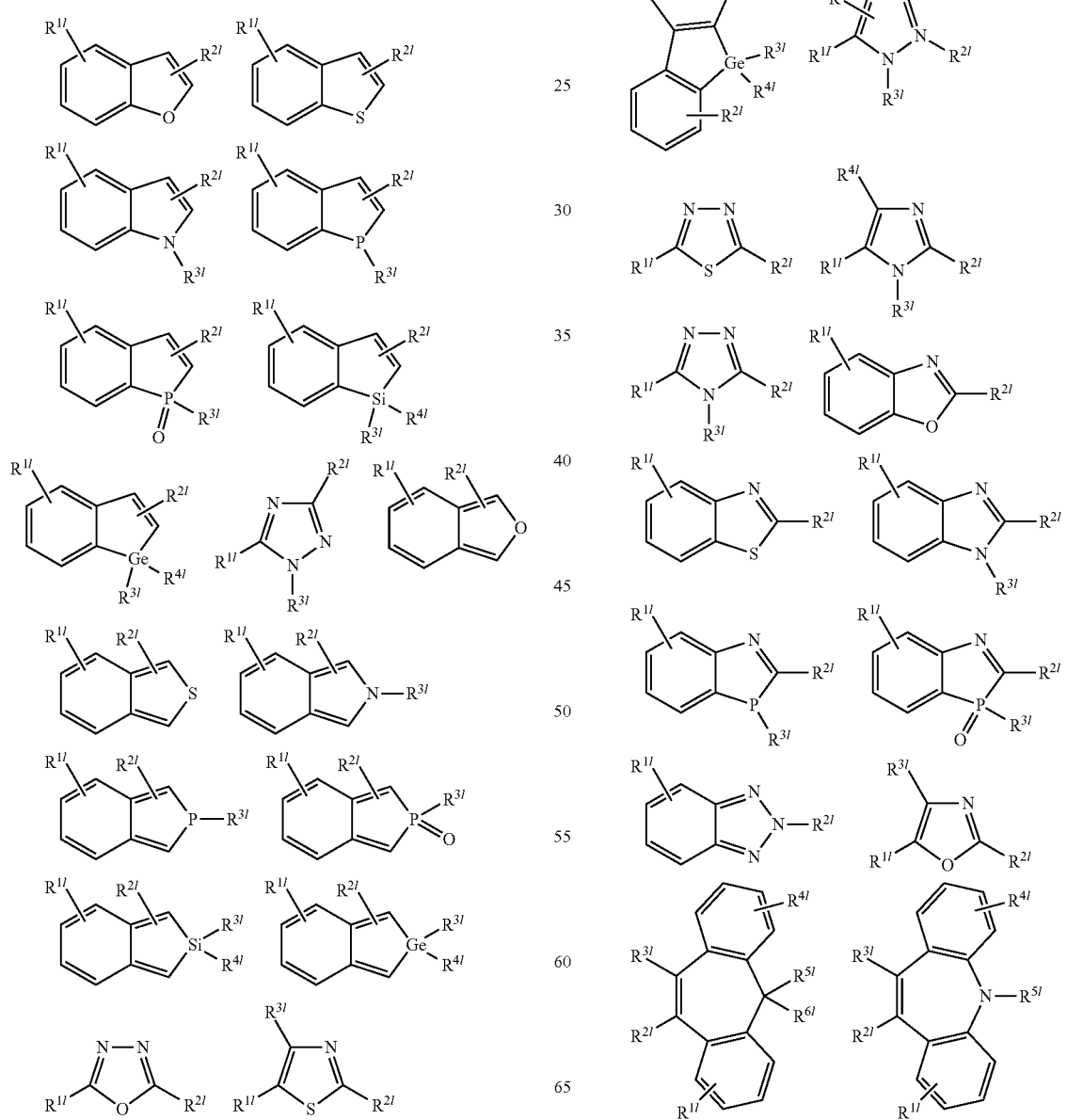

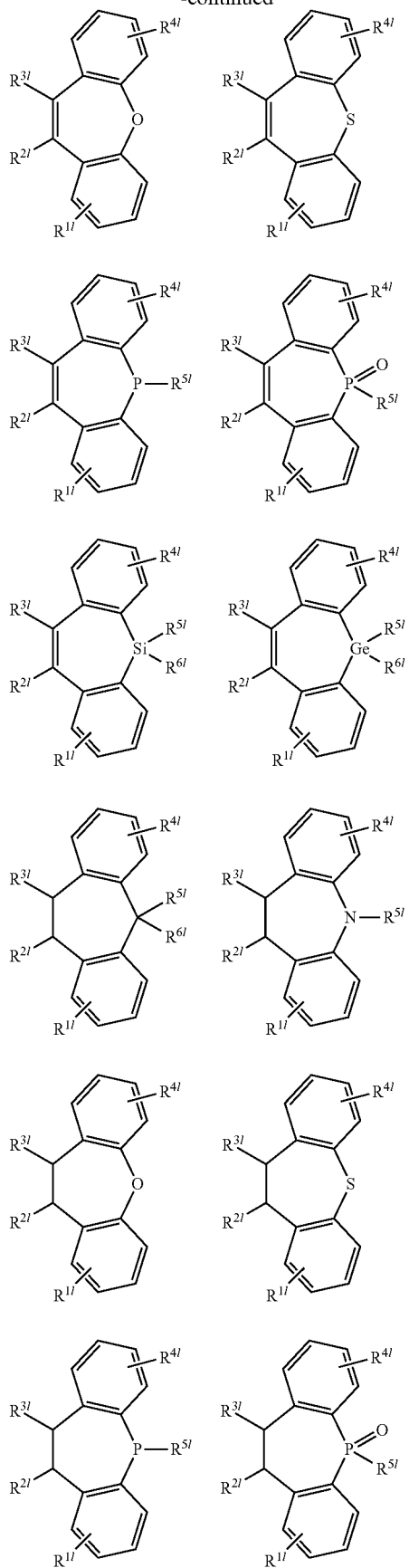
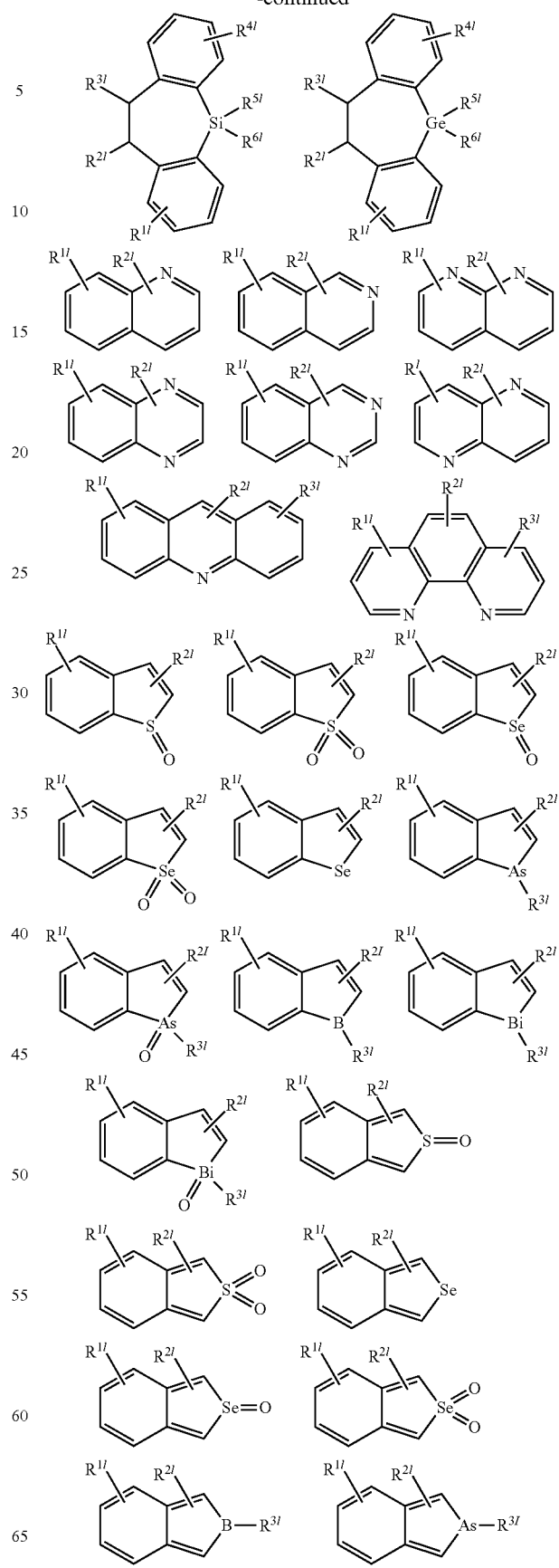

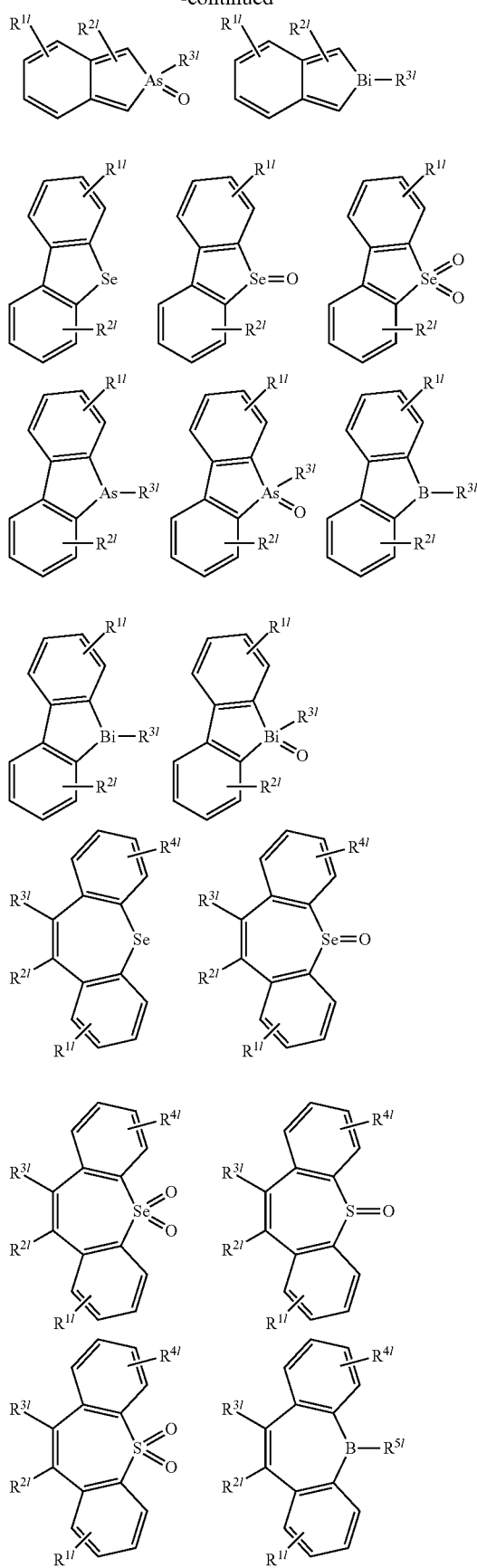
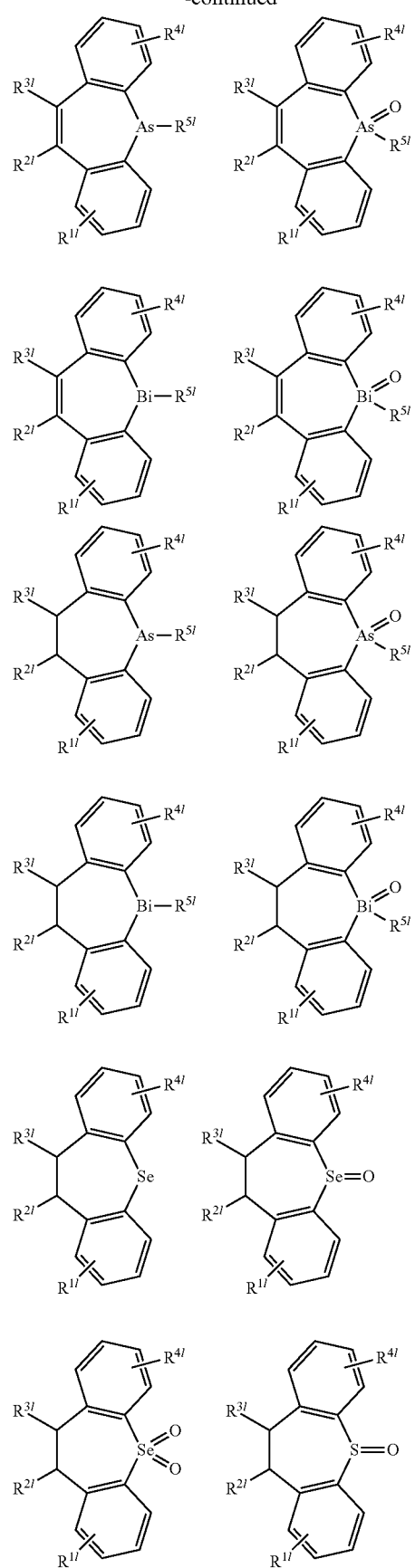

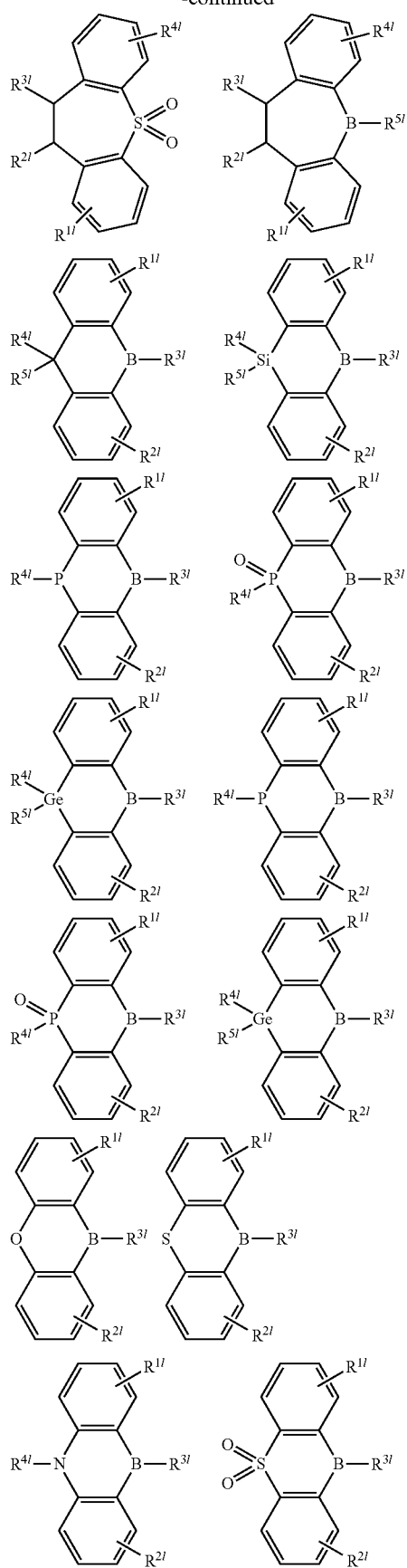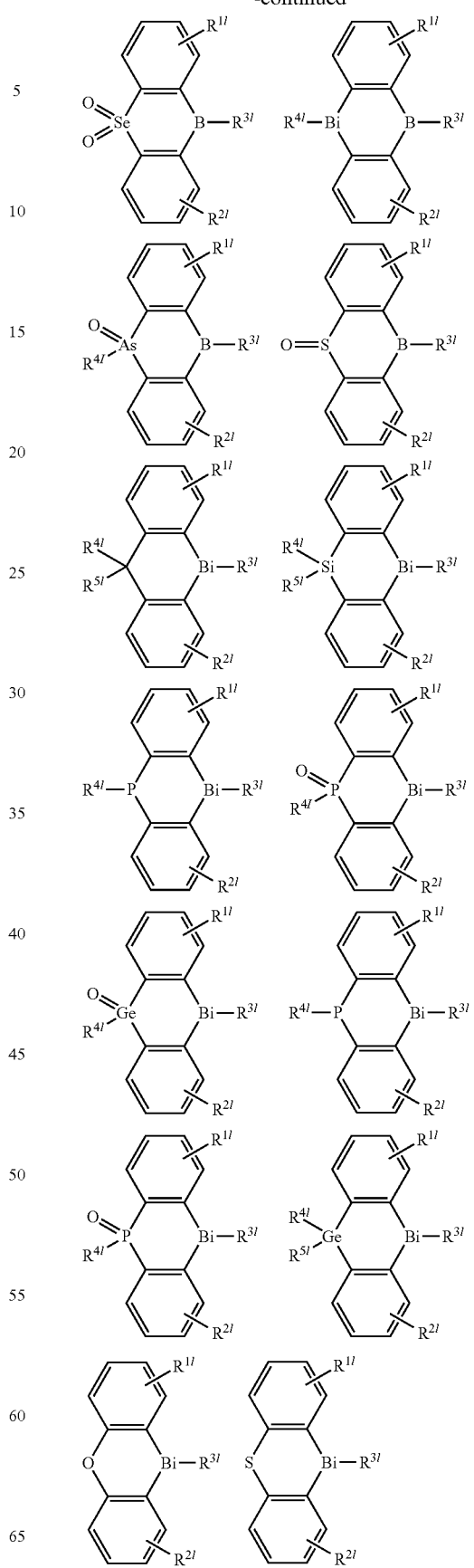

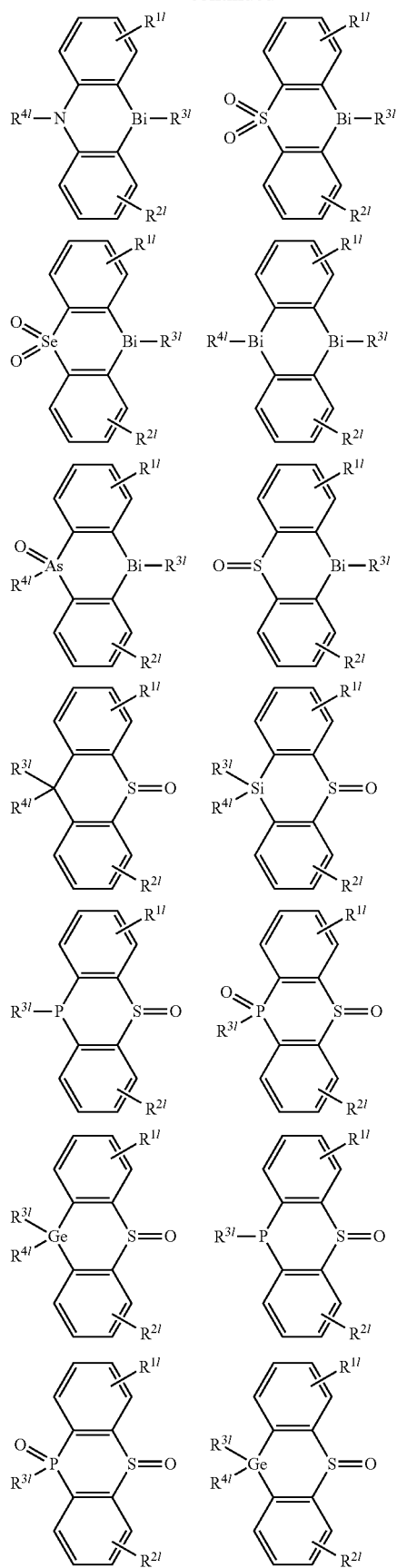
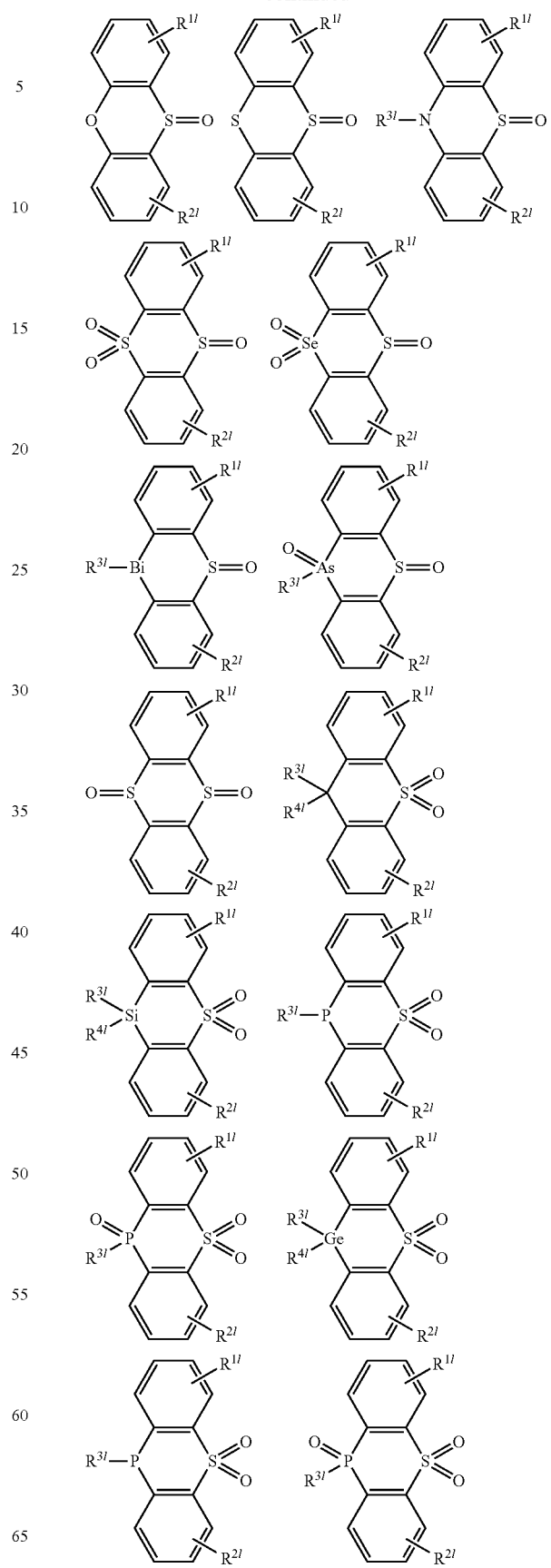

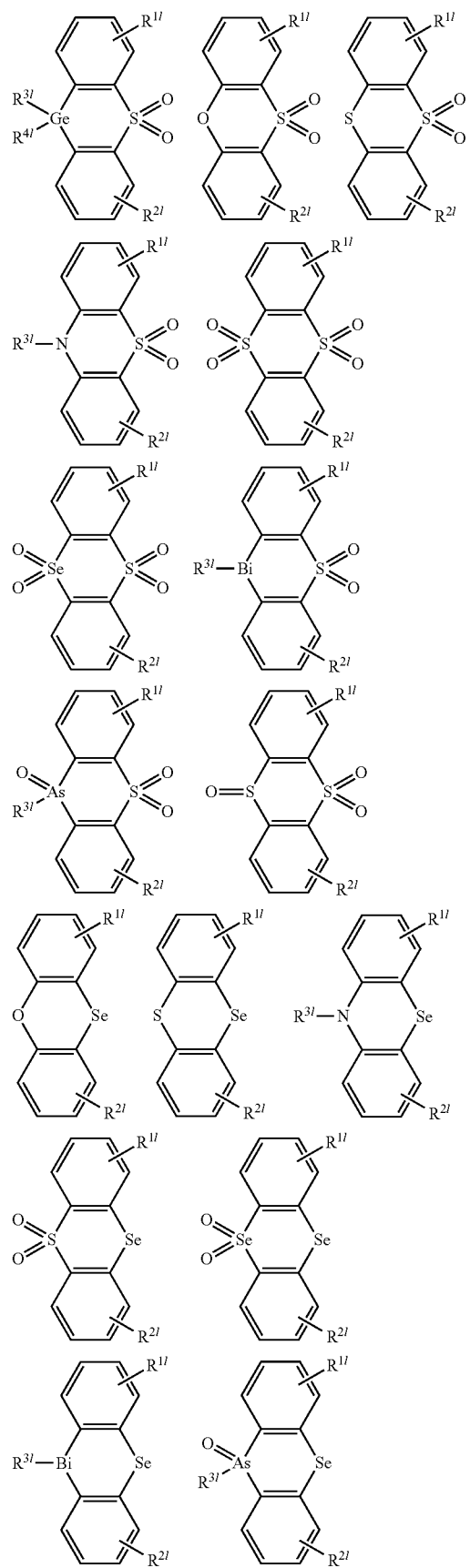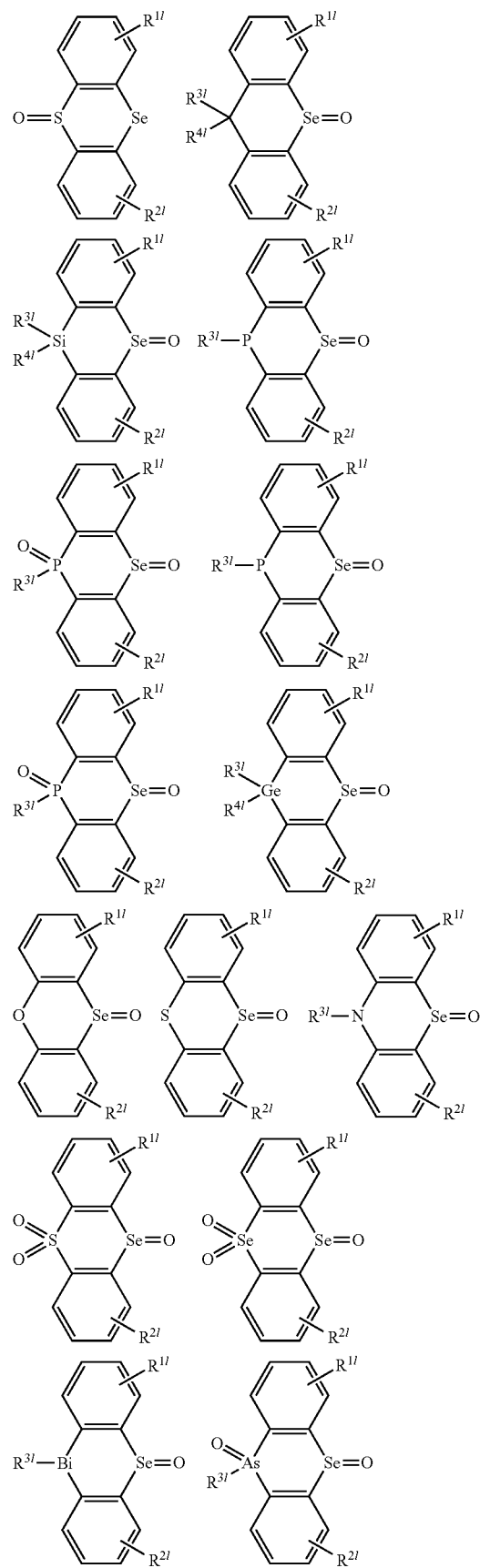

-continued
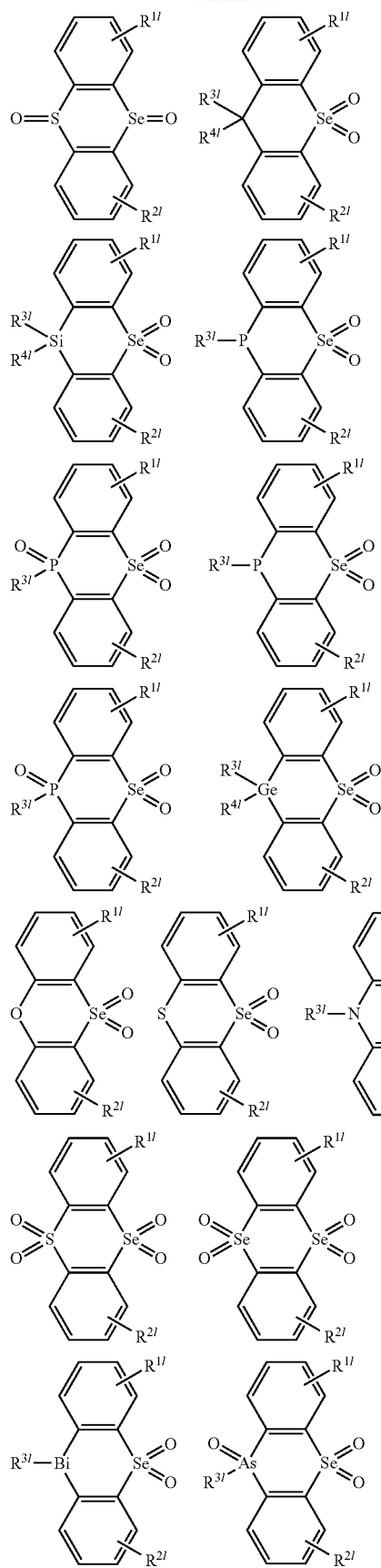
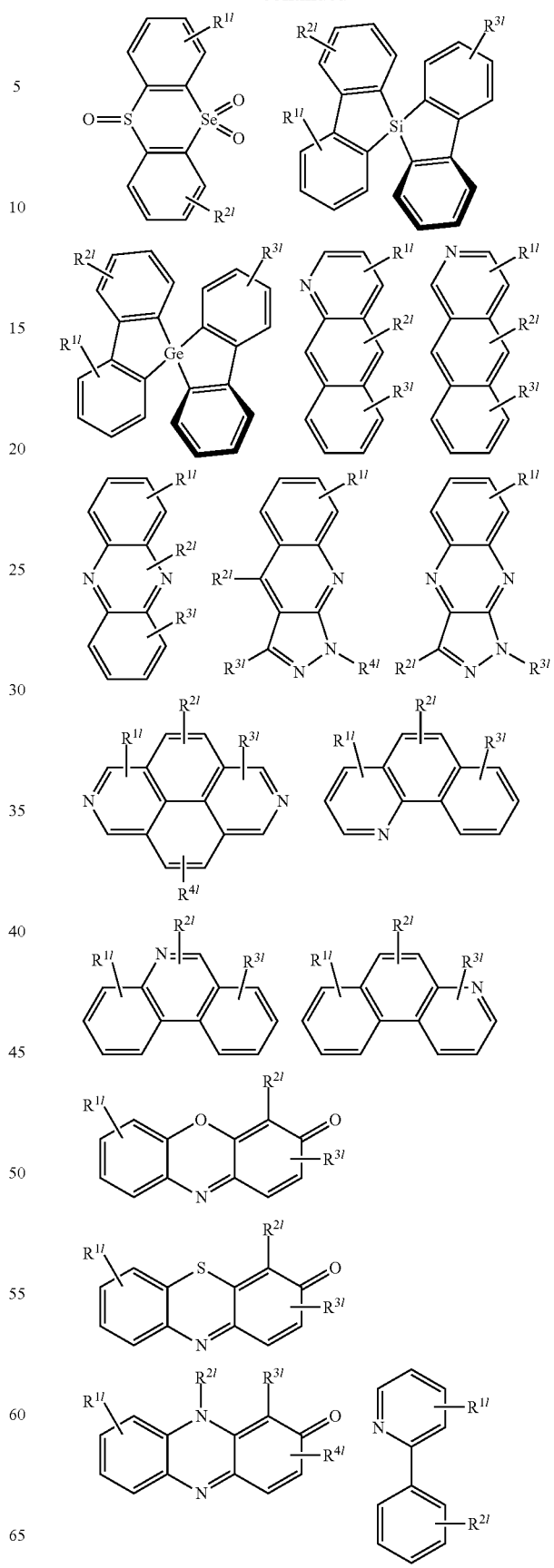

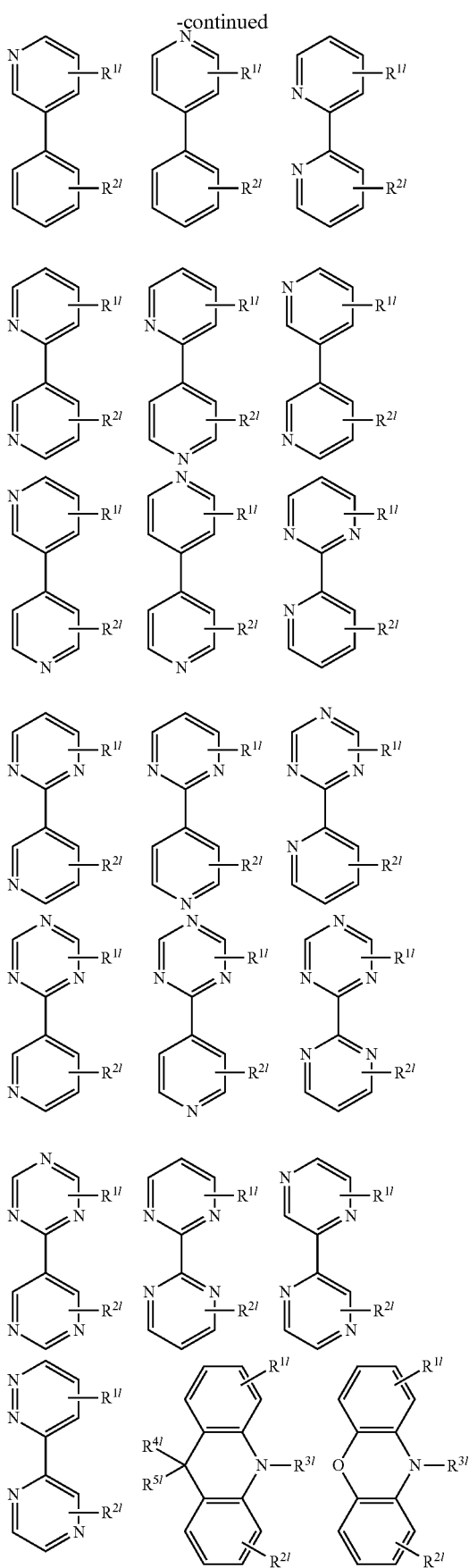
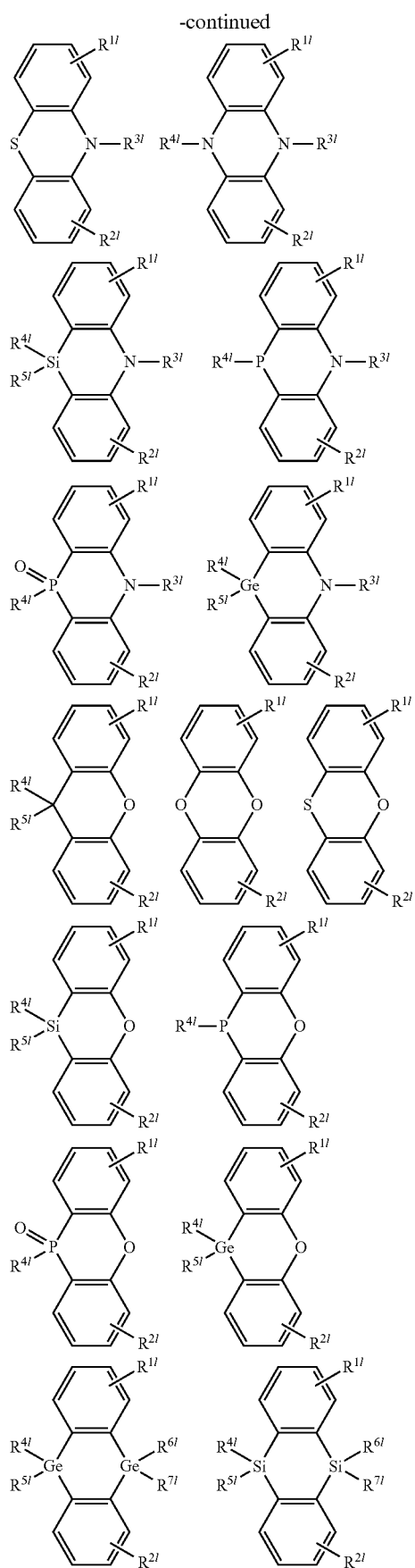

-continued
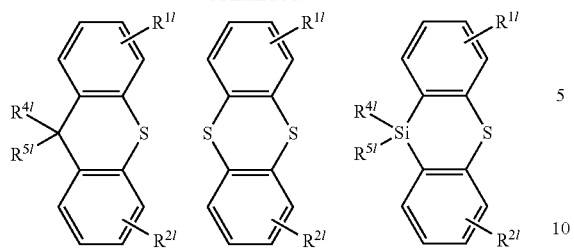
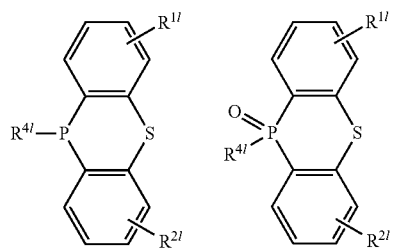
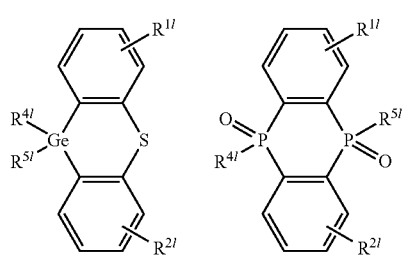
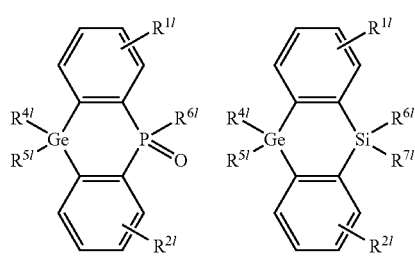
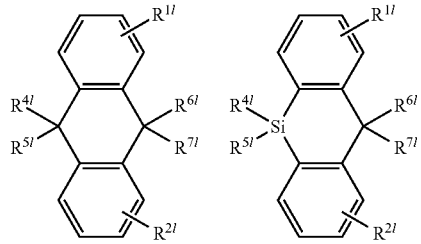
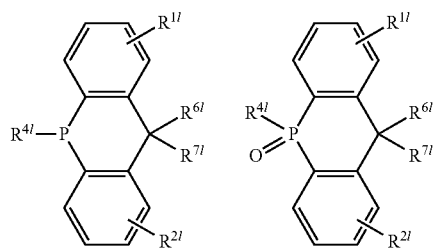
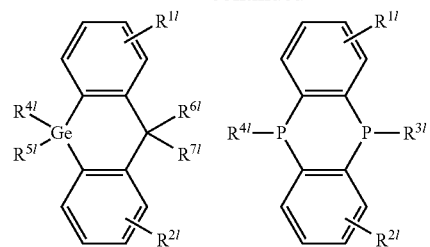
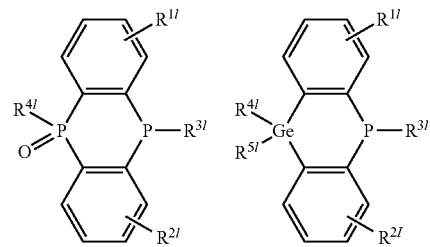
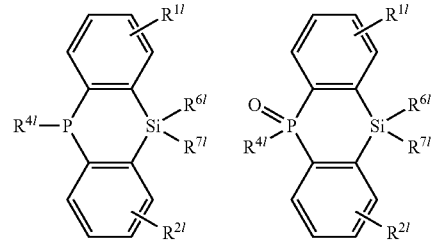
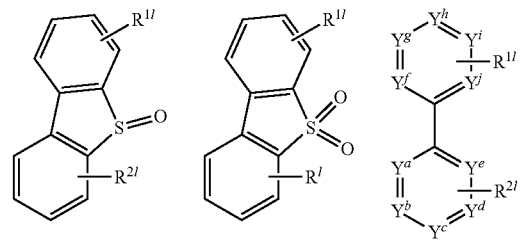
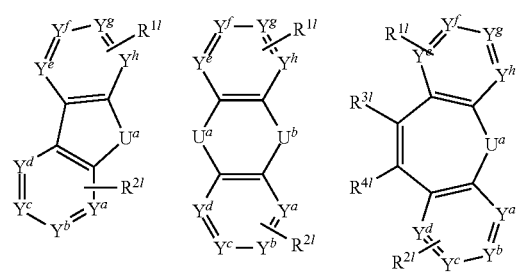
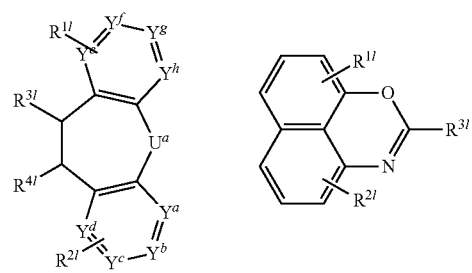

-continued

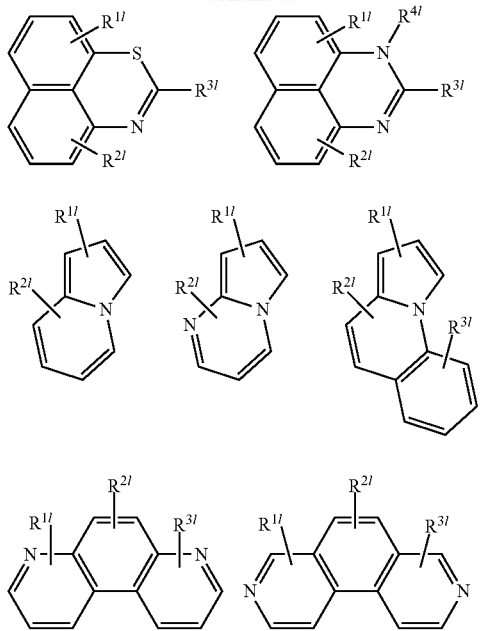

wherein:
each of $R^{11}$, $R^{21}$, $R^{31}$, $R^{41}$, $R^{51}$, $R^{61}$, $R^{71}$, and $R^{81}$ is independently a mono-, di-, or tri-substitution, and if present each of $R^{11}$, $R^{21}$, $R^{31}$, $R^{41}$, $R^{51}$, $R^{61}$, $R^{71}$, and $R^{81}$ is independently hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, substituted or unsubstituted alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, or silyl,
each of $Y^a$, $Y^b$, $Y^c$, $Y^d$, $Y^e$, $Y^f$, $Y^g$, $Y^h$, $Y^i$, $Y^j$, $Y^k$, $Y^l$, $Y^m$, $Y^n$, $Y^o$, and $Y^p$ is independently C, N, or B,
each of $U^a$, $U^b$, and $U^c$ is independently $CH_2$, $CR^1R^2$, C=O, $CH_2$, $SiR^1R^2$, $GeH_2$, $GeR^1R^2$, NH, $NR^3$, PH, $PR^3$, $R^3P$=O, $AsR^3$, $R^3As$=O, O, S, S=O, $SO_2$, Se, Se=O, $SeO_2$, BH, $BR^3$, $R^3Bi$=O, BiH, or $BiR^3$, and
each of W, $W^a$, $W^b$, and $W^c$ is independently CH, $CR^1$, $SiR^1$, GeH, $GeR^1$, N, P, B, Bi, or Bi=O.

17. An organic light emitting device comprising:
an anode;
a cathode;
an emissive layer between the anode and the cathode, the emissive layer comprising a first emissive layer in direct contact with a second emissive layer, the first emissive layer comprising a first emitter and a host and the second emissive layer comprising a second emitter and a host,
wherein the concentration of the first emitter in the first emissive layer exceeds the concentration of the second emitter in the second emissive layer;
wherein the concentration of the host in the first emissive layer is less than the concentration of the host in the second emissive layer
wherein the difference between the concentration of the first emitter in the first emissive layer and the concentration of the second emitter in the second emissive layer is equal to the difference between the concentration of the host in the second emissive layer and the concentration of the host in the first emissive layer; and
wherein the second emissive layer is positioned between the first emissive layer and the cathode; and
wherein each of the first emitter and the second emitter comprises an organometallic complex represented by Formula I:

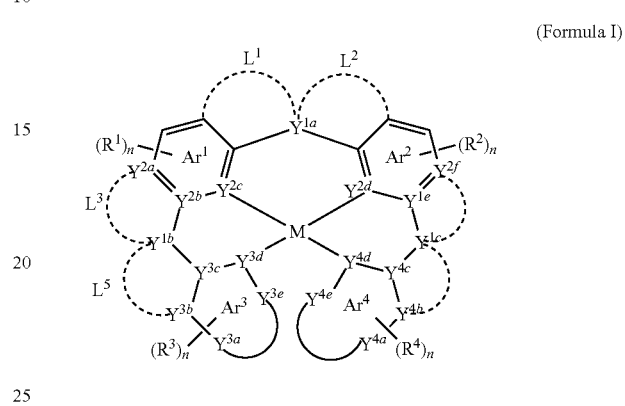

(Formula I)

wherein:
M is Pt or Pd;
$R^1$, $R^2$, $R^3$, $R^4$, $R^8$, $R^9$, and $R^{10}$ each independently represents hydrogen, halogen, hydroxy, amino, nitro, thiol, substituted or unsubstituted $C_1$-$C_4$ alkyl, substituted or unsubstituted alkoxy, or substituted or unsubstituted aryl;
$Y^{1a}$ represents O, S, S=O, O=S=O, Se, Se=O, O=Se=O, N, $NR^{5a}$, P, $PR^{5a}$, As, $AsR^{5a}$, O=$NR^{5a}$, O=$PR^{5a}$, O=$AsR^{5a}$, B, $BR^{5a}$, $SiR^{5a}$, $SiR^{5a}R^{5b}$, $CR^{5a}$, or $CR^{5a}R^{5b}$;
$Y^{1b}$ and $Y^{1c}$ each independently represents O, S, S=O, O=S=O, Se, Se=O, O=Se=O, N, $NR^{5a}$, P, $PR^{5a}$, As, $AsR^{5a}$, O=$NR^{5a}$, O=$PR^{5a}$, O=$AsR^{5a}$, B, $BR^{5a}$, $SiR^{5a}$, $SiR^{5a}R^{5b}$, $CR^{5a}$, $CR^{5a}R^{5b}$, or a single bond, wherein if $Y^{1b}$ represents a single bond, $Y^{2e}$ and $Y^{4c}$ are directly linked by a single bond, and if $Y^{1c}$ represents a single bond, $Y^{2b}$ and $Y^{3c}$ are directly linked by a single bond;
$Y^{2a}$, $Y^{2b}$, $Y^{2c}$, $Y^{2d}$, $Y^{2e}$, and $Y^{2f}$ each independently represents C or N;
$R^{5a}$, $R^{5b}$, and $R^{5c}$ each independently represents substituted or unsubstituted $C_1$-$C_4$ alkyl or substituted or unsubstituted aryl;
$R^{6a}$, $R^{6b}$, and $R^{6c}$ each independently represents substituted or unsubstituted $C_1$-$C_4$ alkyl or substituted or unsubstituted aryl;
$R^{7a}$, $R^{7b}$, and $R^{7c}$ each independently represents substituted or unsubstituted $C_1$-$C_4$ alkyl or substituted or unsubstituted aryl;
$Y^{3a}$, $Y^{3b}$, $Y^{3c}$, $Y^{3d}$, and $Y^{3e}$ each independently represents C, N, Si, O, or S;
$Y^{4a}$, $Y^{4b}$, $Y^{4c}$, $Y^{4d}$, and $Y^{4e}$ each independently represents C, N, Si, O, or S;
each of $L^1$, $L^2$, $L^3$, $L^4$, $L^5$, and $L^6$ is independently absent or represents a linking group;

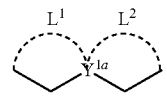

represents one of the following:

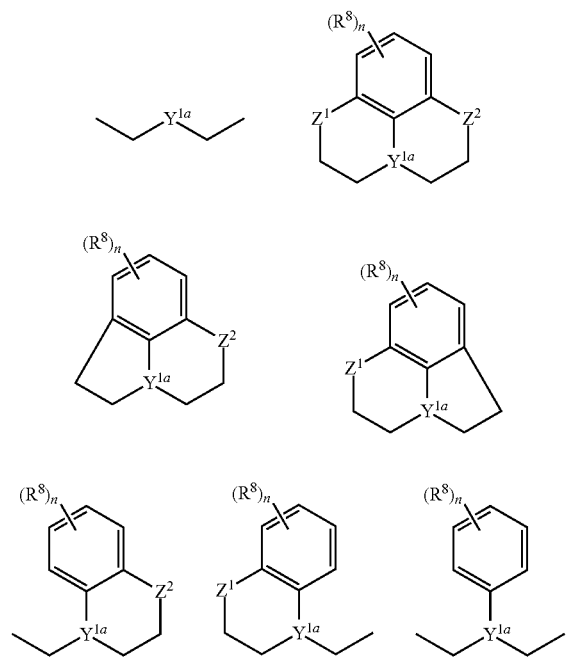

wherein $Z^1$, $Z^2$ independently represents O, S, S=O, O=S=O, Se, Se=O, O=Se=O, $NR^{5a}$, $PR^{5a}$, $AsR^{5a}$, O=$NR^{5a}$, O=$PR^{5a}$, O=$AsR^{5a}$, $BR^{5a}$, $SiR^{5a}R^{5b}$, or $CR^{5a}R^{5b}$;

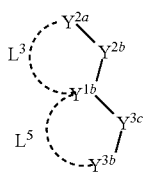

represents one of the following:

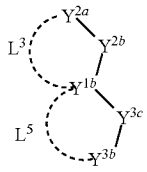

represents one of the following:

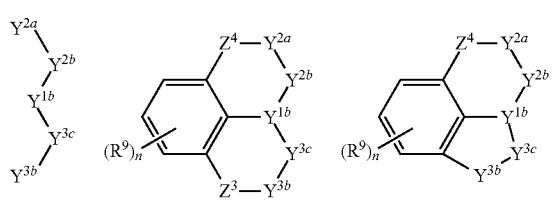

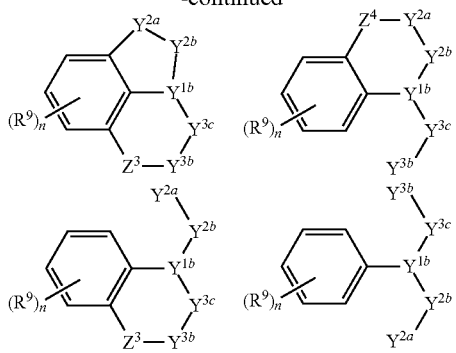

wherein $Z^3$ and $Z^4$ each independently represents O, S, S=O, O=S=O, Se, Se=O, O=Se=O, $NR^{6a}$, $PR^{6a}$, $AsR^{6a}$, O=$NR^{6a}$, O=$PR^{6a}$, O=$AsR^{6a}$, $BR^{6a}$, $SiR^{6a}R^{6b}$, or $CR^{6a}R^{6b}$;

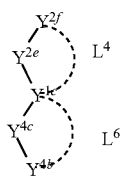

represents one of the following:

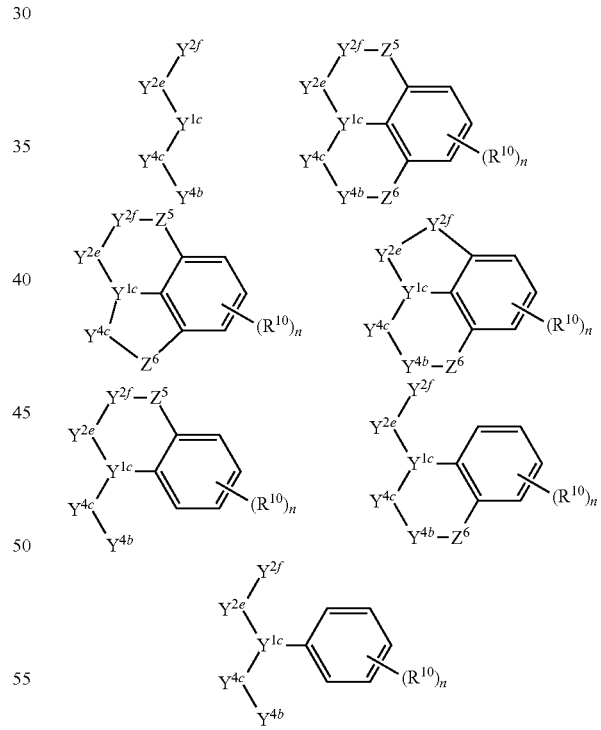

wherein $Z^5$ and $Z^6$ each independently represents O, S, S=O, O=S=O, Se, Se=O, O=Se=O, $NR^{7a}$, $PR^{7a}$, $AsR^{7a}$, O=$NR^{7a}$, O=$PR^{7a}$, O=$AsR^{7a}$, $BR^{7a}$, $SiR^{7a}R^{7b}$, or $CR^{7a}R^{7b}$;
$Ar^3$ and $Ar^4$ each independently represents a substituted or unsubstituted 5-membered ring or a 6-membered aromatic ring; and
n is 0, 1, 2, 3, 4, 5, or 6.

* * * * *